United States Patent
Arai et al.

(10) Patent No.: US 8,136,735 B2
(45) Date of Patent: Mar. 20, 2012

(54) ID LABEL, ID CARD, AND ID TAG

(75) Inventors: Yasuyuki Arai, Atsugi (JP); Mai Akiba, Isehara (JP); Yuko Tachimura, Atsugi (JP); Yohei Kanno, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1005 days.

(21) Appl. No.: 10/586,156

(22) PCT Filed: Jan. 20, 2005

(86) PCT No.: PCT/JP2005/001037
§ 371 (c)(1),
(2), (4) Date: Jul. 14, 2006

(87) PCT Pub. No.: WO2005/071608
PCT Pub. Date: Aug. 4, 2005

(65) Prior Publication Data
US 2008/0149731 A1    Jun. 26, 2008

(30) Foreign Application Priority Data
Jan. 23, 2004    (JP) .................. 2004-015449

(51) Int. Cl.
G06K 19/06    (2006.01)
G06K 19/00    (2006.01)
G06K 19/02    (2006.01)

(52) U.S. Cl. .................. 235/492; 235/487; 235/488

(58) Field of Classification Search .................. 235/439, 235/441, 451, 487, 488, 492; 438/149; 361/737; 340/572.1
See application file for complete search history.

(56) References Cited

U.S. PATENT DOCUMENTS
5,378,536 A    1/1995    Miller et al.
(Continued)

FOREIGN PATENT DOCUMENTS
EP    0 443 263    8/1991
(Continued)

OTHER PUBLICATIONS
International Search Report (Application No. PCT/JP2005/001037) dated May 17, 2005.
(Continued)

*Primary Examiner* — Thien M. Le
*Assistant Examiner* — April A Taylor
(74) *Attorney, Agent, or Firm* — Eric J. Robinson; Robinson Intellectual Property Law Office, P.C.

(57) ABSTRACT

As a non-contact ID label, ID tag and the like being widespread, it is required to manufacture a considerable quantity of ID labels at quite a low cost. An ID label attached to a product is, for example, required to be manufactured at 1 to several yens each, or preferably less than one yen. Thus, such a structure and a process are demanded that an ID label can be manufactured in a large quantity at a low cost. A thin film integrated circuit device included in the ID label, the ID card, and the ID tag of the invention each includes a thin film active element such as a thin film transistor (TFT). Therefore, by peeling a substrate on which TFTs are formed for separating elements, the ID label and the like can be manufactured in a large quantity at a low cost.

34 Claims, 35 Drawing Sheets

U.S. PATENT DOCUMENTS

| | | | |
|---|---|---|---|
| 5,389,438 | A | 2/1995 | Miller et al. |
| 5,824,574 | A | 10/1998 | Yamazaki et al. |
| 6,144,041 | A | 11/2000 | Yamazaki et al. |
| 6,168,829 | B1 | 1/2001 | Russ et al. |
| 6,173,898 | B1* | 1/2001 | Mande ............ 235/488 |
| 6,373,075 | B1 | 4/2002 | Yamazaki et al. |
| 6,459,588 | B1* | 10/2002 | Morizumi et al. ......... 361/737 |
| 6,497,371 | B2* | 12/2002 | Kayanakis et al. ......... 235/492 |
| 6,509,217 | B1* | 1/2003 | Reddy ............ 438/153 |
| 6,522,549 | B2* | 2/2003 | Kano et al. .......... 361/737 |
| 6,585,165 | B1* | 7/2003 | Kuroda et al. .......... 235/492 |
| 6,610,996 | B2 | 8/2003 | Yamazaki et al. |
| 6,700,631 | B1* | 3/2004 | Inoue et al. ............ 349/45 |
| 6,888,509 | B2* | 5/2005 | Atherton ............ 343/718 |
| 6,953,735 | B2 | 10/2005 | Yamazaki et al. |
| 6,988,668 | B2* | 1/2006 | Osako et al. .......... 235/492 |
| 7,044,388 | B2* | 5/2006 | Kamiya et al. .......... 235/492 |
| 7,060,591 | B2 | 6/2006 | Yamazaki et al. |
| 7,271,076 | B2 | 9/2007 | Yamazaki et al. |
| 7,335,573 | B2 | 2/2008 | Takayama et al. |
| RE40,145 | E* | 3/2008 | Leighton .......... 340/572.1 |
| 7,446,339 | B2 | 11/2008 | Yamazaki et al. |
| 7,465,647 | B2 | 12/2008 | Yamazaki et al. |
| 7,554,121 | B2 | 6/2009 | Hirakata et al. |
| 7,561,052 | B2 | 7/2009 | Arai et al. |
| 7,566,640 | B2 | 7/2009 | Yamazaki et al. |
| 7,652,359 | B2* | 1/2010 | Takayama et al. ............ 257/679 |
| 7,728,734 | B2 | 6/2010 | Arai et al. |
| 7,749,804 | B2 | 7/2010 | Hirakata et al. |
| 7,858,411 | B2 | 12/2010 | Yamazaki et al. |
| 2001/0015256 | A1* | 8/2001 | Yamazaki et al. ............ 156/289 |
| 2002/0094639 | A1* | 7/2002 | Reddy ............ 438/257 |
| 2004/0124983 | A1* | 7/2004 | Kuroda et al. ............ 340/572.1 |
| 2005/0133790 | A1 | 6/2005 | Kato |
| 2005/0134463 | A1 | 6/2005 | Yamazaki |
| 2005/0135181 | A1 | 6/2005 | Shionoiri et al. |
| 2005/0140495 | A1 | 6/2005 | Yamazaki et al. |
| 2005/0141256 | A1 | 6/2005 | Yamazaki et al. |
| 2005/0146006 | A1 | 7/2005 | Yamazaki et al. |
| 2005/0148121 | A1 | 7/2005 | Yamazaki et al. |
| 2007/0159353 | A1 | 7/2007 | Arai et al. |
| 2008/0049437 | A1 | 2/2008 | Takayama et al. |
| 2010/0025831 | A1 | 2/2010 | Yamazaki et al. |

FOREIGN PATENT DOCUMENTS

| | | |
|---|---|---|
| EP | 0 607 709 | 7/1994 |
| JP | 08-025741 A | 1/1996 |
| JP | 08-321466 A | 12/1996 |
| JP | 11-020360 | 1/1999 |
| JP | 11-134460 A | 5/1999 |
| JP | 2000-020665 A | 1/2000 |
| JP | 2000-048147 A | 2/2000 |
| JP | 2000-322545 A | 11/2000 |
| JP | 2001-030403 | 2/2001 |
| JP | 2001-143037 | 5/2001 |
| JP | 2001-155134 | 6/2001 |
| JP | 2002-104626 A | 4/2002 |
| JP | 2002-141731 A | 5/2002 |
| JP | 2002-183693 | 6/2002 |
| JP | 2002-334315 A | 11/2002 |
| JP | 2002-342728 | 11/2002 |
| JP | 2003-087044 A | 3/2003 |
| JP | 2003-162701 | 6/2003 |
| JP | 2003-229548 A | 8/2003 |
| JP | 2003-258211 A | 9/2003 |
| JP | 2005-252236 A | 9/2005 |
| WO | WO 2005/057658 | 6/2005 |
| WO | WO 2005/069204 | 7/2005 |
| WO | WO-2005/071607 | 8/2005 |

OTHER PUBLICATIONS

Written Opinion (Application No. PCT/JP2005/001037) dated May 17, 2005.

Nikkei Electronics, *"Sense of Crisis" is a Trigger. Ignited Evolution of a Sesame-Grain Sized Chip Technology Development is Entering into the Second Phase*, Leading Trends, Nov. 18, 2002, pp. 67-76.

Office Action (Application No. 200580002912.1) Dated Apr. 26, 2010.

Office Action (JP Application Publication No. 2005-235191; JP Application No. 2005-013964) dated Dec. 7, 2010.

* cited by examiner

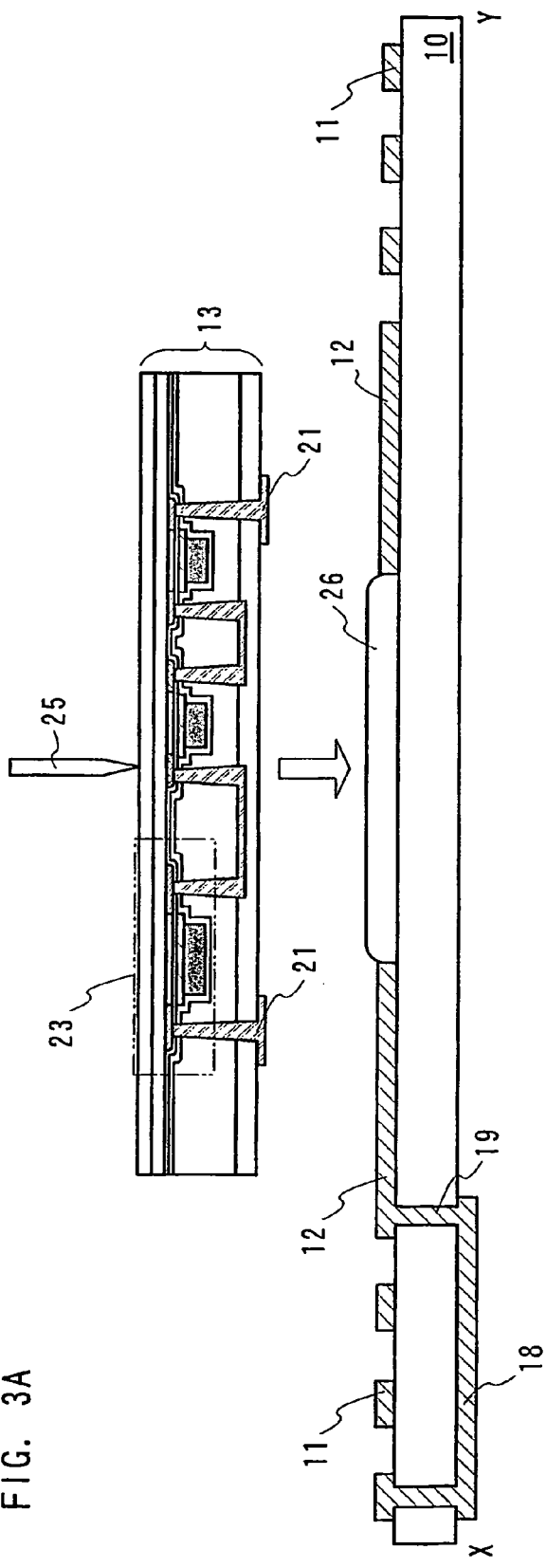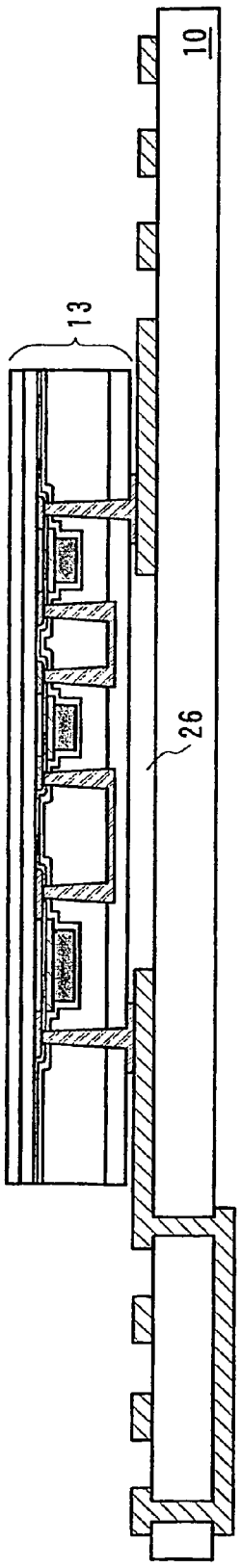

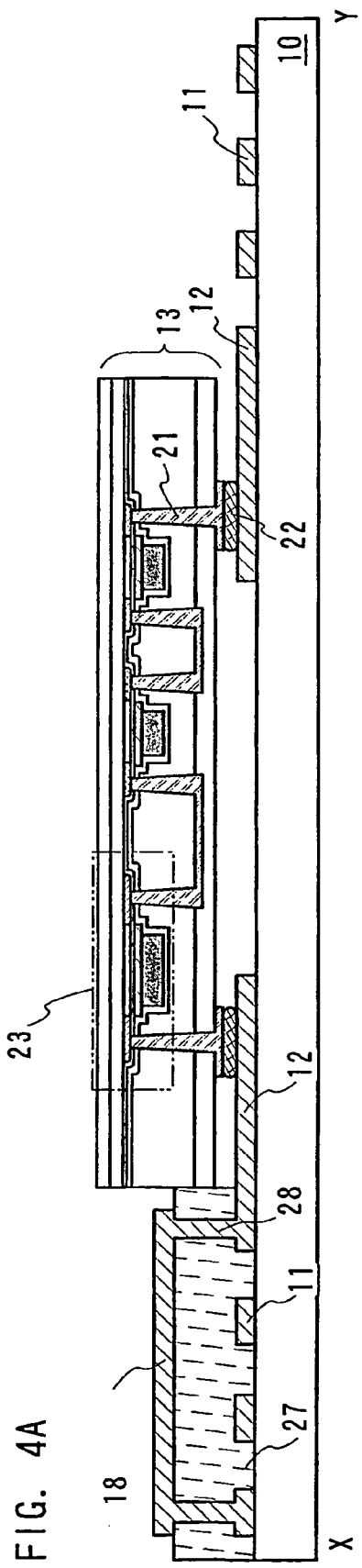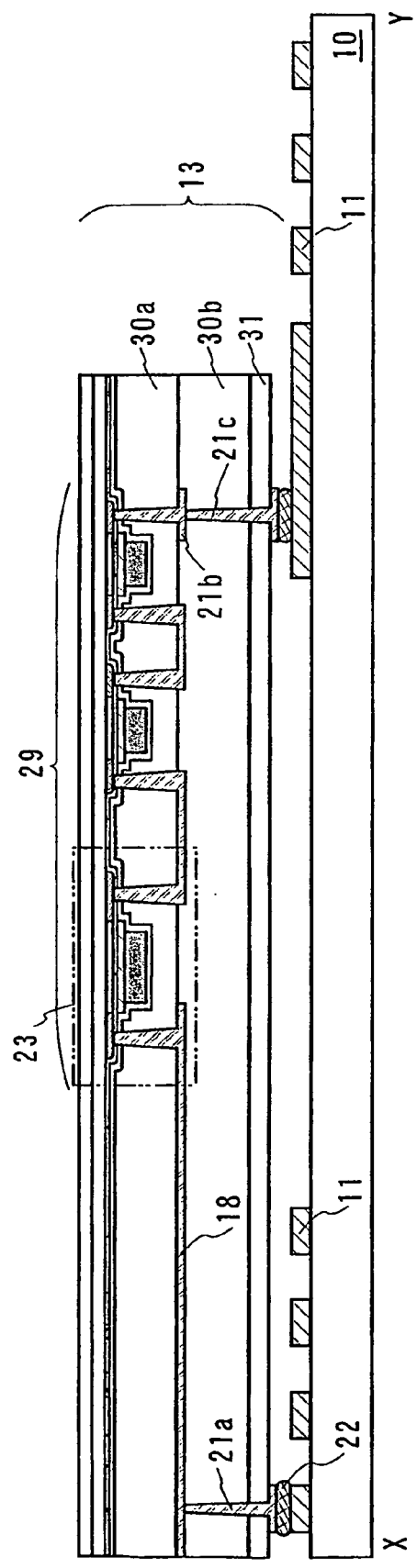
FIG. 4A
FIG. 4B

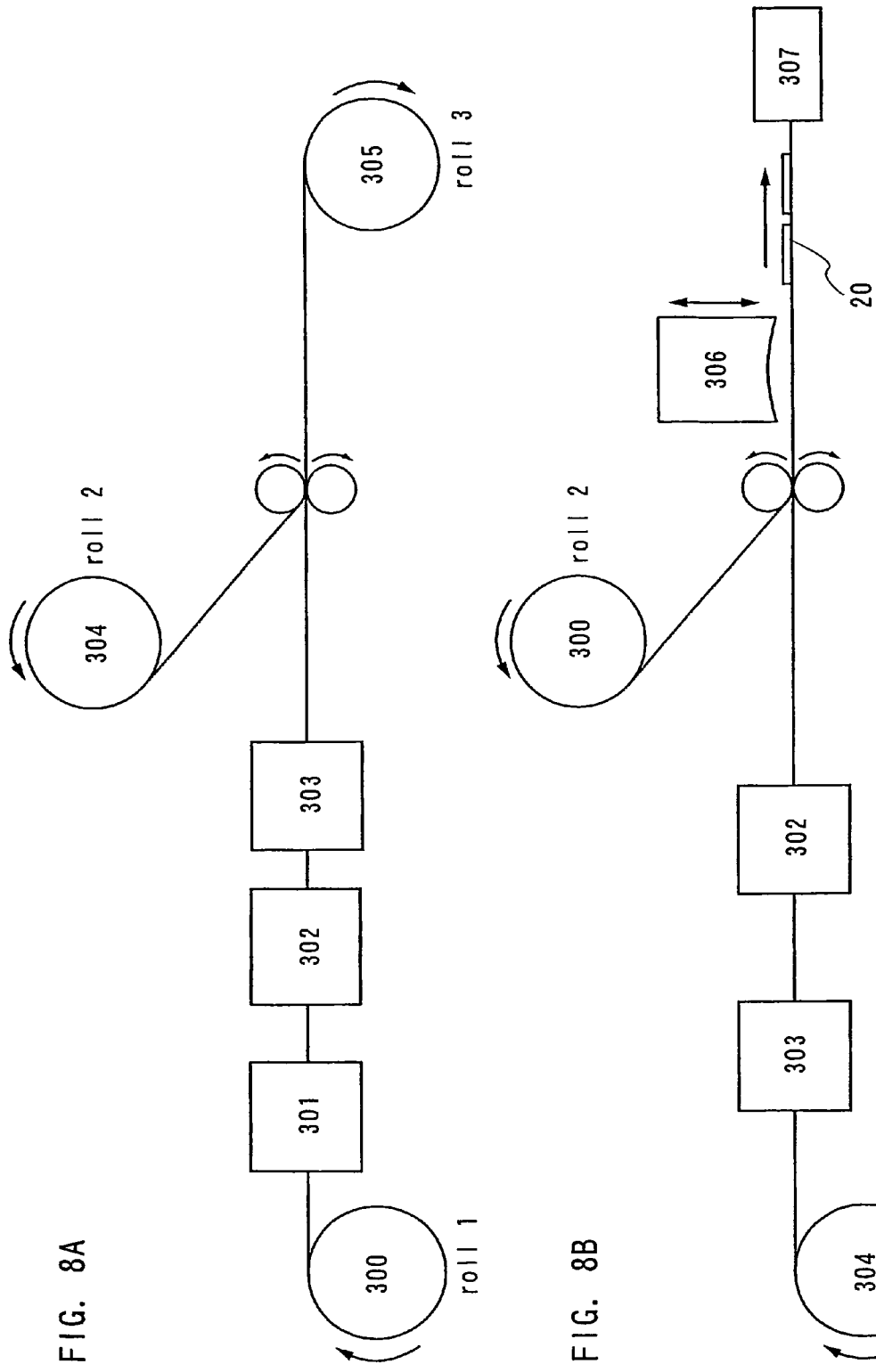

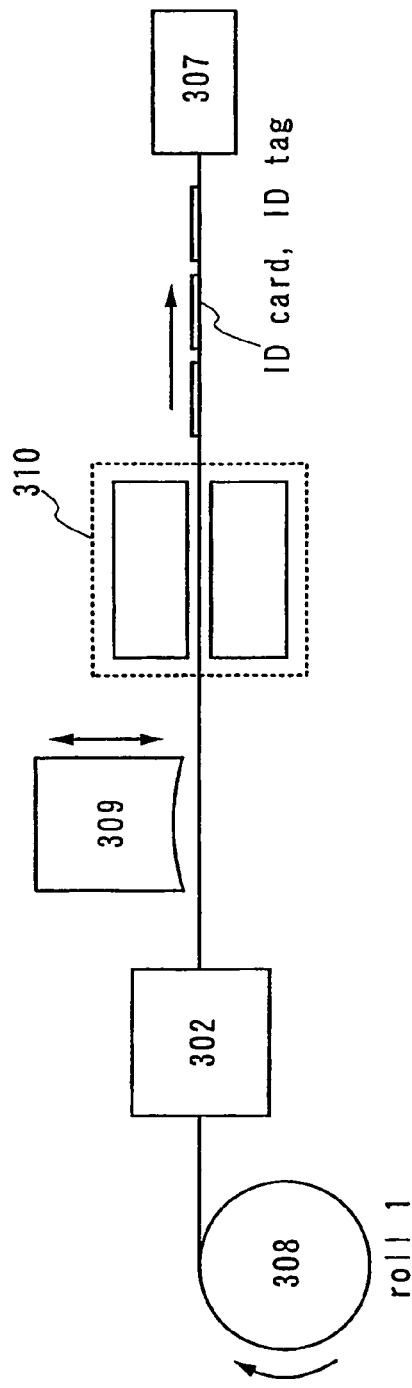
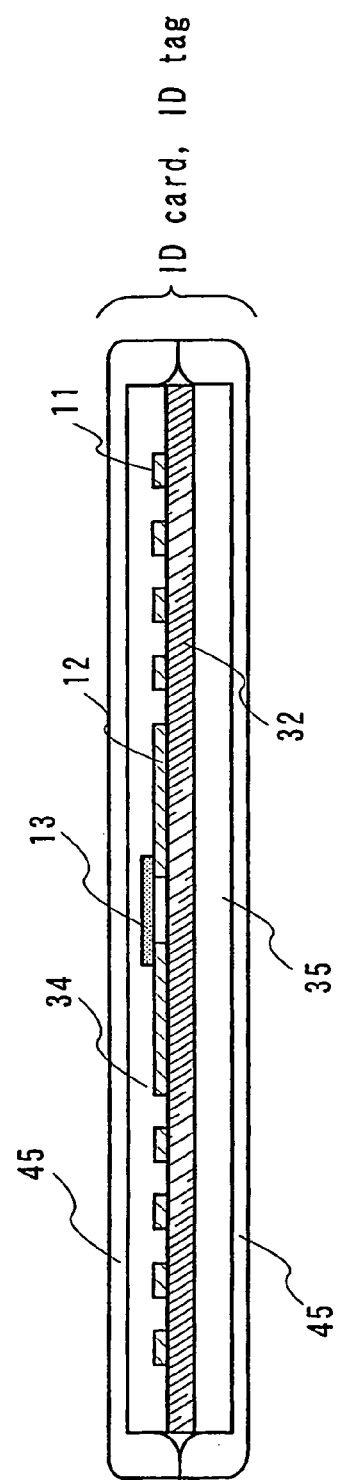
FIG. 9A
FIG. 9B

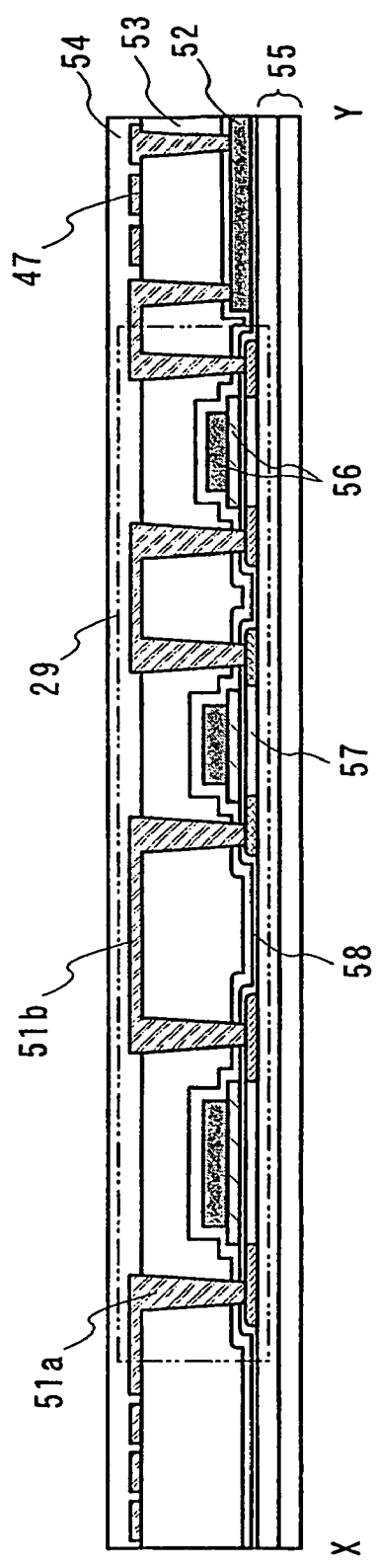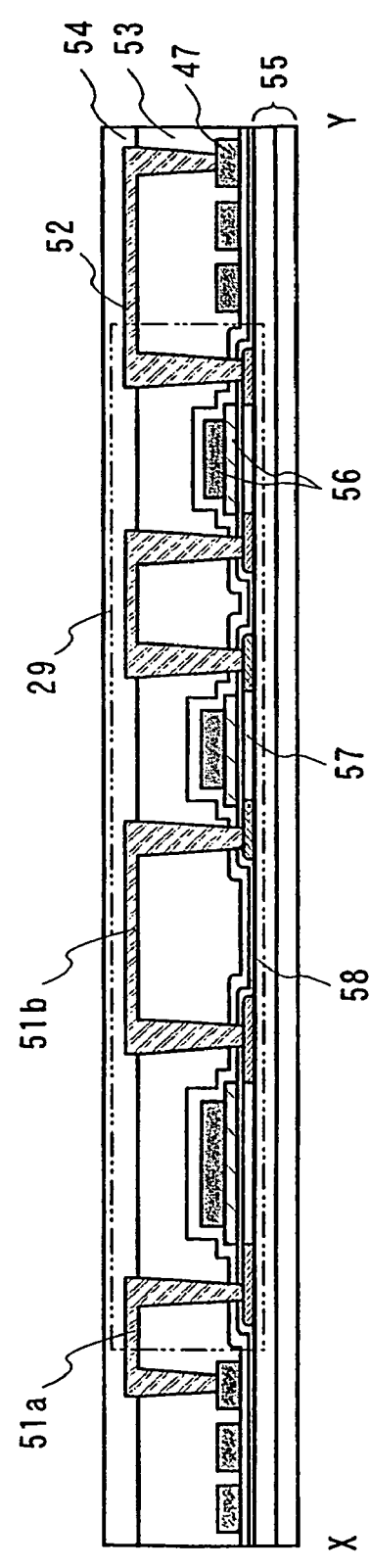
FIG. 12A
FIG. 12B

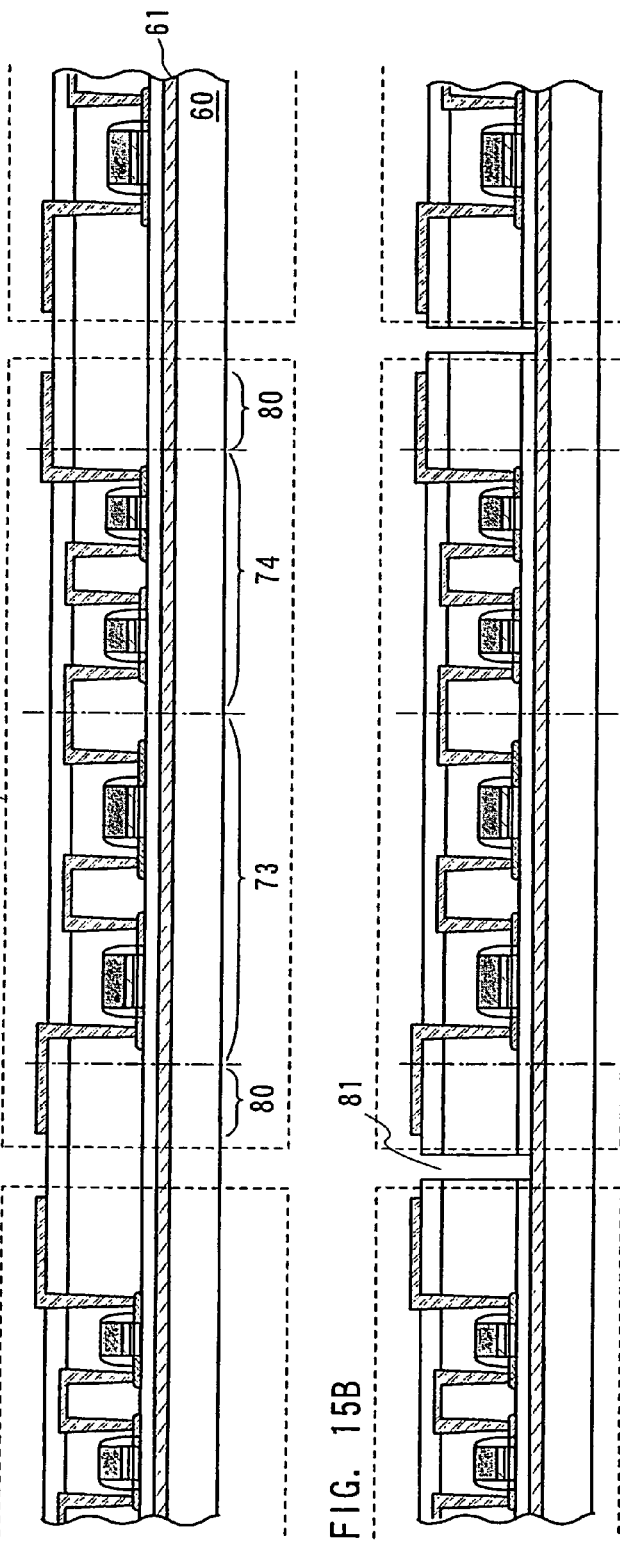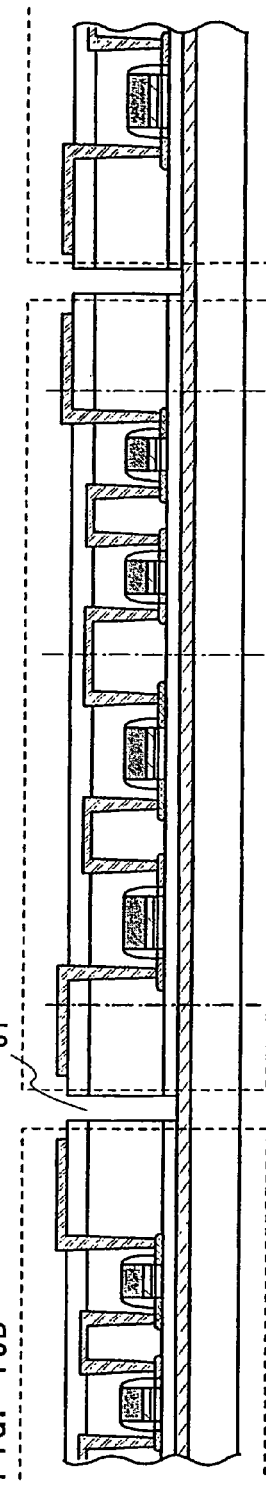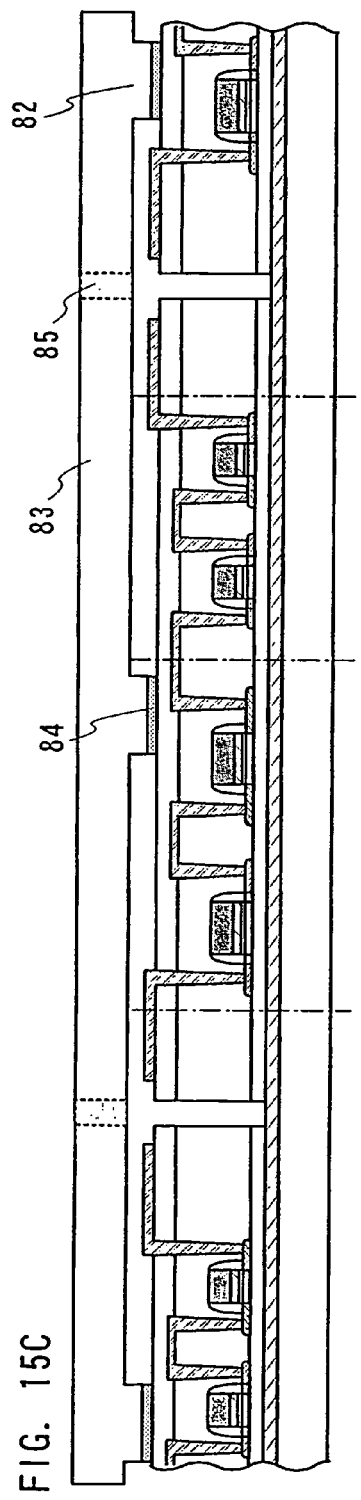

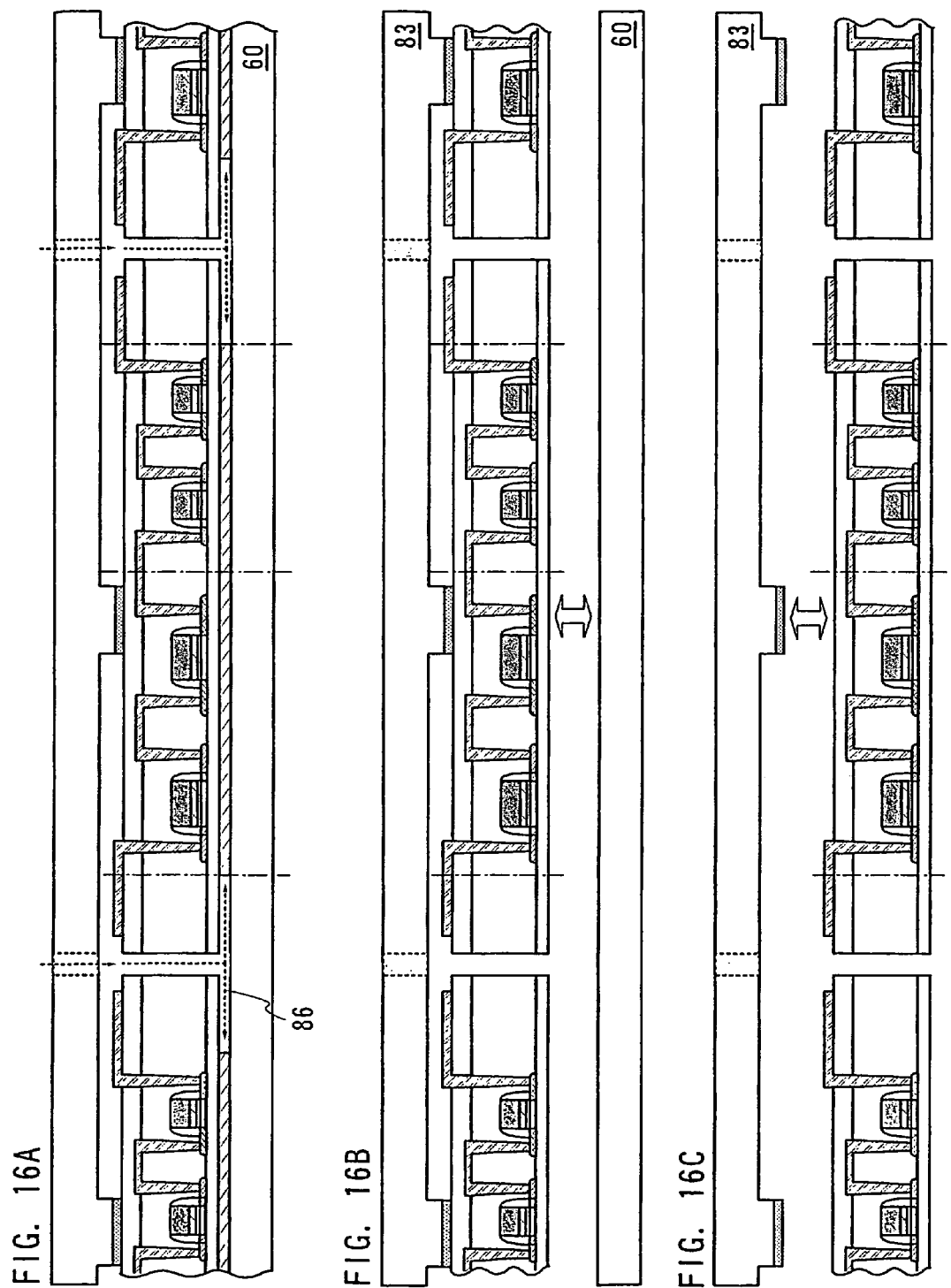

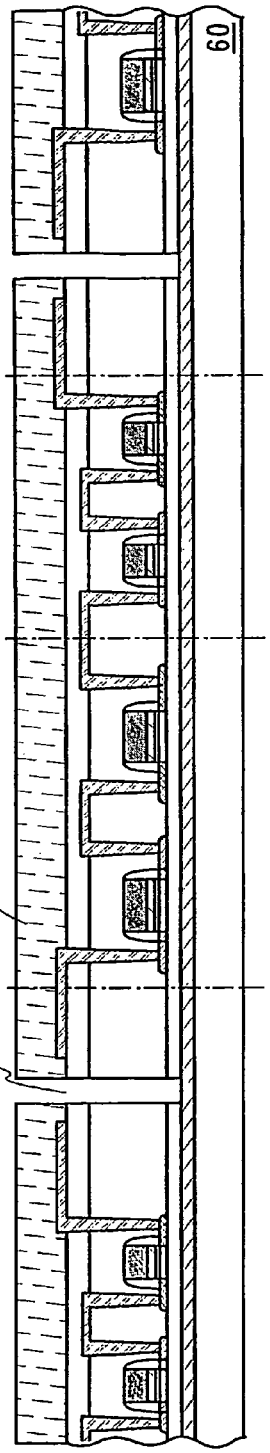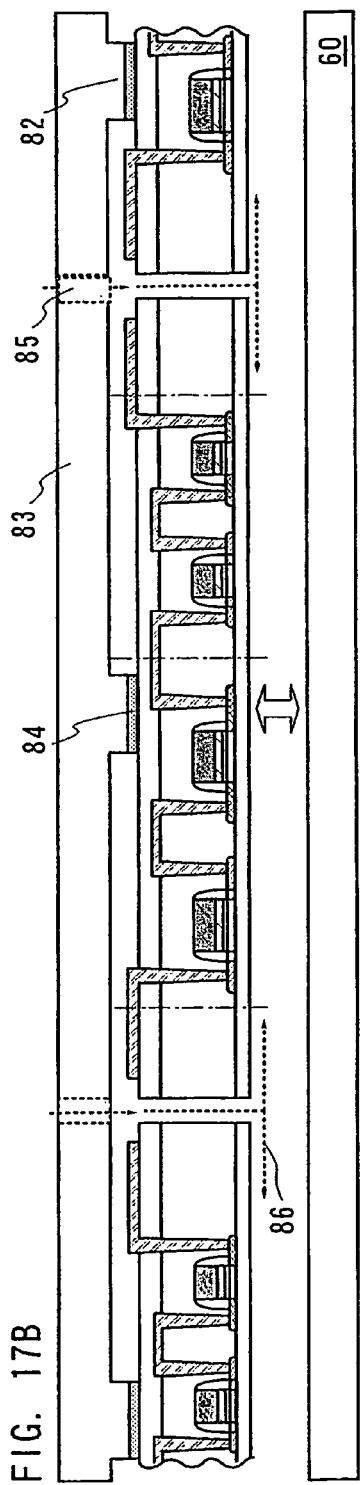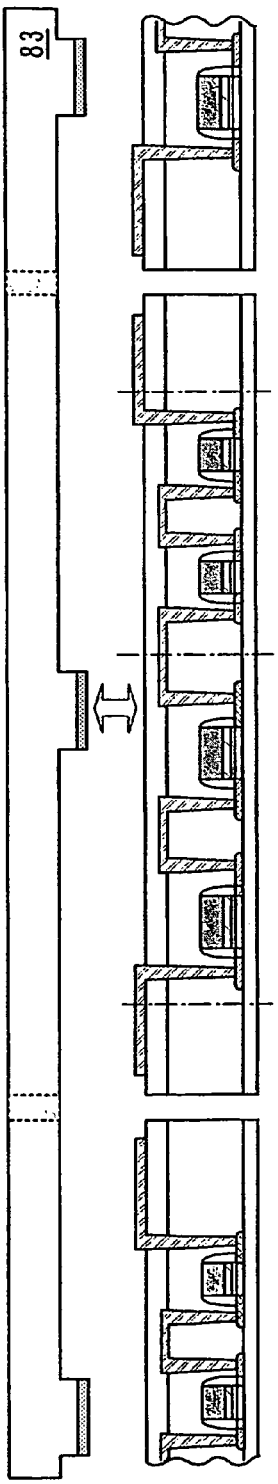

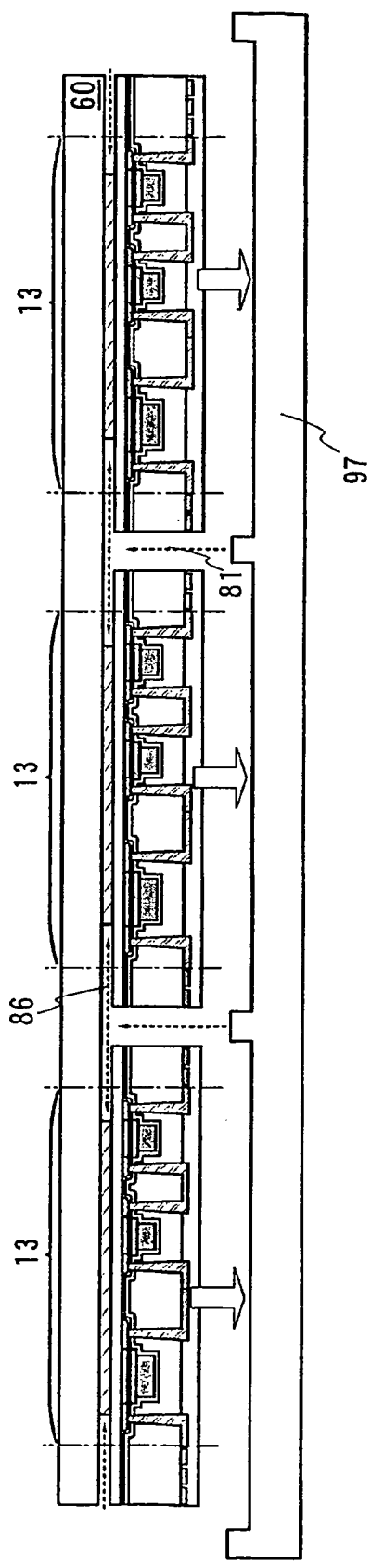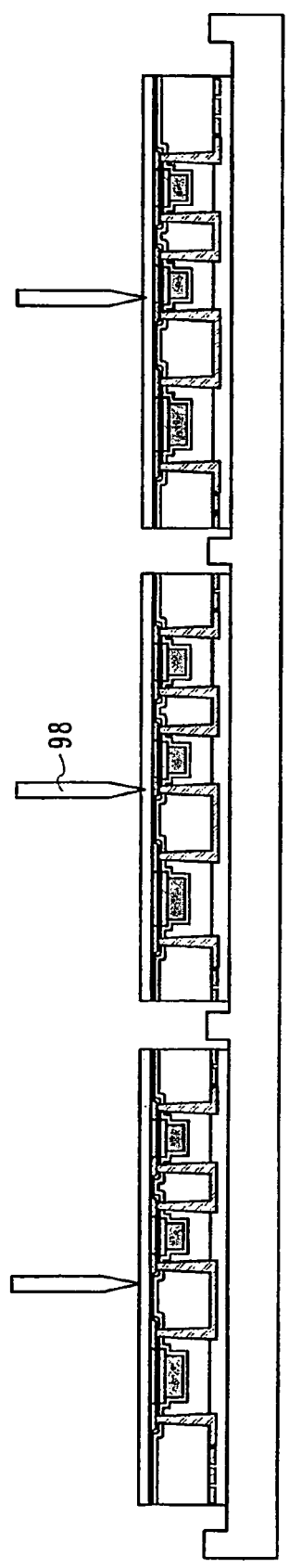
FIG. 19A
FIG. 19B

ID LABEL, ID CARD, AND ID TAG

TECHNICAL FIELD

The invention relates to an ID label, an ID card, and an ID tag each of which comprises a memory, a micro processor (a central processing unit and MPU) and the like, a quite thin film integrated circuit, and is used for identifying mainly a person, plants and animals, products and the like.

BACKGROUND ART

In recent years, safety of the products and reinforcement of management control are increasingly demanded in all industrial fields such as food industry and manufacturing industry, and data on products are increasing accordingly. The data on products for the present are very little mainly such as a country of manufacture, a manufacturer, product number and the like provided by a ten-digit number of a bar code. Further, a bar code has to be read one by one manually, which requires time. Now, an automatic identification technique using a non-contact IC tag utilizing radio wave, which is called an RFID (Radio Frequency Identification) is attracting attentions.

In order to secure the safety of the plants and animals (for example, a country of origin, contagion of infectious disease), such system is becoming to be widely used that an IC chip is implanted into the bodies of the plants and animals so that data thereon are obtained and managed by a data reading apparatus (a reader) externally.

Moreover, the number of cards that one person carries is increasing in these years. In particular, a non-contact IC card that communicates using radio wave is becoming to be widely used as an electronic railway ticket, electronic money, and the like.

Further, in order to prevent copying and abusing of paper money, coins, valuable securities, tickets and the like, a technique to implant an IC chip therein is becoming to be widely used (refer to Non-patent Document 1).

[Non-patent Document 1]
Nikkei Electronics published by Nikkei Business Publications, Inc. p. 67-76, Nov. 18, 2002.

DISCLOSURE OF INVENTION

However, as a contact and a non-contact IC chips are widespread, it is required to manufacture a large quantity of IC chips which can be used for people, plants and animals, products, paper money at quite a low cost. An IC chip attached to products, paper money and the like is, for example, required to be manufactured at a cost of one to several yens each, or preferably less than one yen. Thus, such a structure and a process of an integrated circuit device such as an IC chip are demanded so that it can be manufactured in a large quantity at a low cost.

For the present, an IC chip is manufactured by forming a plurality of thin film integrated circuits on a silicon wafer and removing the silicon wafer by grinding (referred to as back grinding) to separate the thin film integrated circuits. However, as a silicon wafer that is expensive is all grinded and removed, increase in manufacturing cost is inevitable. Further, an integrated circuit formed on a silicon wafer is thick, therefore, there is a limit in design due to projections and depressions when mounting it to a package of product.

The invention is made in view of the aforementioned problems for providing a structure and a process of quite a thin film integrated circuit device (hereinafter referred to as a thin film integrated circuit device) which is different from a conventional integrated circuit formed of a silicon wafer, and structures and processes of an ID label, an ID card, an ID tag, various objects such as paper money and coins using the thin film integrated circuit device.

The ID label according to the invention comprises a thin film integrated circuit device having a thin film transistor, an adhesive layer, and a separating sheet provided in contact with a label substratum over which an antenna is formed.

The ID label according to the invention comprises a label substratum, a thin film integrated circuit device having a thin film transistor provided in contact with an internal substratum, an adhesive layer, and a separating sheet.

The ID card according to the invention comprises a thin film integrated circuit device having a thin film transistor provided in contact with a card substratum over which an antenna is formed, and a cover that covers at least a side of the card substratum where the antenna and the thin film integrated circuit device are formed.

The ID card according to the invention comprises a thin film integrated circuit device having a thin film transistor provided in contact with an internal substratum over which an antenna is formed, and a cover that covers around the substratum.

The ID tag according to the invention comprises a thin film integrated circuit device having a thin film transistor provided in contact with a substratum over which an antenna is formed, and a cover that covers at least a side of the substratum where the antenna and the thin film integrated circuit device are formed.

The ID tag according to the invention comprises a thin film integrated circuit device having a thin film transistor provided in contact with an internal substratum over which an antenna is formed, and a cover that covers around the internal substratum.

A thin film integrated circuit device of each of the aforementioned ID label, the ID card, and the ID tag according to the invention comprises a thin film active element such as a thin film transistor (TFT). In the case of manufacturing a thin film integrated circuit device using a TFT, for example, after forming a TFT on a substrate which is to be peeled off, the substrate is peeled off to separate the elements, thereby a thin film integrated circuit device formed of a TFT can be manufactured in a large quantity at a low cost. The major peeling methods here are a chemical peeling that a peeling layer is removed by etching and the like, and a physical peeling that a peeling layer is separated by applying a pressure externally, however, the invention is not limited to these.

The thin film integrated circuit device is different than a conventional "IC (Integrated Circuit) chip" formed on a silicon wafer and comprises a thin film active element typified by a TFT (Thin Film Transistor), a wiring which connects the thin film active elements, a wiring which connects the thin film active element and an external unit (for example, an antenna in a non-contact ID label and a connecting terminal in a contact ID label) and the like. It is needless to say that a component of a thin film integrated circuit device is not limited to this and the thin film integrated circuit is only required to include at least one thin film active element typified by a TFT.

Note that the thin film integrated circuit device used for the invention is different than a conventional IC chip and is a thin film, and therefore, it is referred to as an IDT chip (Identification Thin Chip) and the like. The thin film integrated circuit device used for the invention is formed without using a silicon wafer in principle and formed by using an insulting substrate such as a glass substrate and a quartz substrate, and the thin film integrated circuit device can be transferred to a flexible substrate, therefore, it is also referred to as an IDG chip (Identification Glass Chip), an IDF chip (Identification Flexible Chip), a soft chip and the like. Hereafter, the thin film integrated circuit device is sometimes referred to as an IDF chip.

Here, the ID label (Identification Label) functions to identify a product which circulates in the market and to store the data on them and is also referred to as an ID seal, an ID sticker and the like. Basically, one side of the ID label has an adhesive surface that can easily be adhered to a product and the like and some can be readhered several times. It is needless to say that the invention is not limited to these as long as it belongs to a group of a label, a seal, a sticker, a badge, an indicator and the like.

The label substratum corresponds to a portion which is actually adhered to a product and the like, and an antenna and a thin film integrated circuit device are formed on one or both of a surface and a back surface thereof. The label substratum may have a single layer structure or a stacked-layer structure.

The internal substratum corresponds to a portion formed inside the ID label, the ID card, or the ID tag and is formed separately from a substratum of the ID label, the ID card, or the ID tag. It is also referred to as an inlet substratum and the like. Basically, the internal substratum cannot be seen from outside, however, an internal substratum which can be seen from outside in the case where a substratum is formed of a light transmitting substance, and the like. Note that the internal substratum may have a single layer structure or a stacked-layer structure.

The ID card corresponds to a card including a minute integrated circuit device that can store various data, such as a cash card, a credit card, a prepaid card, an electronic railway ticket, electronic money, a telephone card, and a member card.

The ID tag functions to identify a product that circulates in the market and to store the data on them similarly to the ID label. By providing the ID label or the ID tag to the product, products can be easily managed. In the case where a product is stolen, for example, a criminal can be rapidly grasped by tracking the route of the product. In this manner, by providing the ID tag, products which is superior in so-called traceability (when a problem occurs in each stage of complicated manufacture and circulation, the cause can be rapidly figured out by tracking the route) can be circulated. Moreover, as recently accidents such as violent crime and disappearance increase, the ID tag can be used for identifying a person in order to constantly figure out a location of each person such as an infant, a child, an aged, a traveler so that they will not be involved in the accidents.

The cover is provided for covering at least a side of the substratum of the card and the tag where an antenna and the thin film integrated circuit device are formed, and is provided so as to face the substratum. It is needless to say that the substratum may be a different substratum in which the thin film integrated circuit device is formed, of which material may be the same or different than the substratum in which the thin film integrated circuit device is formed. Moreover, the cover may function as a coating.

Note that a range that the invention can be applied is not limited to the aforementioned ID label, the ID card, the ID tag and the like. That is, all objects that include the thin film integrated circuit device having a thin film transistor provided in contact with a substratum over which an antenna is formed, and a cover that covers at least a side of the substratum where the antenna and the thin film integrated circuit device are formed.

Alternatively, an object according to the invention may include the thin film integrated circuit device having a transistor provided in contact with the internal substratum in which the antenna is formed, and a cover that covers around the internal substratum.

Further, it is preferable that a protective layer formed of a single layer or a laminated layer of silicon oxide, silicon nitride or silicon oxynitride be formed on at least one of an upper portion and a lower portion of the thin film integrated circuit device included in these objects.

The integrated circuit device incorporated in the object according to the invention is a thin film integrated circuit device having a TFT, and therefore, it can be formed in thickness of about 5 μm or less (more preferably 0.1 to 3 μm). The invention plays a large role to an object in a form of a paper, a film, or a plate, in particular.

The thin film integrated circuit device included in the ID label, the ID card, or the ID tag according to the invention includes a thin film active element such as a TFT. After forming a TFT on a substrate that is to be peeled off, the substrate is peeled off to separate the element, thereby the thin film integrated circuit device can be manufactured in a large quantity at a low cost. As the thin film integrated circuit device comprises a thin film active element, the ID label, the ID card, and the ID tag in thinner design than a conventional technique can be obtained.

Further, as a back surface of a chip is not required to be polished unlike a conventional IC chip formed on a silicon substrate, a process can considerably be simplified and the manufacturing cost can be reduced to a large extent. Moreover, a glass substrate, a quartz substrate, a solar battery grade silicon substrate and the like which are cheaper than the silicon substrate can be used and the peeled substrate can be reutilized. Therefore, a large cost reduction can be realized.

Further, the back grinding treatment that causes a crack and polished trace is not required to be performed unlike an IC formed of a silicon wafer. Moreover, variations in thickness of elements are dependent upon variations of each film at the time of deposition which forms an IC, therefore the variation is several hundreds nm at most, which is far less than the variations of several to several tens μm after the back grinding treatment.

Accordingly, various objects such as the ID label, the ID card, the ID tag and the like which can be manufactured in a large quantity at a low cost, has a thin shape, and is superior in functionality can be provided according to the invention.

BRIEF DESCRIPTION OF DRAWINGS

FIGS. 3A and 3B are diagrams showing a manufacturing method of the ID label of the invention (an adhesive layer).

FIGS. 4A and 4B are diagrams each showing a manufacturing method of the ID label of the invention (an internal cross wiring).

FIGS. 8A and 8B are schematic diagrams showing manufacturing lines of the ID label and the like of the invention.

FIGS. 9A and 9B are schematic diagrams showing the ID card, the ID tag and the like of the invention.

FIGS. 12A and 12B are sectional views showing a thin film integrated circuit device used in the ID label and the like (an antenna integrated type).

FIGS. 15A to 15C are diagrams showing manufacturing steps of a CPU and a memory in the thin film integrated circuit device used in the invention.

FIGS. 16A to 16C are diagrams showing manufacturing steps of a CPU and a memory in the thin film integrated circuit device used in the invention.

FIGS. 17A to 17C are diagrams showing an element separating method of the thin film integrated circuit device (dry etching).

FIGS. 19A and 19B are diagrams showing a peeling method of the thin film integrated circuit device (using a tray).

BEST MODE FOR CARRYING OUT THE INVENTION

Although the present invention will be fully described by way of example with reference to the accompanying drawings, it is to be understood that various changes and modifications will be apparent to those skilled in the art. Therefore, unless such changes and modifications depart from the scope of the invention, they should be construed as being included therein. For example, the invention can be implemented with a free combination of embodiment modes and embodiments.

Embodiment Mode 1

Figure 1A:
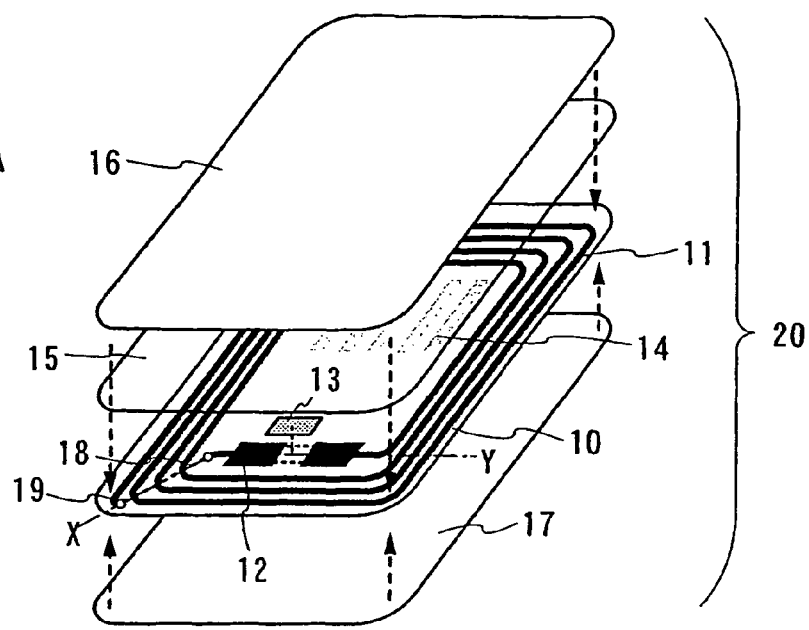
FIGS. 1A to 1C are perspective views each showing a stacked-layer structure of the ID label of the invention.

A structure and a manufacturing method of the ID label 20 of the invention are described mainly with reference to FIGS. 1A, 2, and 3A and 3B. FIG. 1A is a perspective view showing a stacked-layer structure of the ID label according to the invention. Here, a separating sheet as a mounting of the label is shown over a label substratum (generally referred to as "tack paper" and the like, though not limited to a paper material) adhered to a product and the like.

In FIG. 1A, an antenna 11 and a connecting pad 12 which is a connecting portion between the antenna and the thin film integrated circuit device are formed on a label substratum 10 and a thin film integrated circuit device 13 formed separately is adhered to the label substratum. A print 14 such as text, a sign, and an image is applied on a surface (a back surface in FIG. 1A) of the label substratum. Moreover, in the case of forming so-called a hybrid type ID label which has both non-contact and contact functions, a wiring pattern which forms a connecting terminal may be formed by a printing method and the like.

The label substratum 10 on which the antenna and the thin film integrated circuit device are formed is adhered to a separating sheet 16 through an adhesive layer 15. Note that a coating layer 17 may be provided on a surface of the label substratum 10. Although not shown, a coating layer may be additionally provided between the label substratum and the adhesive layer.

Here, the label substratum can be formed by using a paper, a synthetic paper, resin material such as plastic, PET, polypropylene, polyethylene, polystyrene, and nylon, inorganic material and the like, however, the invention is not limited to these. It is preferable to use a flexible material for the label substratum so that the ID label can be adhered to products having various shapes as well as to a product that has a plane shape. Note that high density polyethylene (HDPE) described in Japanese Patent Laid-Open No. 2001-30403 and the like can be used for resin material, for example. Moreover, two or more kinds of the aforementioned materials may be used in combination.

For a conductive material used for an antenna and a connecting pad, Ag, Au, Al, Cu, Zn, Sn, Ni, Cr, Fe, Co or Ti, or an alloy containing the aforementioned material can be used. It is needless to say that the invention is not limited to these, however, it is preferable to use Al in view of the workability and cost. The thickness thereof is preferably 5 to 60 μm.

The antenna and the connecting pad may be formed of different materials as well. The antenna and the connecting pad may be formed by performing a patterning process after forming a conductive material on the whole surface by sputtering, or may be selectively formed directly by ink-jetting, screen printing, offset printing, gravure printing and the like (hereinafter these are sometimes referred to as a "droplet discharging method" collectively). Moreover, the aforementioned conductive materials may be stacked. After forming a conductive pattern by these methods, a conductive material which is the same or different than the conductive pattern may be formed by plating. Note that the connecting pad portion may be provided on a TFT side throughout this description.

It is preferable that the antenna and the connecting pad be formed so as to have a metal material which has sufficient malleability and ductility, and more preferably formed thick so as to resist the stress of deformation. Further, the connecting pad is preferably formed in order to achieve a connection to the thin film integrated circuit device securely.

Moreover, a known material such as a cyanoacrylate adhesive which is curable by slight moisture in air (used mainly as an instant adhesive), vinyl acetate monomer resin emulsion, a rubber material, vinyl chloride resin material which transmits light, dries fast, and has water resisting property, vinyl acetate monomer solution material, epoxy material and hot melt (heat dissolving type) material can be used. It is needles to say that the invention is not limited to these and any material which has adhesive property can be used. In the case of peeling and adhering an ID label repeatedly after adhering it to a product and the like, an adhesive which can be peeled and adhered repeatedly used for Post-it (Japanese registered trademark) THREE M INNOVATIVE PROPERTIES, and NOTESTIX (Japanese registered trademark) MOORE BUSINESS FORMS INC, and the like may be used as well. For example, an acryl adhesive agent, a synthetic rubber adhesive agent, a natural rubber adhesive agent and the like described in Japanese Patent Laid-Open No. 2001-30403, U.S. Pat. No. 2,992,092, and Japanese Patent Laid-Open No. 6-299127 respectively can be used.

A paper or a synthetic paper are used as a separating sheet as well as resin material such as plastic, PET, polypropylene, polyethylene, polystyrene, and nylon an inorganic material and the like, though the invention is not limited to these. A light-transmitting resin material such as plastic, PET, polypropylene, polyethylene, polystyrene, nylon, DLC (Diamond-Like Carbon) and the like can be used as the coating layer. The image is to be printed on the label substratum by a known printing method and the like. Further, as the thin film integrated circuit device 13, a chip containing a thin film active element such as a TFT can be typically used. Specific structure and manufacturing method are described later.

Figure 2:
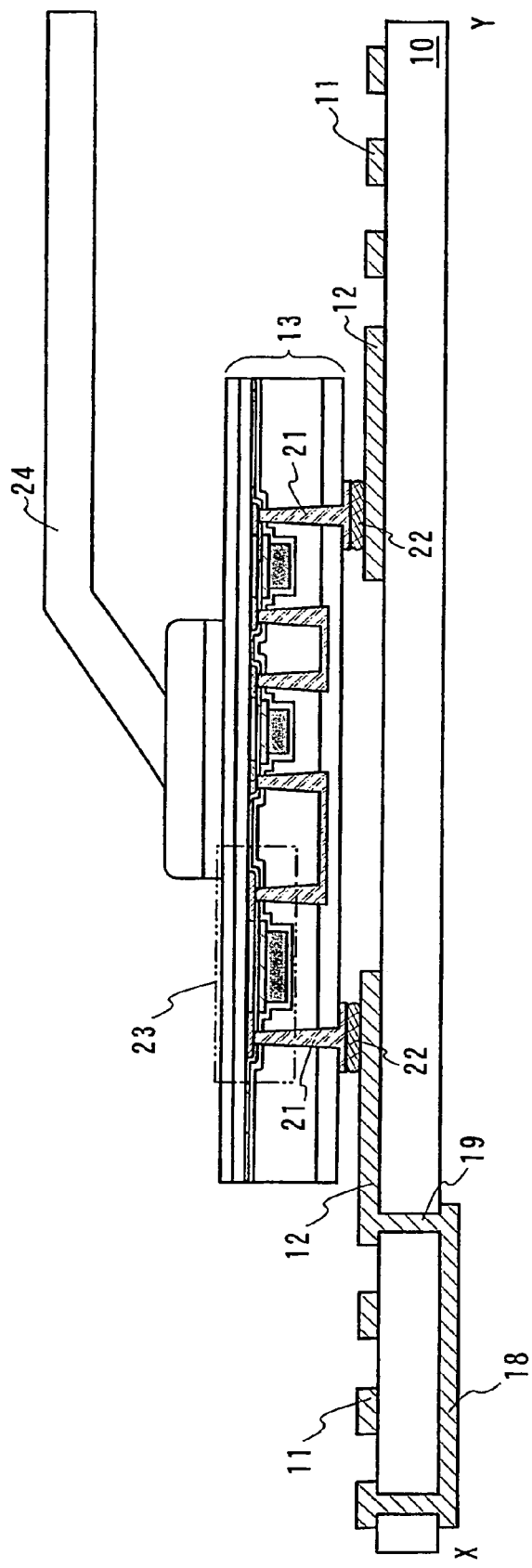
FIG. 2 is a diagram showing a manufacturing method of the ID label of the invention (an anisotropic conductive film).

Here, FIGS. 2, 3A and 3B show sectional diagrams along a direction of X-Y of the label substratum in FIG. 1A. A plurality of TFTs 23 are formed on the thin film integrated circuit device 13 and a connecting wiring 21 for connecting to the antenna is formed.

For the conductive material, various materials can be selected according to a function of the conductive film. Typically, silver (Ag), copper (Cu), gold (Au), nickel (Ni), platinum (Pt), chromium (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), lead (Zn), iron (Fe), titanium (Ti), silicon (Si), germanium (Ge), zirconium (Zr), barium (Ba), antimonial lead, antimonial tin oxide, fluorine-doped zinc oxide, carbon, graphite, glassy carbon, lithium, beryllium, sodium, magnesium, potassium, calcium, scandium, manganese, zirconium, gallium, niobium, sodium-potassium alloy, compound of magnesium and copper, compound of magnesium and silver, compound of magnesium and aluminum, compound of magnesium and indium, oxide compound of aluminum and aluminum, compound of lithium and aluminum, halogenated silver particles, dispersible nano-particles, indium tin oxide (ITO) used as a light-transmitting conductive film, zinc oxide (ZnO), gallium-doped zinc oxide (GZO), indium zinc oxide obtained by mixing 2 to 20% of zinc oxide to indium oxide (IZO), organic indium, organotin, titanium nitride and the like can be used. Further, for a material used for the light-transmitting conductive film, silicon (Si) or silicon oxide (SiOx) may be contained in the aforementioned paste or a target for sputtering. For example, a conductive material obtained by mixing silicon oxide to ITO (hereinafter referred to as "ITSO" for convenience) can be used. Also, a desired conductive film may be formed by stacking layers formed of these materials.

FIG. 2 shows the case of connecting a connecting wiring 21 of the thin film integrated circuit device and the connecting pad 12 of the label substratum through an anisotropic conductive film (hereinafter simply referred to as "ACF" (Anisotropic Conductive Film) and anisotropic conductive paste (ACP) in some cases). In this manner, a method of adhering the thin film integrated circuit device upside-down is referred to as a face down method.

Here, ACF has a structure that conductive particles are dispersed in a layer called a binder layer formed of a main component of an adhesive. Therefore, at the same time as adhering the thin film integrated circuit device and the connecting pad, conduction can be secured. As described later, a plurality of thin film integrated circuit devices are formed and the element separation is performed by dicing and the like. The thin film integrated circuit device can be adhered at a desired position of the label substratum by transferring each thin film integrated circuit device by using a small vacuum pin set 24 or a minute pin 25 shown in FIG. 3A.

Figure 1B:
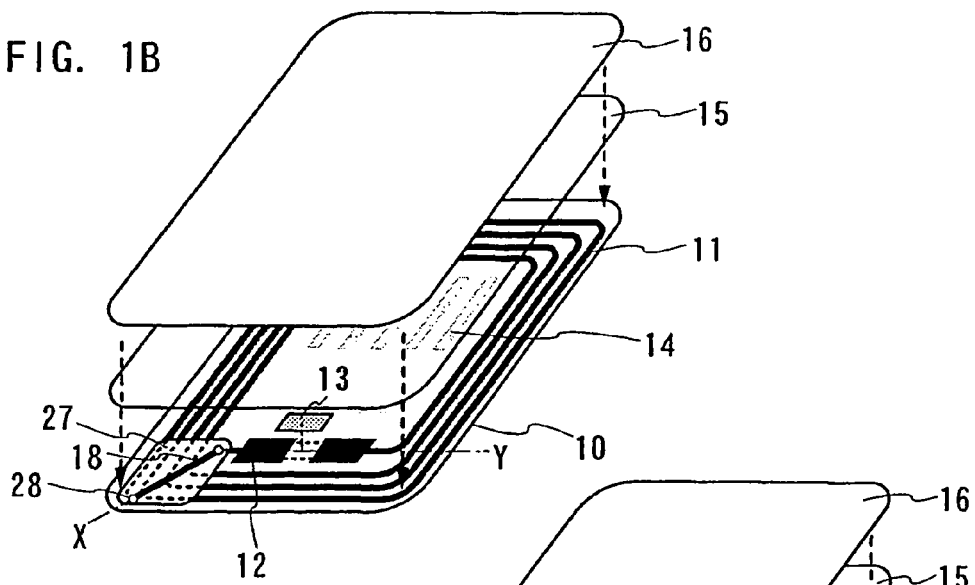
Figure 1C:
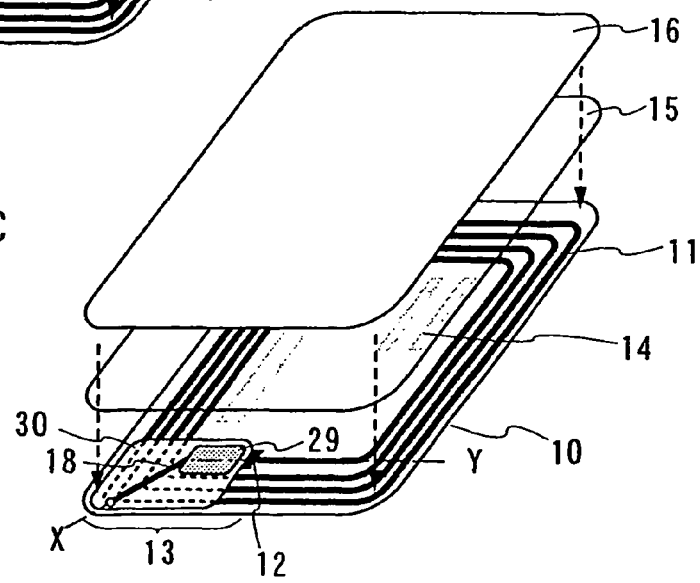

Next, a sectional structure of the antenna is described. In this embodiment mode, the case of an electromagnetic non-contact ID label utilizing a coil antenna as shown in FIGS. 1A to 1C is described. When a coil antenna approaches a magnetic field generated from a reader/writer (hereinafter sometimes referred to simply as "R/W") which is not shown, a current flowing through the antenna flows through a closed loop of the coil by electromagnetic phenomenon, thus a thin film integrated circuit device is activated. Therefore, as shown in FIGS. 1A to 1C, the thin film integrated circuit device is required to be connected to both ends of the antenna (for example, external and internal sides).

In this case, for preventing a short-circuit of the antennas, a cross wiring 18 as shown in FIGS. 1A and 2 is provided to connect the thin film integrated circuit device and a terminal portion of external side of the antenna through a contact portion 19. The contact portion 19 is preferably provided on a label substratum in advance. Note that the cross wiring 18 is formed by using the same or a different conductive material than that of the antenna 11 by any forming methods similarly to the formation of the antenna.

FIGS. 3A and 3B show the case of adhering the thin film integrated circuit and the label substratum through an adhesive layer 26 and directly connecting a connecting wiring 21 of the thin film integrated circuit device and a connecting pad 12 of the label substratum. For the adhesive layer 26, a similar material to that of the aforementioned adhesive layer 15 can be used. Note that each of the thin film integrated circuit devices after the separation is transferred by using the minute pin 25 or the small vacuum pin set 24 shown in FIG. 2 thereby can be adhered on a desired position of the label substratum.

The thin film integrated circuit device and the label substratum can be adhered by other methods as well as those of FIGS. 2, 3A and 3B. For example, a double-sided tape can be used or resin and the like can be formed so as to cover the thin film integrated circuit device, although not shown.

In this embodiment mode, it is preferable to form the coating layer 17 shown in FIG. 1A since the cross wiring 18 is exposed outside the label substratum.

In this embodiment mode, an electromagnetic induction type antenna structure is shown, however, any of an electromagnetic coupling type utilizing mutual induction of a coil due to an alternating magnetic field, a microwave type in which data is transmitted/received by microwaves (2.45 GHz), and an optical communication type in which data is communicated between the ID label and a R/W utilizing spatial transmission by light can be employed appropriately. Moreover, two connections of the thin film integrated circuit device and the antenna are provided, however, the invention is not limited to this.

Embodiment Mode 2

A structure and a manufacturing method of the ID label according to the invention are described mainly with reference to FIGS. 1B, 4A and 4B. FIG. 1B is a perspective view showing a stacked-layer structure of the ID label of the invention. Here for simplicity, a separating sheet as a mounting of the label is shown over a label substratum which is adhered on a product and the like.

FIG. 1B is similar to FIG. 1A in the respect that the antenna 11 and the connecting pad 12 which is a connecting portion between the antenna and a thin film integrated circuit are formed in advance on the label substratum 10 and a thin film integrated circuit 13 which is separately formed is adhered on the label substratum 10. However, in FIG. 1B, the cross wiring 18 which connects the thin film integrated circuit device and the antenna is formed on an insulating layer over the label substratum.

In this case, an insulating layer 27 is provided so that the antenna 11 and the cross wiring 18 are not short-circuited. Further, a contact portion 28 is formed on the insulating layer 27, thereby a terminal of external side of the antenna 11 and the cross wiring 18 are connected. FIG. 4A shows a cross sectional view along X-Y in FIG. 1B.

For the insulating layer 27, organic resin such as polyimide, acryl, polyamide, resist, and siloxane, silicon oxide, silicon nitride, silicon oxynitride, a film containing carbon such as DLC (Diamond Like Carbon) or carbon nitride (CN), and an inorganic material such as PSG (Phosphor Silicate Glass) and BPSG (Boron Phosphorus Silicon Glass) can be used. It is preferable that a thickness including the insulating layer 27 and the cross wiring 18 be thinner than that of the thin film integrated circuit device 13 as shown in FIG. 4A so that the thickness of the ID label as a whole does not become unnecessarily thick.

In this embodiment mode, the thin film integrated circuit device and the label substratum are connected through an anisotropic conductive film 22 similarly to FIG. 2, however, the method shown in FIGS. 3A and 3B may be employed as well.

The other structures may be similar to those described in Embodiment Mode 1.

In this embodiment mode, a cross wiring is formed inside the label substratum, therefore, a coating layer is not required to be provided on a surface of the label substratum as shown in FIG. 1A, thus the ID label can be formed thin.

In this embodiment mode, an electromagnetic induction type antenna structure is employed, however, any of an electromagnetic coupling type, a microwave type, and an optical communication type can be appropriately employed. In the case of forming what is called a hybrid ID label which has a both contact and non-contact functions, a wiring pattern which forms a connecting terminal may be formed by a printing method and the like. Further, two connections of the thin film integrated circuit device and the antenna are provided in this embodiment mode, however, the invention is not limited to this.

Embodiment Mode 3

A structure and a manufacturing method of the ID label according to the invention is described mainly with reference to FIGS. 1C and 4B. FIG. 1C is a perspective view showing a stacked-layer structure of the ID label of the invention. Here for simplicity, a separating sheet as mounting of the ID label is shown over a label substratum which is adhered on a product and the like.

FIG. 1C is similar to FIG. 1A in the respect that the antenna 11 and the connecting pad 12 which is a connecting portion between the antenna and a thin film integrated circuit are formed in advance on the label substratum 10 and the thin film integrated circuit 13 which is separately formed is adhered on the label substratum 10. However, in FIG. 1C, the cross wiring 18 which connects the thin film integrated circuit device and the antenna is formed inside the thin film integrated circuit device.

FIG. 4B is a cross sectional view along X-Y in FIG. 1C. Connecting wirings 21a to 21c which are connected to a TFT forming region 29 are provided for connecting an edge portion of internal side of the antenna and an edge portion of external side thereof. The cross wiring 18 is provided between the connecting wiring 21a which connects to the terminal portion of the external side of the antenna, and the TFT forming region. The cross wiring 18 can be formed in such a manner: after forming the TFT forming region is formed, a first interlayer film 30a is formed, a contact hole is formed, and then a conductive material is formed by sputtering or a droplet discharging method. Moreover, a second interlayer film 30b and the connecting wiring 21c are formed so that the cross wiring 18 and the antenna 11 are not short-circuited. Note that a conductive material used in the aforementioned embodiment can be appropriately used for the connecting wirings 21a to 21c and the cross wiring 18. Further, a protective film 31 may be formed on the second interlayer film 30b as well.

For a material of the interlayer film, a photosensitive or non-photosensitive organic material such as polyimide, acryl, polyamide, resist, or benzocyclobutene, or a heat resistant organic resin material such as siloxane (a material which has a bond of silicon and oxygen as a backbone structure and hydrogen as a substituent or a material which has at least one of fluorine, an alkyl group, and aromatic carbon hydride as a substituent) can be used. A forming method may be spin coating, dipping, spraying, droplet discharging method (inkjetting method, a screen printing method, an offset printing method and the like), doctor knife, roll coating, curtain coating, knife coating and the like can be employed according to a material used. Alternatively, an SOG film (for example, an SiOx film containing an alkyl group) obtained by coating may be used as well. Alternatively, an inorganic material may be used as well. In that case, silicon oxide, silicon nitride, silicon oxynitride, a film containing carbon such as DLC or CN, PSG, BPSG, an alumina film and the like can be used. A forming method thereof may be plasma CVD, low pressure CVD (LPCVD), atmospheric pressure plasma and the like. Note that the interlayer films 30a and 30b may be formed of the same material or different materials.

For a material of the protective film, silicon oxide (SiOx) and silicon oxynitride (SiOxNy) as well as silicon nitride (SiNx, $Si_3N_4$, and SiNOx), silicon nitride oxide (SiNxOy) and the like, which have a function to block an alkaline metal element such as Na are preferably used. In particular, since an ID label, an ID card, an ID tag and the like are handled with bare hands in many cases, Na contained in sweat can be prevented thereby. It is more preferable to stack the aforementioned materials. For example, (1) SiN or SiNO, (2) $SiO_2$ or SiON, (3) TFT, and (4) SiN or SiNO are stacked in this order. Note that these stacking structure can be freely combined. Moreover, not only over and under a TFT, but a peripheral portion thereof may be covered with the aforementioned material as well. Silicon oxynitride (SiOxNy) and silicon nitride oxide (SiNxOy) are sometimes referred to as silicon oxynitride collectively hereafter.

Further, by using a protective layer formed of the aforementioned material, a TFT can be protected from impurities contained in an adhesive layer in the case where the adhesive layer formed of an organic resin material is provided in closely contact with the protective layer. In the case where an antenna is formed in contact with the protective layer or inside thereof, a conductive material (in particular, Cu and Ag) can be prevented by employing the aforementioned protective layer.

In this embodiment mode, the thin film integrated circuit device and the label substratum are connected by the anisotropic conductive film 22 similarly to FIG. 2, however, the method shown in FIGS. 3A and 3B may be employed as well.

The other structures may be similar to those described in Embodiment Mode 1.

In this embodiment mode, as the cross wiring is formed in the thin film integrated circuit device, a coating layer is not required to be provided on a surface of the label substratum. Moreover, a contact hole is not required to be formed on the label substratum either.

In this embodiment mode, an electromagnetic induction type antenna structure is employed, however, any of an electromagnetic coupling type, a microwave type, and an optical communication type can be appropriately employed. In the case of forming what is called a hybrid ID label which has both contact and non-contact functions, a wiring pattern which forms a connecting terminal may be formed by a printing method and the like. Further, two connections of the thin film integrated circuit device and the antenna are provided in this embodiment mode, however, the invention is not limited to this.

Embodiment Mode 4

Figure 5A:
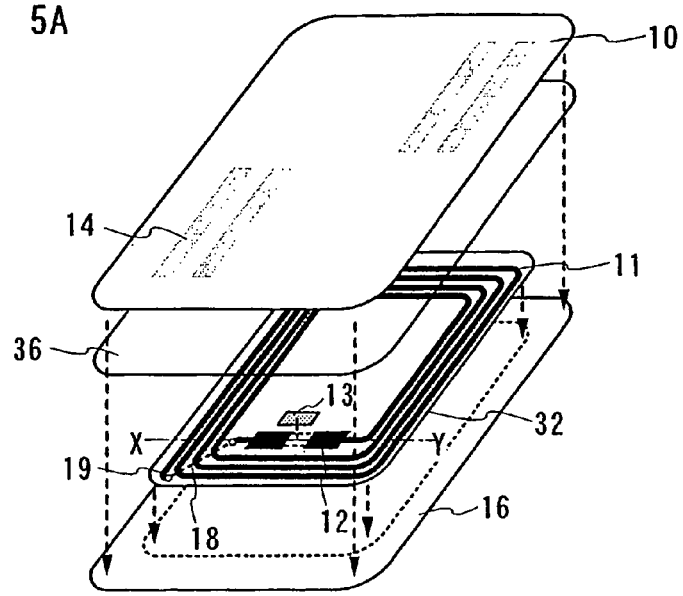
FIGS. 5A and 5B are a perspective view and a sectional view showing a stacked-layer structure of the ID label of the invention, respectively (an internal substratum).
Figure 5B:
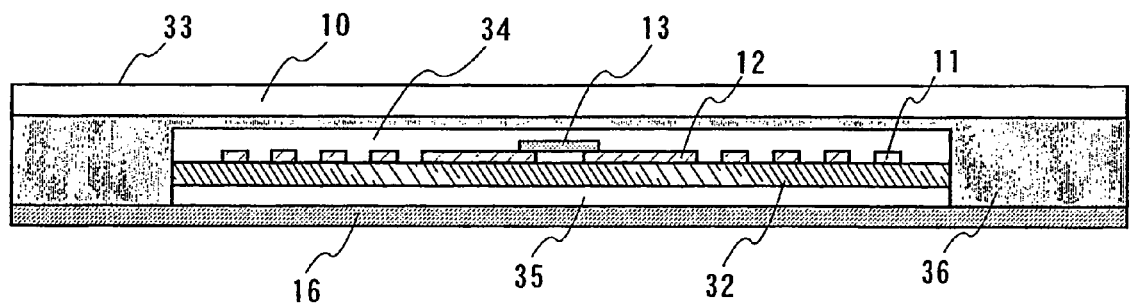

A structure and a manufacturing method of the ID label according to the invention is described mainly with reference to FIGS. 5A and 5B. FIG. 5A is a perspective view showing a stacked-layer structure of the ID label of the invention. Here, a label substratum which is adhered on a product and the like is shown over a separating sheet as mounting of the ID label.

In this embodiment mode, the antenna 11 and the connecting pad 12 which is a connecting portion between the antenna and the thin film integrated circuit device are formed on an internal substratum (inlet substratum) 32 to which the thin film integrated circuit device 13 which is separately formed, and a label substratum are adhered to the internal substratum 32.

The antenna and the thin film integrated circuit device can be provided on the internal substratum 32 similarly to the case of providing them on the label substratum in the aforementioned embodiment modes (see FIGS. 2 to 4B). However, it is preferable that the internal substratum is formed of a thin film so that the ID label as a whole does not become unnecessarily thick. The internal substratum can be formed by using a paper, a synthetic paper, a resin material such as plastic, PET, polypropylene, polyethylene, polystyrene, and nylon, an inorganic material and the like, however, the invention is not limited to these. It is preferable that the ID label as well as the internal substratum be formed of a flexible material so that the ID label can be adhered on a product having various shapes not only on a product having a plane shape. Accordingly, an ID label becomes easy to be handled. For the resin material, for example, high density polyethylene (HDPE) and the like described in Japanese Patent Laid-Open No. 2001-30403 can be used as well.

FIG. 5B is an enlarged sectional view of a completed ID label manufactured according to this embodiment mode. The top and bottom of an internal substratum on which an antenna and a thin film integrated circuit device are formed are covered with protective layers 34 and 35. As the protective layer, it is preferable to use silicon oxide, silicon nitride, silicon oxynitride and the like which block impurities such as Na. More preferably, these films are stacked. It is needless to say that other organic materials can be used as well.

The internal substratum 32 which is separately formed is adhered on the label substratum 10 through an adhesive layer 36. An image 14 is printed on the surface of the label substratum (a printed surface 33) as required. In this embodiment mode, the size of the internal substratum 32 is formed smaller than that of the label substratum 10, therefore, the adhesive layer 36 can also be formed on the sides of the internal substratum. Accordingly, the separating sheet 16, the internal substratum 32, and the label substratum 10 can be supported.

The ID label is adhered on a product and the like through the adhesive layer 36 by peeling the separating sheet. At this time, as the protective layer 35 is provided on the bottom portion of the internal substratum 32 (a surface adhered on the product), impurities such as Na can be blocked which enters from outside into the thin film integrated circuit device. Therefore, it is efficient that the protective layer 34 of the top is formed of a single layer for making the ID label thin, and the protective layer 35 on the bottom is formed of stacked layers for improving impurity blocking property.

In order to make the internal substratum 32 and the label substratum 10 almost the same size, an adhesive layer is provided on both the top and bottom surfaces of the internal substratum 32 to adhere the label substratum 10 and the separating sheet 16.

In this embodiment mode, an electromagnetic induction type antenna structure is employed, however, any of an electromagnetic coupling type, a microwave type, and an optical communication type can be appropriately employed. In the case of forming what is called a hybrid ID label which has both contact and non-contact functions, a wiring pattern which forms a connecting terminal may be formed by a printing method and the like. Further, two connections of the thin film integrated circuit device and the antenna are provided in this embodiment mode, however, the invention is not limited to this.

Embodiment Mode 5

Figures 6A, 6B:
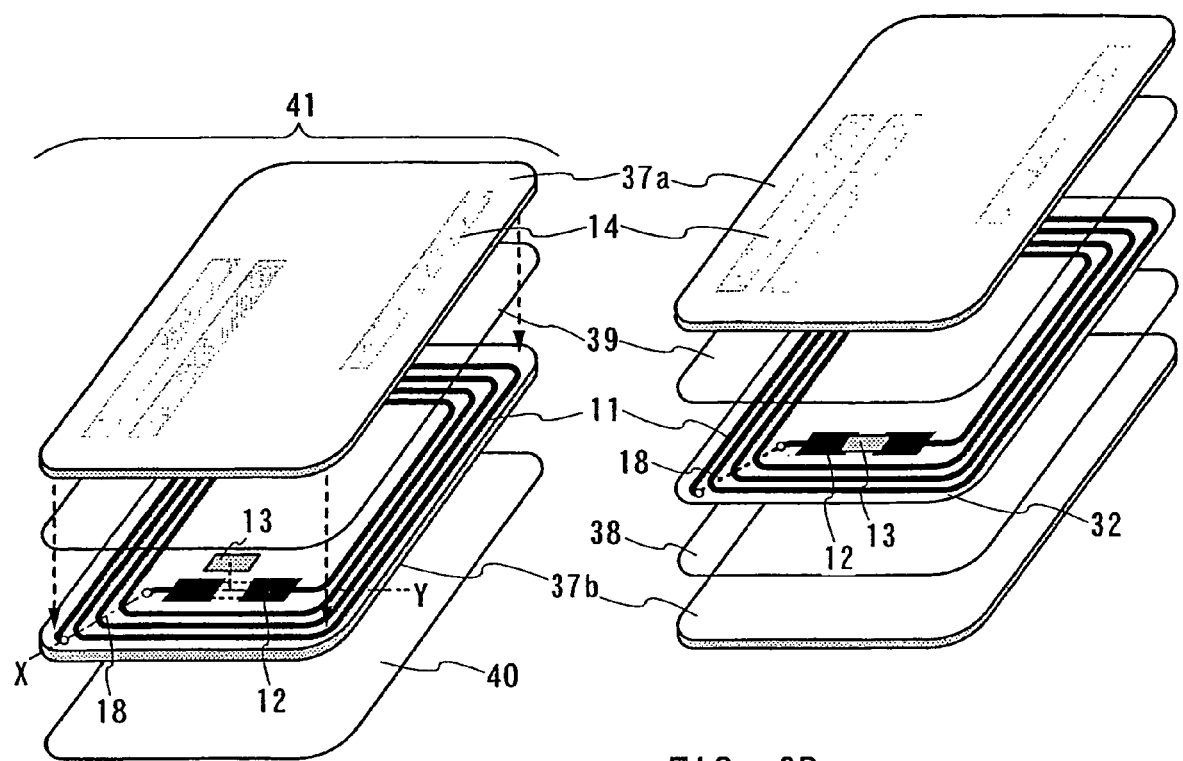
FIGS. 6A and 6B are perspective views showing stacked-layer structures of the ID card of the invention.

A structure and a manufacturing method of the ID card according to the invention are described mainly with reference to FIGS. 6A and 6B. FIGS. 6A and 6B are perspective views showing a stacked-layer structure of the ID card of the invention.

FIG. 6A shows the case where the antenna 11 and the connecting pad 12 which is a connecting portion between the antenna and the thin film integrated circuit device are formed on a bottom card substratum 37b of the ID card and the thin film integrated circuit device 13 which is formed separately is adhered on the bottom card substratum 37b. Moreover, a cover (a top card substratum 37a) which covers the thin film integrated circuit device is adhered through an adhesive layer 39 is provided on the bottom card substratum 37b. The image 14 is printed on the top card substratum 37a and the bottom card substratum 37b as required. Further, in the case where the cross wiring 18 for connecting the connecting pad 12 and the antenna 11 is exposed on the surface of the bottom card substratum, a coating layer 40 may be formed additionally.

For the card substratum, representatively, a resin material such as plastic, PET, polypropylene, polyethylene, polystyrene, and nylon as well as a paper, a synthetic paper, an inorganic material and the like may be used. The ID card is usually used without being folded, however, it is preferable to use a flexible material for the card substratum in the case of forming a folding ID card. Note that high density polyethylene (HDPE) described in Japanese Patent Laid-Open No. 2001-30403 and the like can be used for the resin material as well. Also, two or more kinds of the aforementioned materials may be used in combination.

A structure of the antenna including the cross wiring, a connecting method of the thin film integrated circuit device and the antenna and the like can be similar to those described in Embodiment Modes 1 to 4. In this manner, an ID card 41 is completed.

FIG. 6B shows the internal substratum 32 on which the antenna 11 and the thin film integrated circuit device 13 are adhered is sealed with the bottom card substratum 37b interposing adhesive layers 38 and 39 therebetween. Although not shown, by forming the internal substratum 32 smaller than the bottom card substratum 37b, one of the adhesive layers 38 and 39 is not required, which can make the ID card thinner.

In this embodiment mode, an electromagnetic induction type antenna structure is employed, however, any of an electromagnetic coupling type, a microwave type, and an optical communication type can be appropriately employed. In the case of forming what is called a hybrid ID label which has both contact and non-contact functions, a wiring pattern which forms a connecting terminal may be formed by a printing method and the like. Further, two connections of the thin film integrated circuit device and the antenna are provided in this embodiment mode, however, the invention is not limited to this.

Embodiment Mode 6

Figure 7A:
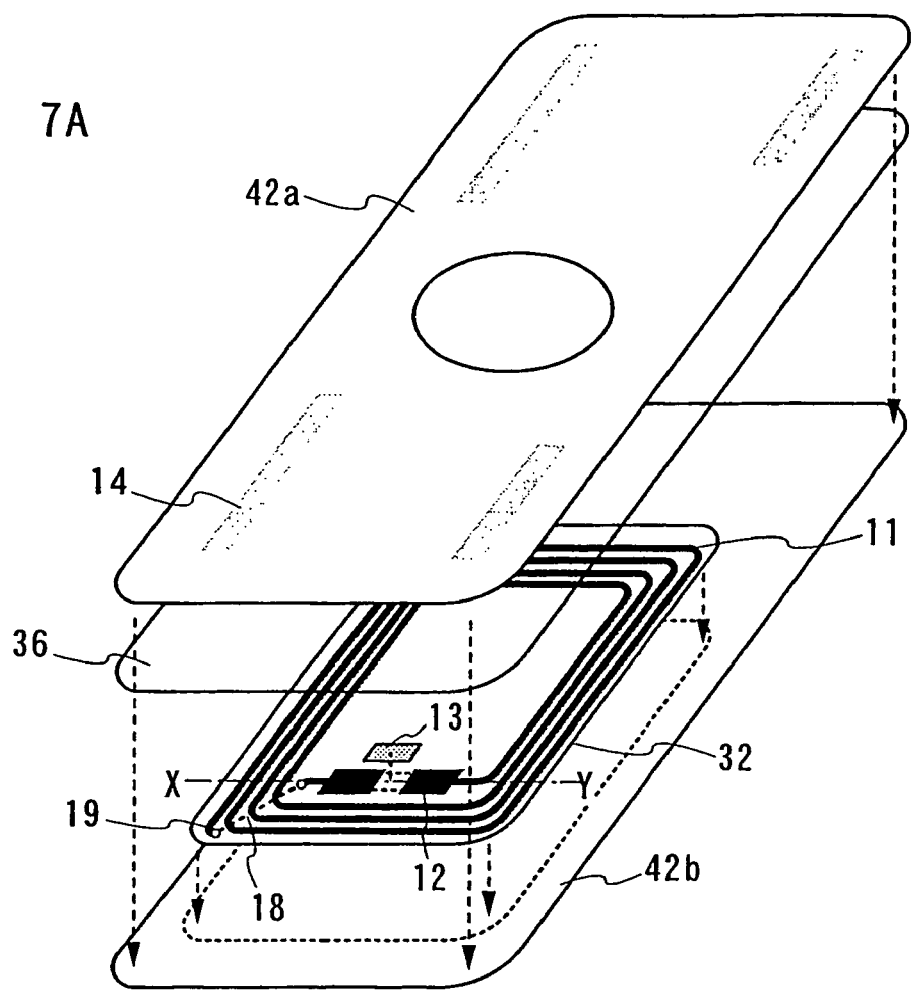
FIGS. 7A and 7B are perspective views showing stacked-layer structures of a paper money and a coin of the invention, respectively.
Figure 7B:
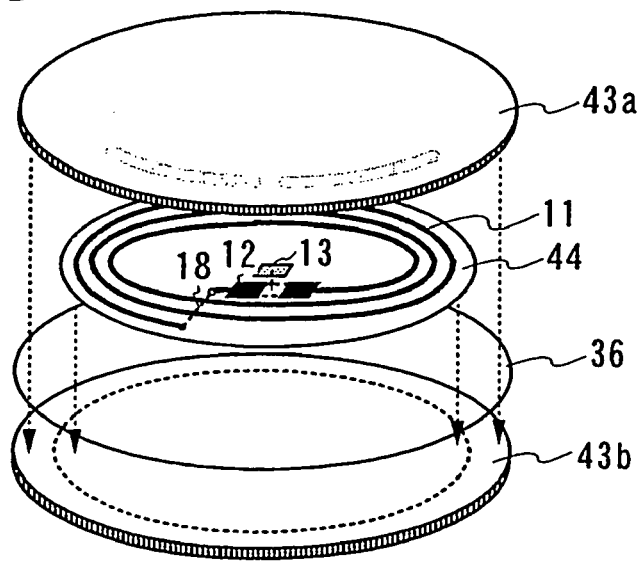

A structure and a manufacturing method of paper money, coins and the like according to the invention are described mainly with reference to FIGS. 7A and 7B. FIGS. 7A and 7B respectively shows stacked-layer structures of paper money and coin according to the invention.

FIG. 7A shows the internal substratum 32 on which the antenna 11 and the thin film integrated circuit device 13 are adhered is sealed with a top substratum 42a and a bottom substratum 42b through the adhesive layer 36. For the top substratum 42a and the bottom substratum 42b, a pulp material such as a paper and a synthetic paper is normally used for the paper money, however, the invention is not limited to this. This structure is not limited to be applied to paper money only. The substratum can be appropriately changed according to various applications such as a coupon bond which includes a postage stamp, a railway ticket, a ticket, an admission ticket, a gift token, a book coupon, a stationery coupon, a beer coupon, rice coupon, various gift certificates and various service certificates, a valuable paper which includes a security, a promissory note, a check, a stock, and a public corporation bond, a deed which includes a resident's card, a copy of family register, an abstract of family register, an employee ID, a student ID, a membership card, an admission ticket for an examination, a participant ticket, a qualification, and an identification, an ID tag used for identifying goods which includes a shipping tag, a price tag, a nametag and a homeplate, a wrapping paper and the like.

FIG. 7B shows a circular or oval internal substratum 44 on which the antenna 11 and the thin film integrated circuit device 13 are formed is sealed with a circular or oval top substratum 43a and bottom substratum 43b through the adhesive layer 36. The top substratum 43a and the bottom substratum 43b are formed in circular or oval shapes in view of an application mainly to a coin, however, the invention is not limited to these shapes. The aforementioned coin refers to money which circulates in the market as well as a cash voucher and the like which can be used similarly to coins in a specific area. Further, the invention includes a commemorative coin, a commemorative medal and the like which are temporarily issued.

In FIGS. 7A and 7B, the structure of the antenna including the cross wiring, the connecting method of the thin film integrated circuit device and the antenna, and the like can be similar to those described in Embodiment Modes 1 to 4. At this time, by forming the internal substrates 32 and 44 as small as possible as compared to the top substratums 42a and 43a and the bottom substratums 42b and 43b, an area for adhesion occupied by the adhesive layer 36 can be large. Accordingly, paper money, a bond, valuable securities, a coupon bond, a coin and the like which are superior in resistance against damages can be formed.

The shapes of the internal substratums 32 and 44 and the antenna 11 are not limited to those shown in FIGS. 7A and 7B.

The thin film integrated circuit device used in the invention, which is formed of thin film active elements such as a TFT, can be formed in a thickness of about 5 μm or less (excluding the thickness of a protective film when provided on the top and the bottom). Preferably, the thickness is 0.1 to 3 μm. It is preferable that the size of an IDF chip be 25 mm$^2$ or less, or more preferably 0.09 to 16 mm$^2$. Moreover, it is preferable to form the protective layers on the top and the bottom be larger than the size of the IDF chip.

In this manner, the thin film integrated circuit device used in the invention is quite thin as compared to a conventional IC chip which has about 0.06 mm (60 μm) in thickness, therefore, it is very suitable for being incorporated as a chip in thin product formed of a paper or a resin film. Further, as the IDF chip is thin, it is possible to be combined as one body by filling the periphery thereof with an organic resign material. Accordingly, it can be prevented that a bending stress affects the IDF chip.

In this embodiment mode, an electromagnetic induction type antenna structure is employed, however, any of an electromagnetic coupling type, a microwave type, and an optical communication type can be appropriately employed. In the case of forming what is called, a hybrid ID label which has both contact and non-contact functions, a wiring pattern which forms a connecting terminal may be formed by a printing method and the like. Further, two connections of the thin film integrated circuit device and the antenna are provided in this embodiment mode, however, the invention is not limited to this.

Embodiment Mode 7

A manufacturing method of the ID label according to the invention is described with reference to FIGS. 8A and 8B. FIGS. 8A and 8B are schematic diagrams showing manufacturing lines of the ID label of the invention.

Figure 34A:
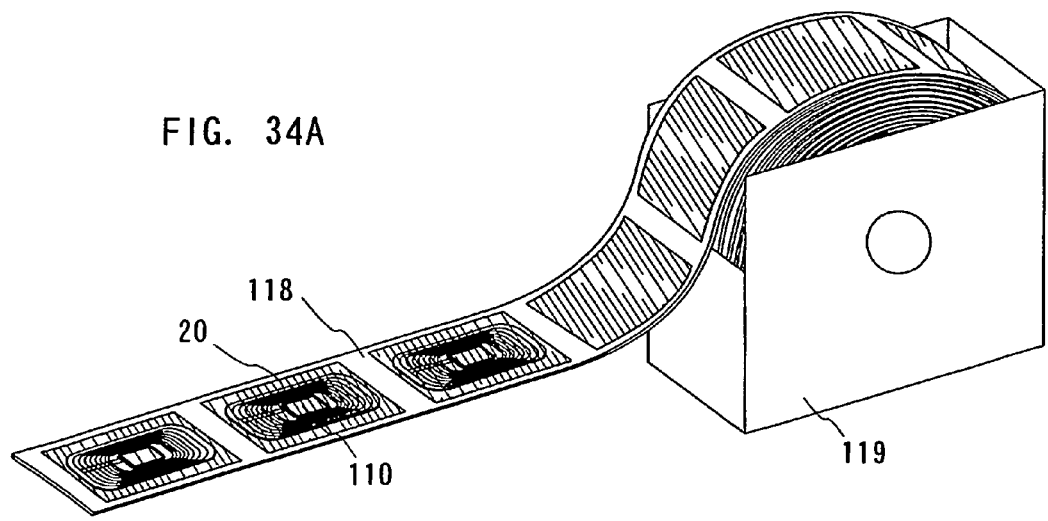
FIGS. 34A to 34E are views illustrating examples of object to which the invention is applied.

First, as shown in FIG. 8A, a label paper which is to be a substratum of the ID label is supplied from a label paper supply means 300 (a roll 1) and an IDF chip (a thin film integrated circuit device) is adhered on a desired position of the label paper. At this time, an adhesive, an ACF, an ultrasonic adhesion, or an UV adhesion are used appropriately. Here, the label paper and the IDF chip are adhered through an ACF using an ACF supply means 301 and an IDF chip adhering means 302, assuming that an antenna is formed on the label paper. It is needless to say that the antenna formed on the label paper and the IDF chip are connected. Next, an adhesive layer is supplied from an adhesive layer supply means 303 and a separating paper (a separating sheet) supplied from a separating paper supply means 304 (a roll 2) is adhered to complete an ID label. At last, the ID label is rolled up by using a label roll up means 305 (a roll 3). It is preferable that the ID label substratum be separated into each label in advance and the separating paper be in a form of a strip. In this case, independently separated ID labels 20 can be obtained on a sequential label mounting 118 (a separating sheet) as shown in FIG. 34A.

An order to supply the label paper and the separating paper may be reverse as shown in FIG. 8B. In FIG. 8B, an antenna is integrally formed in an IDF chip, therefore, the ACF supply means 301 is omitted. After a plurality of ID labels are formed in a strip form, the ID labels may be separated by a label separating means 306 such as a clicker cutter to obtain independent labels and collected by a collecting means 307 as products. It is needless to say that FIGS. 8A and 8B can be alternately combined.

A method according to this embodiment mode can be appropriately applied to the ID card, the ID tag, a paper money, a coin, a deed, a coupon bond, valuable securities and the like of the invention. In the case of the ID tag, for example, the bottom substratum material is held by the roll 1 while the top substratum material is held by the roll 2.

Embodiment Mode 8

A manufacturing method of the ID card and the ID tag of the invention is described mainly with reference to FIGS. 9A and 9B. FIGS. 9A and 9B are respectively a schematic diagram showing a manufacturing line of the ID card and the ID tag according to the invention and an enlarged view thereof.

First, a material which is to be a substratum of the ID card and the ID tag is supplied from a substratum supply means 308 (the roll 1) as shown in FIG. 9A and an IDF chip (a thin film integrated circuit device) is adhered on a desired position of the substratum by the IDF adhering means 302. At this time, an adhesive, an ACF, an ultrasonic adhesion, or an UV adhesion are used appropriately. Next, in the case where the substratums are sequentially formed in a strip form, the substratums are separated into independent ID card or ID tag by a substratum separating means 309. Then, a periphery of each substratum is laminated by a laminating apparatus 310. Accordingly, the ID card or the ID tag are completed.

Alternatively, after forming IDF chips on a desired position of a strip form substratum and laminating it, they may be separated into independent ID card or ID tag as well. The ID cards or the ID tags which are laminated are collected by the collecting means 307.

FIG. 9B is an enlarged sectional view of a completed ID card or ID tag manufactured by the method according to this embodiment mode. The antenna 11 is formed on the label substratum 32, and the thin film integrated circuit device 13 connected to the antenna is formed over the label substratum 32 through the connecting pad 12, and the label substratum is covered with a film layer 45 through protective layers 34 and 35. The protective layers 34 and 35 are preferably provided in order to protect the thin film integrated circuit device and the antenna in thermal treatment and the like in a lamination process. For the protective layer, a film containing carbon such as DLC or CN, a silicon nitride film, a silicon nitride oxide film and the like can be used, however, the invention is not limited to these. For a forming method, plasma CVD, atmospheric pressure plasma and the like can be used.

In this manner, a laminated ID card or an ID tag can be obtained. Note that any product suitable for the lamination process can employ this manufacturing process as well as an ID card and an ID tag.

Embodiment Mode 9

Figure 10:
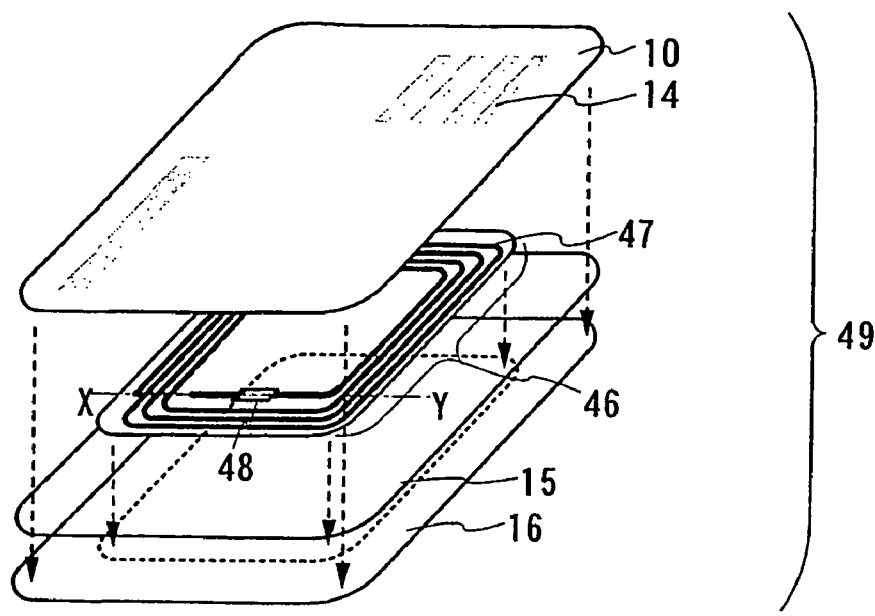
FIG. 10 is a perspective view showing a stacked-layer structure of the ID label of the invention (an antenna integrated type).

A structure and a manufacturing method of the ID label and the ID card according to the invention are described mainly with reference to FIGS. 10A to 12B. FIG. 10 is a perspective view showing a stacked-layer structure of the ID label of the invention. Here, a label substratum which is adhered on a product and the like is shown over a separating sheet as mounting of the ID label.

FIG. 10 shows, in the ID label 49, a method for adhering an antenna integrated thin film integrated circuit device 46 (hereinafter sometimes referred to as "an antenna integrated IDF chip") in which an antenna 47 and a thin film integrated circuit device 48 are integrally formed, on the separating sheet 16 or the label substratum 10 through the adhesive layer 15. Note that materials for the label substratum, the adhesive layer, and the separating sheet are based on those described in the aforementioned embodiment modes. Further, the shapes of the IDF chip and the antenna are not limited to the ones shown in FIG. 10.

Figure 11:
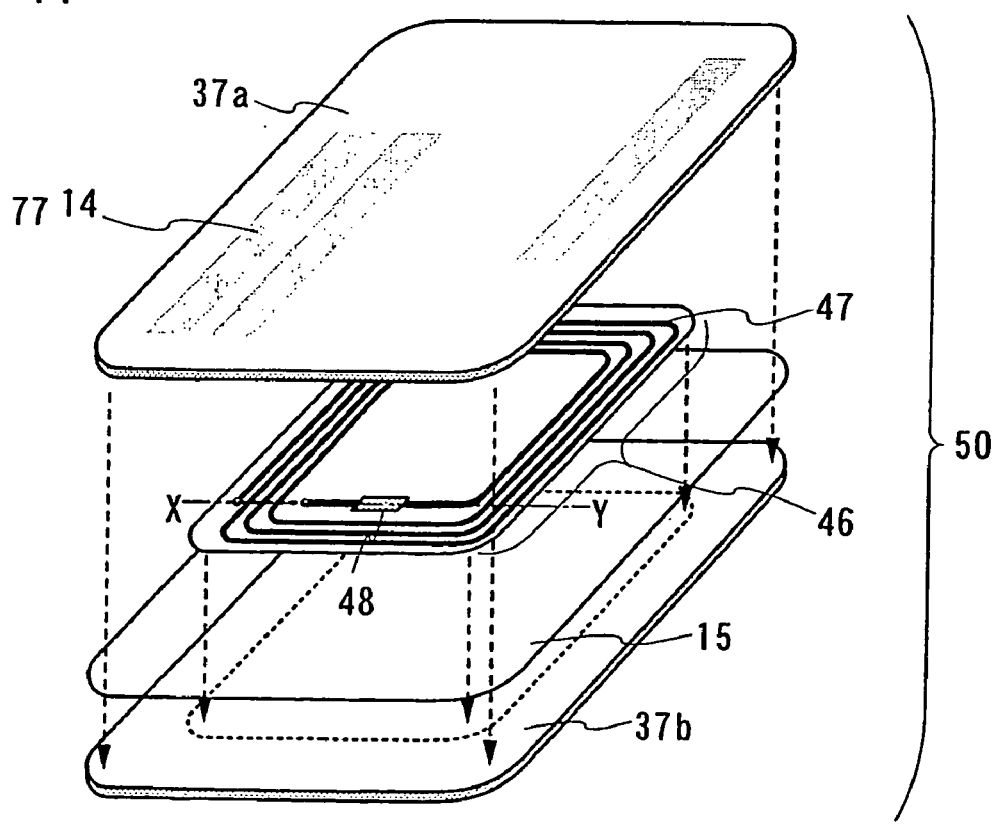
FIG. 11 is a perspective view showing a stacked-layer structure of the ID card of the invention (an antenna integrated type).

FIG. 11 shows a method for adhering the antenna integrated thin film integrated circuit device 46 on the bottom card substratum 37b through the adhesive layer 15 in the ID card 50. Note that materials for the bottom card substratum and the adhesive layer are based on those described in the aforementioned embodiment modes. The shapes of the IDF chip and the antenna are not limited to the ones shown in FIG. 11.

FIGS. 12A and 12B each shows a sectional diagram along X-Y of the antenna integrated IDF chip of the ID label or the ID card shown in FIG. 11.

FIG. 12A shows the case where a gate electrode 56 (here, two-layer structure is employed) and a cross wiring 52 are simultaneously formed after forming an island-shaped semiconductor film 57 and a gate insulating film 58 on a protective film 55. Further; the antenna 47, a wiring 51a for connecting a TFT and the antenna 47, and a wiring 51b for connecting TFTs are formed through an interlayer film 53. It is preferable to form the gate electrode 56 and the cross wiring 52 through the same step and the antenna 47 and the wirings 51a and 51b through another same step, however, they may be formed in stages as well.

FIG. 12B shows the case of forming the gate electrode 56 (here, two-layer structure is employed) and the antenna 47 are formed after forming the island-shaped semiconductor film 57 and the gate insulating film 58 on the protective film 55. Further, the wiring 51a for connecting a TFT and the antenna 47, the cross wiring 52, and the wiring 51b for connecting TFTs are formed through the interlayer film 53. It is preferable that the gate electrode 56 and the antenna 47 be formed through the same step and the cross wiring 52 and the wirings 51a and 51b be formed through another same step, however, they may be formed in stages as well.

FIGS. 12A and 12B both employ top gate TFTs, however, bottom gate TFTs may be employed as well, needless to say. A specific manufacturing method of a TFT is described later. Further, it is preferable to form the protective film 55 which has a single layer or a stacked-layer structure in order to prevent impurities from dispersing into the island-shaped semiconductor film 57. Also, it is preferable to form the protective film 54 after forming the antenna 47 as well. The protective film can be formed of silicon nitride, silicon oxide, silicon oxynitride and the like, however, it is preferable that silicon nitride be contained which has blocking property against impurities such as Na.

Alternatively, a high elastic organic material such as polyimide may be used for an interlayer film and a protective film. Accordingly, a stress generated by deformation concentrates to the interlayer film or the protective film each containing an organic material, thereby these films deform, thus a stress applied to the TFT is reduced. When the deformation is generated, an edge of a base film receives the most stress than an edge of the semiconductor film. Therefore, a stress concentration generated at an edge or an interface of the semiconductor film can be suppressed.

Figure 25A:
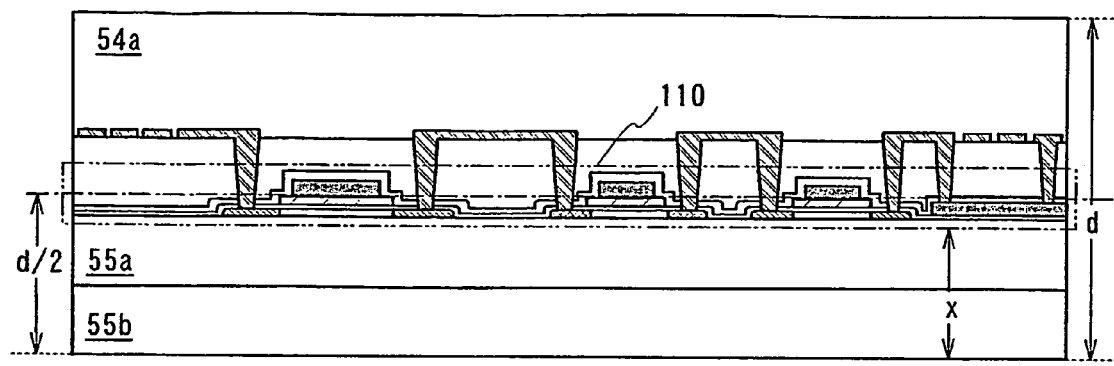
FIGS. 25A to 25C are diagrams each showing a positional relationship of the IDF chip and a protective film.
Figure 25B:
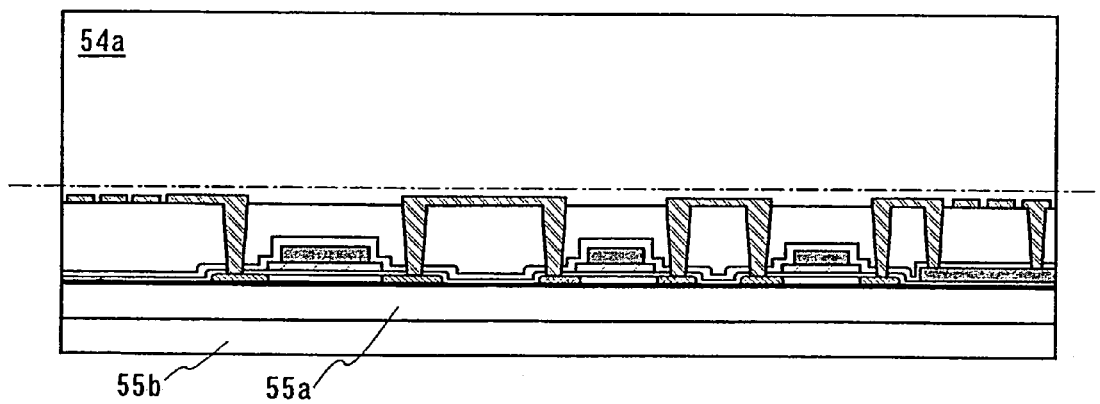
Figure 25C:
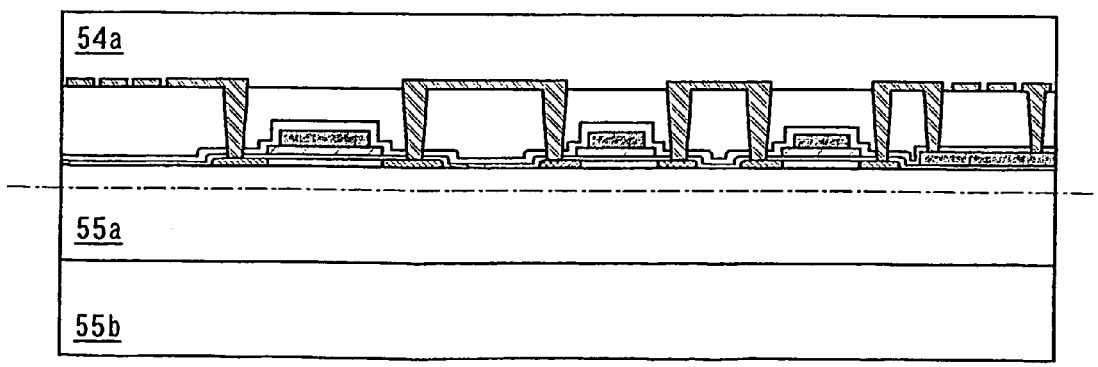

As shown in FIGS. 25A to 25C, it is preferable to place an IDF chip 110 at an almost center portion of a top protective layer 54a and bottom protective layers 55a and 55b. Here, the IDF chip 110 is formed in a thickness of about 5 μm or less, more preferably 0.3 to 3 μm. On the other hand, an antenna is typically formed in a thickness of 5 to 40 μm while the protective films are each formed in a thickness of 10 to 200 μm. Therefore, when a total thickness of the top and bottom protective films, the IDF chip, and the antenna (in the case where the antenna is integrally formed) is d, it is preferable to place the IDF chip at a position where $x=(d/2)\pm 30$ μm is satisfied, more preferably at a position where $x=(d/2)\pm 10$ μm is satisfied.

In this manner, a stress applied to the IDF chip can be alleviated by placing the IDF chip at a center of the protective film. Accordingly, a crack can be prevented in each layer forming a TFT.

The aforementioned are only an example of a structure in the case of integrally forming a TFT and an antenna, and the invention is not limited to this.

Embodiment 1

In this embodiment, a specific manufacturing method of a thin film integrated circuit device is described with reference to FIGS. 13A to 16C. Here for simplicity, sectional structures of a CPU and a memory using an n-type TFT and a p-type TFT are shown to describe a manufacturing method of the thin film integrated circuit.

Figure 13A:
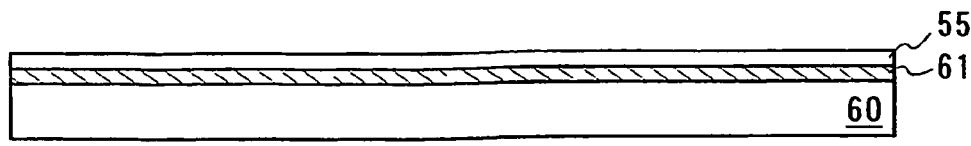
FIGS. 13A to 13E are diagrams showing manufacturing steps of a CPU and a memory in the thin film integrated circuit device used in the invention.

First, a peeling layer 61 is formed on a substrate 60 (see FIG. 13A). Here, an a-Si film (an amorphous silicon film) in a thickness of 50 nm (500 Å) is formed on a glass substrate (for example, Corning 1737 substrate) by CVD. For the substrate, a quartz substrate, a substrate formed of an insulating substance such as alumina, a silicon wafer substrate, a plastic substrate which can resist a processing heat of a subsequent step as well as a glass substrate and the like can be used.

For the peeling layer, a layer containing silicon (Si) as a main component, such as polycrystalline silicon, single crystalline silicon, and SAS (semi-amorphous silicon (also referred to as micro-crystalline silicon)) as well as amorphous silicon can be used. These peeling layers may be formed by sputtering as well as CVD. The peeling layer may be formed thinner than 50 nm.

Next, the protective film 55 (also referred to as a base film or a base insulating film) is formed on the peeling layer 61 (see FIG. 13A). Here, a silicon nitride film in a thickness of 100 nm (1000 Å) is formed by CVD, however, a material and a manufacturing method are not limited to these, but a silicon oxide film, a silicon oxynitride film or the like can be used as well. Moreover, it may have a stacked-layer structure as well as a single layer structure. For example, it is preferable to employ a three-layer structure of a silicon oxynitride film (SiOxNy) (x>y), a silicon nitride oxide film (SiNxOy)(x>y) (x, y=1, 2, . . . ), and a silicon oxynitride film.

In the case of using a material containing silicon such as a-Si as a main component for the peeling layer 61 and the island-shaped semiconductor film 57, it is preferable to use SiOxNy for the protective layer in view of securing adhesion property.

Next, a thin film transistor (TFT) which constitutes a CPU and a memory of the thin film integrated circuit device are formed on the protective film 55. Other than a TFT, a thin film active element such as an organic TFT and a thin film diode can be formed as well.

Figure 13B:
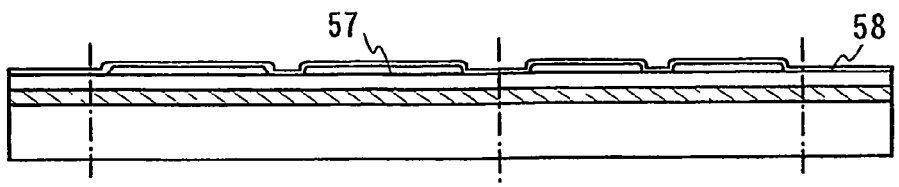

To form a TFT, the island-shaped semiconductor film 57 is formed on the protective film 55 first (see FIG. 13B). The island-shaped semiconductor film 57 is formed of an amorphous semiconductor, a crystalline semiconductor, or a semi-amorphous semiconductor. In any cases, a semiconductor film containing silicon, silicon germanium (SiGe) and the like as a main component can be used.

Here, an amorphous silicon in a thickness of 70 nm is formed, of which surface is treated with solution containing nickel. After that, a crystalline silicon semiconductor film is obtained by a thermal crystallization process at a temperature of 500 to 750° C. and laser crystallization is performed to improve the crystallinity. For a deposition method, plasma CVD, sputtering, LPCVD and the like may be used, or a laser crystallization, a thermal crystallization, a thermal crystallization using other catalysts (Fe, Ru, Rh, Pd, Os, Ir, Pt, Cu, Au and the like), or these methods may be performed multiple times alternately as well.

For crystallizing an amorphous semiconductor film, a continuous oscillation laser may be used as well as a continuous oscillation solid laser is used to obtain crystals having large grain diameters with light of second to fourth harmonics of a fundamental wave (the crystallization at this time is referred to as CWLC). Typically, a second harmonic (532 nm) or a third harmonic (355 nm) of an Nd:YVO$_4$ laser (a fundamental wave of 1064 nm) is preferably used. In the case of using a continuous oscillation laser, laser light emitted from the YVO$_4$ laser which is capable of continuously oscillating with an output of 10 W is transformed to a high harmonic wave by a non-linear optical element. Moreover, there is a method of putting YVO$_4$ crystals or GdVO$_4$ crystals and a non-linear optical element into a resonator, thereby emitting a harmonic wave. The harmonic wave is formed into the laser light with a rectangular shape or an elliptical shape on an irradiation surface by an optical system, to be irradiated to an object being processed. The energy density at this time needs to be about 0.01 to 100 MW/cm$^2$ (preferably 0.1 to 10 MW/cm$^2$). Then, the semiconductor film is irradiated with the laser light while relatively being moved with respect to the laser light at a speed of about 10 to 2000 cm/s.

In the case of using a pulse oscillation laser, a frequency band of about several tens to several hundreds Hz is typically used, however, a pulse oscillation laser having an oscillation frequency of 10 MHz or more, which is drastically higher than the aforementioned may be use as well (crystallization at this time is referred to as MHzLC). It takes several tens to several hundreds nsec until a semiconductor film irradiated with pulse oscillation laser light is completely solidified. Therefore, by using the aforementioned high frequency band, next pulse laser can be irradiated until the semiconductor film dissolved by laser light is solidified. Accordingly, a solid-liquid interface of the semiconductor film can be continuously moved, which is different than the case of using a conventional pulse oscillation laser. Thus, a semiconductor film having crystal grains which are continuously grown in a direction of a scanning direction is formed. In specific, an aggregation of crystal grains of which width in a scanning direction is 10 to 30 μm and the width in a direction perpendicular to the scanning direction is 1 to 5 μm can be formed. By forming single crystal grains which extend long to the scanning direction, a semiconductor film can be formed in which any crystal grain boundaries hardly exist in at least a channel direction of the TFT.

By the aforementioned method, a crystalline silicon semiconductor film is obtained. Note that the crystals are preferably aligned in a source, a channel, and a drain directions. Further, it is preferable that the thickness of the crystalline layer be 20 to 200 nm (typically 40 to 170 nm, or more preferably 50 to 150 nm). After that, an amorphous silicon film for gettering metal catalysts is formed interposing an oxide film on the semiconductor film, and then gettering treatment is performed by thermal treatment at a temperature of 500 to 750° C. Further, in order to control a threshold value of a TFT element, boron ions are injected at a dosage of $10^{13}/cm^2$ order to a crystalline silicon semiconductor film. After that, the island-shaped semiconductor film 57 is formed by etching with a resist as a mask.

The crystalline semiconductor film can be formed by directly forming a polycrystalline semiconductor film by LPCVD with disilane ($Si_2H_6$) and germanium fluoride ($GeF_4$) as a source gas. The gas flow rate is $Si_2H_6/GeF_4=20/0.9$, a deposition temperature is 400 to 500° C., and He or Ar is used as a carrier gas here, although the invention is not limited to this.

Note that the channel region in particular in a TFT is preferably added with hydrogen or halogen of $5\times10^{15}$ to $2.5\times10^{21}$ $cm^{-3}$ (0.00001 to 5 atomic %) or preferably 0.0005 to 5 atomic %. In any cases, it is preferable that more hydrogen or halogen be contained than that contained in a single crystal used for an IC chip. Accordingly, even when a crack is generated locally in a TFT portion, hydrogen or halogen can terminate (saturate) it.

Next, the gate insulating film 58 is formed on the island-shaped semiconductor film 57 (see FIG. 13B). It is preferable that the gate insulating film 58 be formed by using a thin film forming method such as plasma CVD or sputtering to form a film containing silicon nitride, silicon oxide, silicon nitride oxide or silicon oxynitride in a single layer or by stacking. In the case of stacking the layers, for example, a three-layer structure is preferably employed in which a silicon oxide film, a silicon nitride film, and a silicon oxide film are stacked in this order from the substrate side.

Figure 13C:
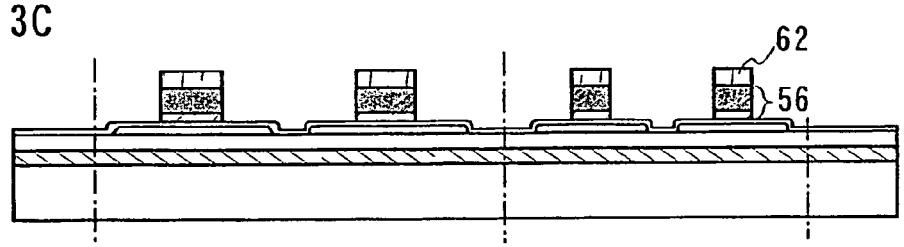

Next, the gate electrode 56 is formed (see FIG. 13C). Here, the gate electrode 56 is formed by stacking TaN (titanium nitride) in a thickness of 30 nm and W (tungsten) in a thickness of 370 nm by sputtering, and etching with a resist 62 as a mask. Here, a mask such as SiOx may be used instead of the resist mask. In this case, a step of patterning a mask of SiOx, SiON and the like (referred to as a hard mask) is additionally provided. However, as less amount of film as a mask is reduced by etching than the resist, a gate electrode layer having a desired width can be formed. It is needless to say that a material, a structure, and a manufacturing method of the gate electrode 56 are not limited to these and can be appropriately selected. For example, the gate electrode 56 may be selectively formed by a droplet discharging method without using the resist 62.

For the conductive material, various materials can be selected according to a function thereof, such as silver (Ag), copper (Cu), gold (Au), nickel (Ni), platinum (Pt), chromium (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), lead (Zn), iron (Fe), titanium (Ti), silicon (Si), germanium (Ge), zirconium (Zr), barium (Ba), antimonial lead, tin oxide antimony, fluoride doped zinc oxide, carbon, graphite, glassy carbon, lithium, beryllium, sodium, magnesium, potassium, calcium, scandium, manganese, zirconium, gallium, niobium, sodium-potassium alloy, magnesium-copper mixtures, magnesium-silver mixture, magnesium-aluminum mixture, magnesium-indium mixture, aluminum-aluminum oxide mixture, lithium-aluminum mixture, or silver halide particles, dispersed nanoparticles, indium tin oxide (ITO) used as a transparent conductive film, ITSO, ZnO, GZO, IZO, organic indium, organotin, titanium nitride or the like.

For an etching gas used for etching the gate electrode, a mixture gas of $CF_4$, $Cl_2$, and $O_2$ or a $Cl_2$ gas are used, however, the invention is not limited to these.

Figure 13D:
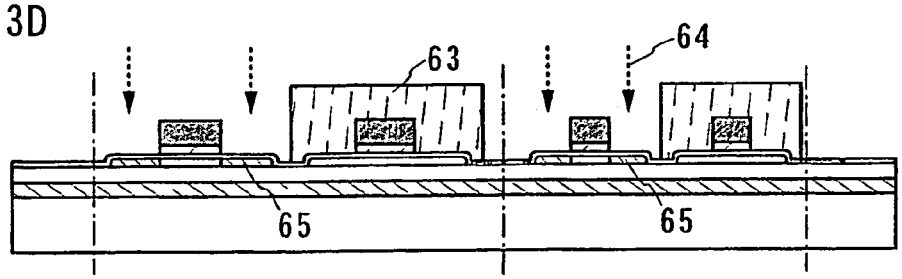
Figure 13E:
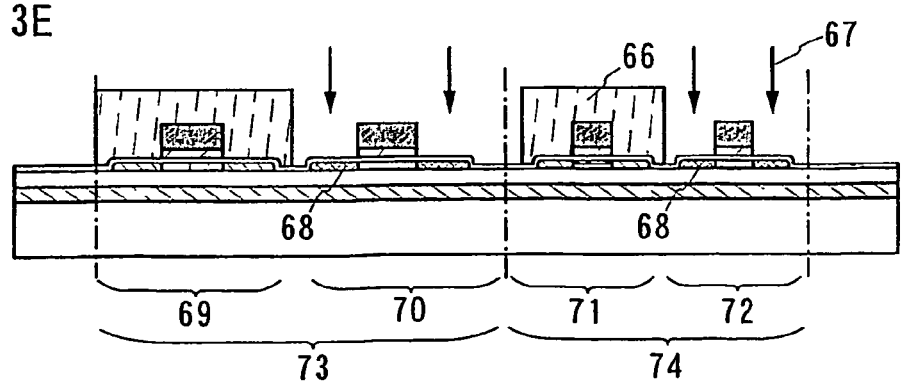

Next, portions corresponding to p-type TFTs 70 and 72 are covered with the resist 63 and impurity element 64 (typically P (phosphor) or As (arsenic)) is doped at a low concentration to the island-shaped semiconductor films of n-type TFTs 69 and 71 (a first doping step, see FIG. 13D). The first doping step is performed with a dosage of $1\times10^{13}$ to $6\times10^{13}/cm^2$ and an acceleration voltage of 50 to 70 keV, however, the invention is not limited to these. This first doping step is performed through the gate insulating film 58, thereby a pair of low concentration impurity regions 65 are formed. Note that the first doping step may be performed over the entire surface without covering the p-type TFTs with the resist.

Next, after removing the resist 63 by ashing and the like, a resist 66 to cover the n-type TFTs 69, 71 region is formed. Then, impurity elements 67 which impart p-type conductivity (typically B (boron)) are doped at a high concentration to the island-shaped semiconductor films of the p-type TFTs 70 and 72 (a second doping step, FIG. 13E). The second doping step is performed with a dosage of $1\times10^{16}$ to $3\times10^{16}/cm^2$ and an acceleration voltage of 20 to 40 keV The second doping step is performed through the gate insulating film 58, thereby a pair of p-type high concentration impurity regions 68 are formed.

Figure 14A:
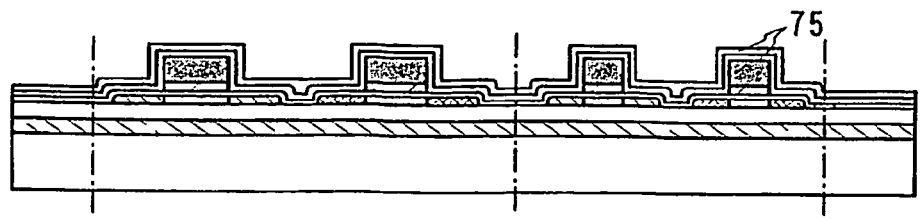
FIGS. 14A to 14D are diagrams showing manufacturing steps of a CPU and a memory in the thin film integrated circuit device used in the invention.
Figure 14B:
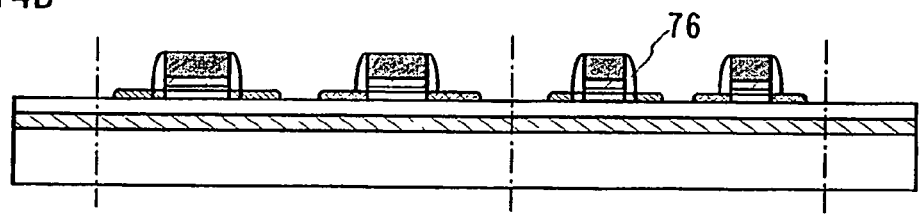

Next, after removing the resist 66 by ashing and the like, an insulating film 75 is formed on the surface of the substrate (see FIG. 14A). Here, a SiON (silicon oxynitride) film in a thickness of 100 nm and an LTO film (Low Temperature Oxide film) in a thickness of 200 nm are stacked to form a two-layer structure. Here, the SiON film is formed by plasma CVD while the LTO film is formed by forming an $SiO_2$ film by low pressure CVD. After that, a side of the substrate where the TFTs are formed is covered with a resist and an insulating film formed on a back surface of the substrate is removed by etching (backside treatment).

Next, the resist and the insulating film 75 are removed by etching using an etch back method with the resist formed on the TFT side of the substrate remaining. Thereby, a side wall 76 is formed in a self-aligned manner (see FIG. 14B). For an etching gas, a mixture gas of $CHF_3$ and He is used. Note that a step of forming the side wall is not limited to these.

Figure 14C:
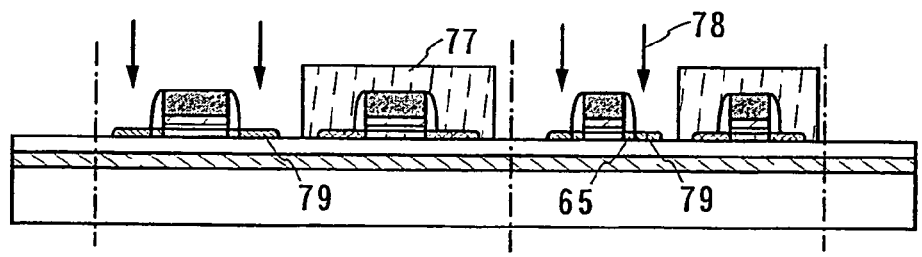

Next, a resist 77 for covering the p-type TFT region is formed, thereby impurity elements 78 which impart n-type conductivity (typically P or As) are doped at a high concentration with the gate electrode 56 and the side wall 76 as masks (a third doping step, FIG. 14C). The third doping step is performed with a dosage of $1\times10^{13}$ to $5\times10^{15}/cm^2$ and an acceleration voltage of 60 to 100 keV. The third doping step is performed through the gate insulating film 58, thereby a pair of n-type high concentration impurity region 79 are formed.

Although not shown, the impurity region may be activated by heat after removing the resist 77 by ashing and the like. For example, after depositing a SiON film in a thickness of 50 nm, heat treatment may be performed at a temperature of 550° C. for four hours in a nitrogen atmosphere. Further, by applying heat treatment at a temperature of 410° C. for one hour in a nitrogen atmosphere after forming a SiNx film containing nitrogen in a thickness of 100 nm, crystal defects of the crystalline semiconductor film can be improved. According to this, for example, a dangling bond in the crystalline silicon is terminated, which is referred to as a hydrogenation process and the like. Moreover, a SiON film in a thickness of 600 nm is formed as a cap insulating film for protecting the TFTs after this. Note that the hydrogenation process may be performed after the SiON film is formed. In this case, the SiNx and SiON film can be continuously deposited in this order. In this manner, three insulating films of SiON, SiNx, and SiON are formed on the TFTs in this order, of which structure and material are not limited to these. Further, these insulating films are preferably formed also for protecting the TFTs.

Figure 14D:
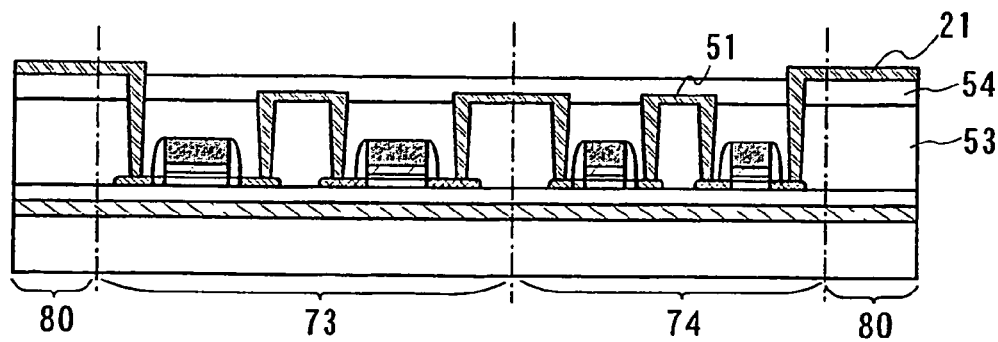

Next, the interlayer film 53 is formed over the TFT (see FIG. 14D). For the interlayer film 53, heat resistant organic resin such as polyimide, acryl, polyamide, or siloxane can be used. For a forming method, spin coating, dipping, spraying, droplet discharging method, doctor knife, roll coating, curtain coating, knife coating and the like can be used according to the material. Further, an inorganic material may be used as well such as PSG, BPSG, an alumina film. Note that the interlayer film 53 may be formed by stacking these insulating films.

Next, a contact hole is opened after forming the resist, then a wiring 51 for connecting the TFTs and a connecting wiring 21 for connecting the TFT to an external antenna are formed over the protective film 54 (see FIG. 14D). When the contact hole is opened by etching, a mixture gas of $CHF_3$ and He is used, however, the invention is not limited to this. Moreover, the wiring 51 and the connecting wiring 21 may be formed simultaneously using the same material or different materials. Here, the wiring 51 connected to the TFTs has a five-layer structure of Ti, TiN, Al—Si, Ti, and TiN, which is formed by sputtering and patterning.

By mixing Si in the Al layer, it can be prevented that a hillock generates in baking the resist for patterning the wiring. Also, Cu of about 0.5% may be mixed as well as Si. By sandwiching an Al—Si layer with Ti or TiN, a resistance against a hillock can further be improved. It is preferable to use the aforementioned hard mask formed of SiON and the like in patterning. The material and forming method of the wiring are not limited to these, and the aforementioned material used for the gate electrode may be used as well.

Note that a film containing carbon such as DLC or CN, a silicon nitride film, a silicon nitride oxide film and the like can be used for the protective film by plasma CVD, an atmospheric pressure plasma and the like.

Alternatively, a photosensitive or non-photosensitive organic material such as polyimide, acryl, polyamide, resist, and benzocyclobutene or heat resistant organic resin such as siloxane can be used. A forming method may be spin coating, dipping, spraying, droplet discharging method, doctor knife, roll coating, curtain coating, knife coating and the like according to the material. Alternatively, an SOG film obtained by application method (for example, a SiOx film containing an alkyl group) may be used as well. An inorganic material may also be used, such as silicon oxide, silicon nitride, silicon oxynitride, PSG, BPSG, an alumina film. Note that the aforementioned protective film may be formed by stacking these insulating films.

In this embodiment, only a terminal portion 80 which connects an antenna and the TFT regions which form a CPU 73, a memory 74 and the like are integrally formed, however, this embodiment can be applied to the case where the TFT regions and the antenna are integrally formed. In that case, an antenna is formed over the interlayer film 53 or the protective film 54 and may be covered with another protective film.

For a conductive material of the antenna, Ag, Au, Al, Cu, Zn, Sn, Ni, Cr, Fe, Co, or Ti, or an alloy containing these can be used, however, the invention is not limited to these. Moreover, the wiring and the antenna may be formed of different materials as well. Note that the wiring and the antenna are preferably formed of a metal material which is excellent in malleability and ductility, and more preferably formed thick so as to resist a stress of deformation.

The wiring and the antenna may be formed by sputtering on the entire surface and then patterning using a resist mask, or may be selectively formed from a nozzle using a droplet discharging method. The droplet discharging method here includes an offset printing method, a screen printing method and the like as well as an ink-jetting method. The wiring and the antenna may be formed simultaneously, or one of them may be formed prior to the other and the other may be stacked thereon.

In the case where a product incorporating the thin film integrated circuit device includes a conductive material, the antenna or the wiring may be formed by using a similar conductive material to it. For example, the antenna can be formed in a coin using a material of the coin. In that case, for example, when the thin film integrated circuit device is incorporated in a 10-yen coin, an antenna formed of an alloy of copper, zinc, and tin may be formed.

In this embodiment, a top gate structure is employed, however, a bottom gate structure (an inverted staggered structure) may be employed as well. In a region where a thin film active element such as a TFT does not exist, a base insulating film material, an interlayer insulating material, and a wiring material are mainly provided, which preferably occupy 50% or more of the thin film integrated circuit device, or more preferably 60 to 95% thereof. Accordingly, the IDF chip can easily be bent and a completed ID label and the like can easily be handled. In this case, it is preferable that the island-shaped semiconductor region (island) of the active element including the TFT portion occupy 5 to 50% of the thin film integrated circuit device, or preferably 5 to 15% thereof.

Moreover, an S value (a sub-threshold value) of a TFT formed in this embodiment is 0.35 V/dec or less (preferably 0.07 to 0.25 V/dec) and the mobility is 10 $cm^2$V/sec or more. With a ring oscillator, frequency characteristics of 1 MHz or more, or preferably 10 MHz or more (with a voltage of 3 to 5 V) are obtained. Alternatively, frequency characteristics per gate is 100 kHz or more, or preferably 1 MHz or more (with a voltage of 3 to 5 V) are obtained.

After forming the plurality of TFTs, the protective film, each wiring, and the antenna for an antenna integrated type, on the substrate 60 (these are collectively referred to as the thin film integrated circuit device 13) (see FIG. 15A), a groove 81 is formed in a boundary region of the thin film integrated circuit device 13 by dicing (see FIG. 15B). At this time, a blade dicing method is typically used which uses a dicing apparatus (a dicer). The blade uses a grinding stone embedded with diamond particles for grinding, having a width of about 30 to 50 μm. This blade rotating at a high rate, the thin film integrated circuits are separated. An area required for dicing is referred to as a street, of which width is preferably 80 to 150 μm in consideration of a damage to the elements.

The thin film integrated circuits can be separated by scribing, etching utilizing a mask, and the like as well as dicing. The scribing method includes a diamond scribing method, a laser scribing method and the like. In the case of the laser scribing method being employed, a fundamental wave with an oscillation wavelength of 1064 nm or a second high harmonic wave having an oscillation wavelength of 532 nm and the like from, a laser resonator can be used by using a linear laser capable of pulse oscillation at a power of 200 to 300 W, for example an Nd:YAG laser.

In the case of etching, elements can be separated by forming a mask pattern by exposure and development steps and performing dry etching, wet etching and the like. An atmospheric pressure plasma may be used for the dry etching.

In the case of forming a groove, the depth thereof is formed to the extent that at least a surface of the peeling layer is exposed. It is preferable to appropriately control the aforementioned dicing and the like so that the substrate 60 is not damaged and can be reutilized.

Next, a jig (a support substrate) 83 having a projection 82 is attached to each of the thin film integrated circuit device 13 interposing an adhesive 84 (see FIG. 15C). Here, the jig is provided for fixing the thin film integrated circuit devices temporarily so that they are not separated after removing the peeling layer. It is preferable that the jig has a comb-like structure provided with projections for easily bringing gas or liquid containing halogenated fluoride later, however, a plane jig may be used as well. More preferably, an aperture 85 may be provided for easily bringing the gas or liquid containing halogenated fluoride later.

For the jig, a glass substrate, a quartz substrate, a stainless (SUS) substrate and the like containing silicon oxide which is not damaged by halogenated fluoride can be used, however, any materials can be used as long as it is not damaged by halogenated fluoride.

Here, for the adhesive, a material of which adhesive force (adhesion) is decreased or lost when UV ray is irradiated can be used as well. Here, a tape which is peeled off when UV ray is irradiated, which is manufactured by Nitto Denko Corporation is used. Other than this, the aforementioned adhesive which is capable of peeling and adhering repeatedly may be used as well. For example, an acryl adhesive, a synthetic rubber adhesive, a natural rubber adhesive and the like described in Japanese Patent Laid-Open No. 2001-30403, U.S. Pat. No. 2,992,092, and Japanese Patent Laid-Open No. 06-299127 can be used. It is needless to say that any material may be used as long as the jig can be removed easily.

Figure 21:
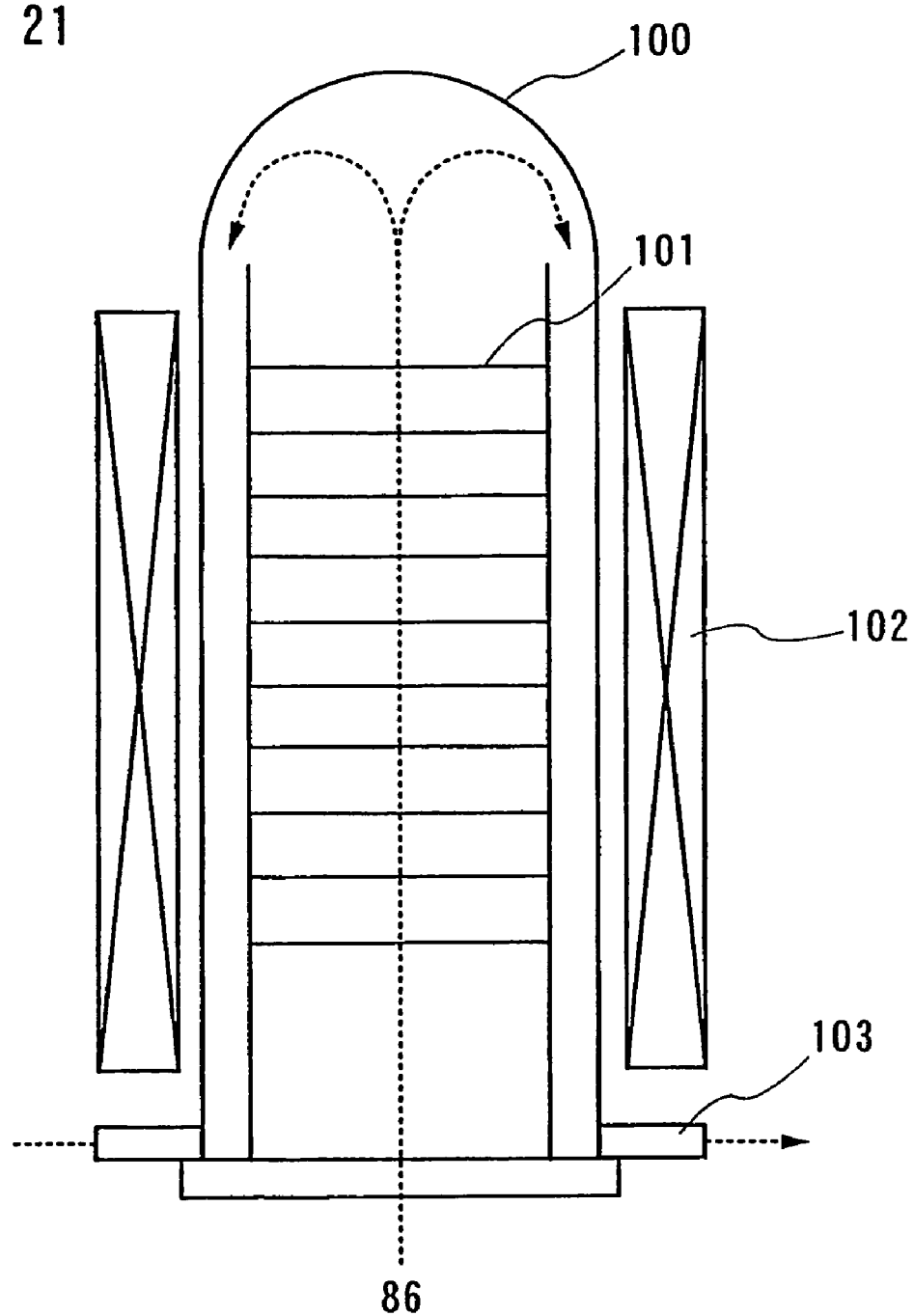
FIG. 21 is a schematic diagram showing a low pressure CVD apparatus.

Next, the a-Si film as a peeling layer is removed by bringing halogenated fluoride gas in the groove 81 (see FIG. 16A). Here, the a-Si film is removed by using a low pressure CVD apparatus as shown in FIG. 21 with a gas of $ClF_3$ (chlorine trifluoride), a temperature of 350° C., a flow rate of 300 sccm, a pressure of 6 Torr, and time of 3 hours, however, the invention is not limited to this condition. Further, a mixture gas of $ClF_3$ and nitrogen may be used as well, of which flow rate may be appropriately set. Note that $BrF_3$, $ClF_2$ and the like may be used as well as $ClF_3$.

Here, in the low pressure CVD apparatus shown in FIG. 21, halogenated fluoride gas such as $ClF_3$ gas 86 is brought in a bell jar 100 as a reactive space, thereby the gas flows over a substrate 101. A heater 102 is provided outside the bell jar 100. The residual gas is exhausted from an exhaust pipe 103.

Here, when using halogenated fluoride such as $ClF_3$, silicon is selectively etched whereas silicon oxide (SiOx), silicon nitride (SiNx), and silicon oxynitride are hardly etched. Therefore, the peeling layer 61 is etched as time passes, thereby the substrate 60 can be peeled off consequently (see FIG. 16B). On the other hand, since silicon oxide, silicon nitride, silicon oxynitride and the like, a protective film as a base film comprising heat resistant resin, an interlayer film, and a protective film are hardly etched, it can be prevented that the thin film integrated circuit is damaged. It is needless to say that the peeled substrate 60 can be reutilized, which leads to a cost reduction.

The material of the peeling layer 61 is not limited to the aforementioned silicon materials as long as it can be removed with halogenated fluoride such as $ClF_3$. Moreover, the materials of the protective film and the interlayer film are not limited to the aforementioned materials as long as it is not damaged by halogenated fluoride such as $ClF_3$.

Next, the adhesive force of the adhesive 84 is decreased or lost by irradiating UV ray. Then, by separating the jig and the thin film integrated circuit device from each other (FIG. 16C), a large quantity of the thin film integrated circuit devices 13 can be obtained. It is preferable to reutilize the jig for reducing cost.

The thin film integrated circuit device 13 manufactured by the aforementioned method is transferred by using the small vacuum pin set 24 shown in FIG. 2 or a minute pin and the like to be adhered on a desired position of the ID label, the ID card and the like.

Moreover, by applying a stress to a substrate on which the plurality of thin film integrated circuits are formed, the substrate may be peeled off physically. In this case, W, $SiO_2$, $WO_3$ and the like can be used for the peeling layer. For applying a stress, a diamond pen and the like are used to apply a shock.

Embodiment 2

In this embodiment, the case of using dry etching for forming the groove 81 in FIG. 15B is described with reference to FIGS. 17A to 17C. FIG. 17A shows a state formed similarly to Embodiment 1 up to the step of FIG. 15A. After that, a resist 87 is formed on the substrate through exposure and development steps, thereby the groove 81 is formed by dry etching with the resist 87 as a mask to separate the elements (see FIG. 17A). Here, plasma etching is employed with an etching gas of chloride gas typified by $Cl_2$, $BCl_3$, $SiCl_4$, $CCl_4$ and the like, fluorine gas typified by $CF_4$, $SF_6$, $NF_3$, $CHF_3$ and the like or $O_2$, however, the invention is not limited to these. The etching can be performed by using an atmospheric pressure plasma as well. At this time, a mixture gas of $CF_4$ and $O_2$ is preferably used for the etching gas. Moreover, the groove 81 may be formed by performing etching using different gases a plurality of times.

Next, the jig 83 is attached to the thin film integrated circuit device through the adhesive 84, the peeling layer is removed by using halogenated fluoride such as $ClF_3$ supplied from the aperture 85, and the substrate 60 is peeled off (see FIG. 17B). A specific method is similar to that of Embodiment 1.

Next, the adhesive force of the adhesive 84 is decreased or lost by irradiating UV ray to separate the jig 83 and the thin film integrated circuit device from each other (FIG. 17C), thereby a large quantity of the thin film integrated circuit devices can be manufactured. The thin film integrated circuit device manufactured by the aforementioned method is transferred by a small vacuum pin set and the like to be mounted on desired product.

Embodiment 3

In this embodiment, description is made on the case where substrate is reutilized when the substrate 60 is damaged by dicing and the like for forming the groove 81.

Figure 18A:
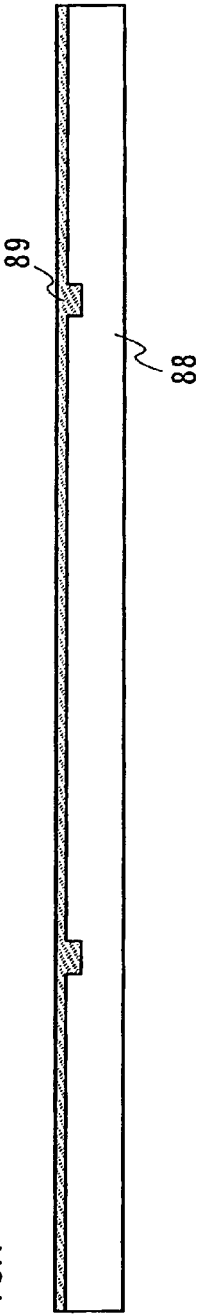
FIGS. 18A to 18C are diagrams showing various substrates to be peeled off.

As a first method, a planarizing film 89 is formed on a used substrate 88 as shown in FIG. 18A. The planarizing film can be formed of heat resistant resin such as polyimide, acryl, polyamide, and siloxane by spin coating, dipping, spraying, droplet discharging method and the like. It is preferable to use heat resistant resin such as siloxane in consideration of a subsequent thermal treatment. Further, an inorganic material may be used as well such as PSG, BPSG, an alumina film and the like. The subsequent steps are similar to other embodiment modes or embodiments.

As a second method, although not shown, a surface of the substrate may be planarized by using a CMP (Chemical Mechanical Polishing) method. This method is efficient in the case where the damage on the used substrate 88 is minute, in particular. The CMP method is performed by supplying polishing solution called slurry in a polishing pad, applying a pressure by rotation of a wafer carrier and a rotating base called a platen, and by polishing by the polishing pad. As the substrate is an insulator such as a glass substrate, slurry mixed with alkaline colloidal silica is mainly used. The subsequent steps are similar to other embodiment modes or embodiments.

Embodiment 4

In this embodiment, the case of using a substrate to be peeled other than a glass substrate and a quartz substrate is described.

Figure 18B:
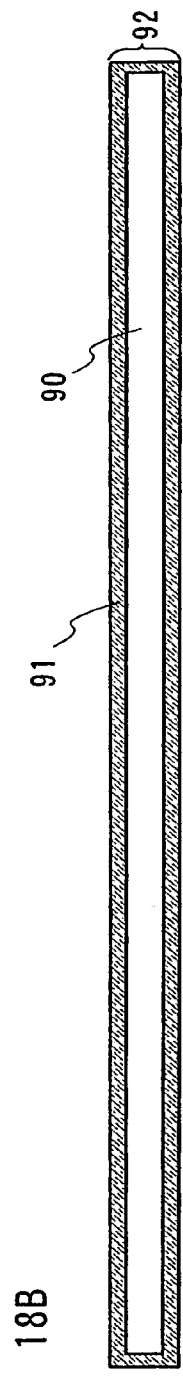

First, a silicon wafer 90 is prepared, to which thermal treatment is applied to form an oxide film 91 (a silicon oxide film) on a surface thereof, thereby a thermal oxide silicon substrate 92 is obtained (FIG. 18B). The thermal treatment is performed, for example, at a temperature of 800 to 1200° C. (preferably about 900° C. or 1150° C.), however, the invention is not limited to this temperature.

Note that the entire periphery of the semiconductor substrate or at least one surface thereof may be oxidized. It is preferable that the entire periphery of the semiconductor substrate is oxidized and silicon oxide is formed so that the semiconductor substrate is not damaged by halogenated fluoride when separating the thin film integrated circuit from the substrate by using halogenated fluoride such as $ClF_3$. Note that a semiconductor which forms the semiconductor substrate is not limited to silicon.

Further, a semiconductor substrate having a nitrided surface or an oxynitraded surface may be used instead of the semiconductor substrate having an oxidized surface. For example, a single crystalline silicon substrate or a thermal oxide silicon substrate of which surface is injected with nitrogen ions can be used. Moreover, a substrate formed of a metal such as a stainless substrate (an SUS substrate) of which surface is formed an insulating film of such as silicon oxide or silicon nitride can be used as well.

After that, a peeling layer, a base protective film, and a TFT are formed on the oxide film 91, the TFT is peeled off by using halogenated fluoride gas and the like. Note that the TFT may be peeled off by removing the silicon wafer 90 by directly forming a TFT on the oxide film 91 without providing the peeling layer and the base protective film.

Figure 18C:
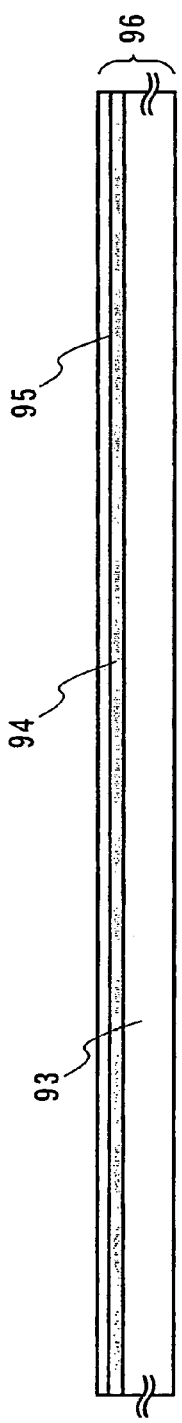

Second, a silicon wafer is prepared to which oxygen ions are doped. Then, thermal treatment is performed at a temperature of 900 to 1200° C. to form an embedded oxide film 94 (see FIG. 18C). This thermal treatment is not limited to this, however, the thermal treatment is required to be controlled in the temperature for improving the crystallinity of a single crystalline silicon (c-Si) layer 95 which is damaged by doping as well as for forming the embedded oxide film. In this manner, an SIMOX substrate 96 comprising a single crystalline silicon substrate 93 (a bottom single crystalline silicon layer), the embedded oxide film 94, and the single crystalline silicon layer 95 (a top single crystalline silicon layer) is obtained.

Note that nitrogen ions may be doped instead of oxygen ions to obtain an SOI substrate. Although not shown, a substrate obtained by adhering a device wafer over which an oxide film is formed (a substrate over which a Si substrate and a device are formed) and a handle wafer (a Si substrate) with the oxide film interposed at a center and polishing (what is called an adhered substrate) may be used as well.

After that, when forming a TFT, the c-Si layer 95 may be used as a semiconductor layer (an active layer) thereof. In the case of peeling the layer using halogenated fluoride gas, a whole or a part of the c-Si substrate 93 is removed. Note that the embedded oxide film 94 functions as a protective film (a base film).

Embodiment 5

In this embodiment, a thin film integrated circuit device and a manufacturing method thereof according to the invention in which the adhesion is not performed using a jig and the like are described with reference to FIGS. 19A to 20. First, the state up to the step of FIG. 15B is formed similarly to the aforementioned embodiments.

Next, a plurality of the substrates 60 on which the thin film integrated circuit devices 13 are formed are installed and fixed in an oven (a bell jar, see FIG. 21) of a low pressure CVD apparatus provided with a tray 97 with their faces down. The substrates and the tray 97 may be installed at the same time. The same applies to the case where the low pressure CVD is not used. When the peeling layer is etched by supplying halogenated fluoride such as $ClF_3$ gas 86 to the groove 81, the thin film integrated circuit devices which are separated fall on the tray 97 (see FIG. 19A). However, the substrate on which the thin film integrated circuit devices are formed is required to be fixed with a frame and the like provided in the oven so that it does not fall.

It is preferable that a distance between the tray 97 and the thin film integrated circuit device 13 be 0.5 to 1 mm so that the separated thin film integrated circuit devices are not scattered and that halogenated fluoride such as $ClF_3$ gas 86 is easily supplied. Moreover, it is preferable to form projections on the tray 97 according to the size of the thin film integrated circuit device as shown in FIG. 19A in order to prevent that the separated thin film integrated circuit devices are scattered.

Being separated, the thin film integrated circuit devices on the tray 97 are transferred by using a minute pin 98 or a small vacuum pin set and mounted on desired product (see FIG. 19B).

Figure 20:
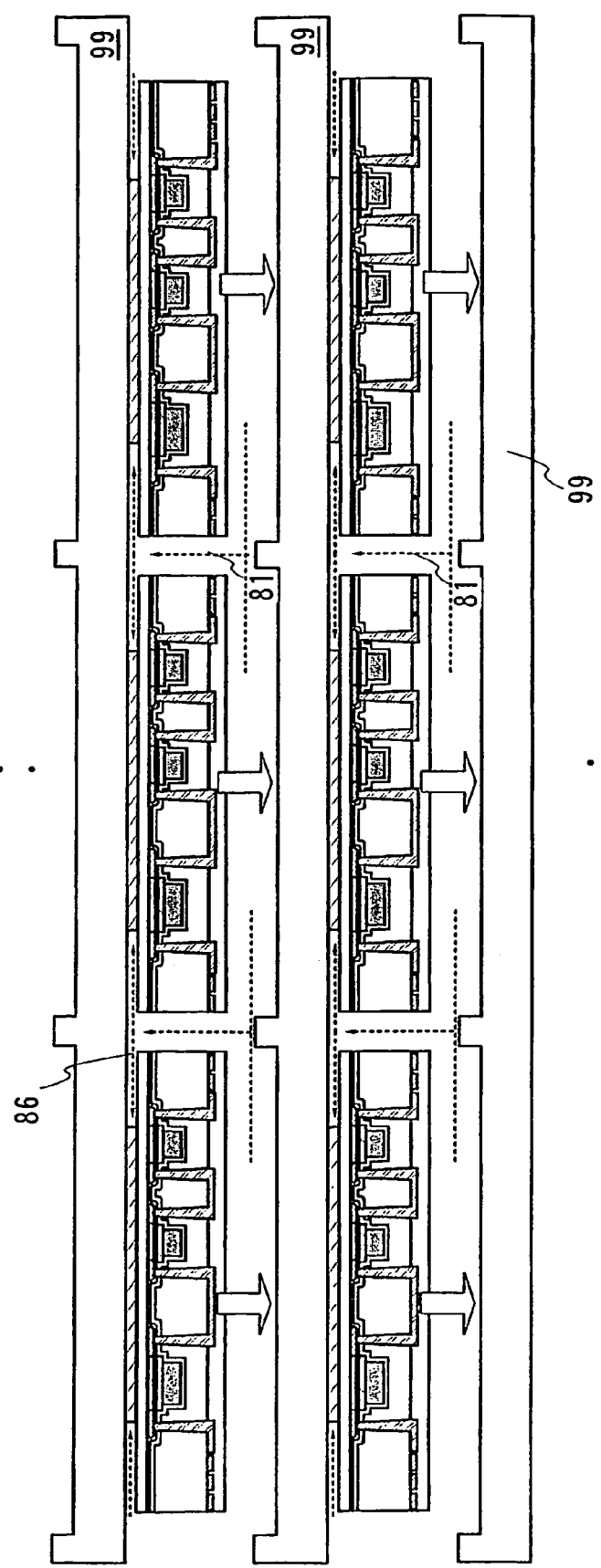
FIG. 20 is a diagram showing a peeling method of the thin film integrated circuit device (using a substrate as a tray).

FIG. 20 shows a method using a substrate 99 which also functions as the tray, as a substrate formed before the thin film integrated circuit devices are separated. For example, a plurality of the substrates 101 are installed and fixed in the oven (the bell jar 100) of the low pressure CVD apparatus (see FIG. 21). The same applies to the case where the low pressure CVD method is not used. When the peeling layer is etched using halogenated fluoride such as $ClF_3$ gas 86, the thin film integrated circuit devices installed above fall to the back surface of the substrate beneath (projections are preferably formed thereon).

The tray 97 and the substrate 99 as the tray may be various substrates such as an SOI substrate such as a thermal oxide silicon substrate and an SIMOX substrate, a glass substrate, a quartz substrate, an SUS substrate, an alumina substrate, a heat resistant flexible substrate (a plastic substrate and the like). It is preferable that resistance against halogenated fluoride and heat be included.

By using the aforementioned method, the thin film integrated circuit devices can be manufactured in a large quantity without using a jig. This embodiment can be freely implemented in combination with other embodiment modes and embodiments.

Embodiment 6

In this embodiment, a method for separately forming an antenna formed on a flexible substrate and a thin film integrated circuit device and connecting them later is described with reference to FIGS. 22A and 23D.

Figure 22A:
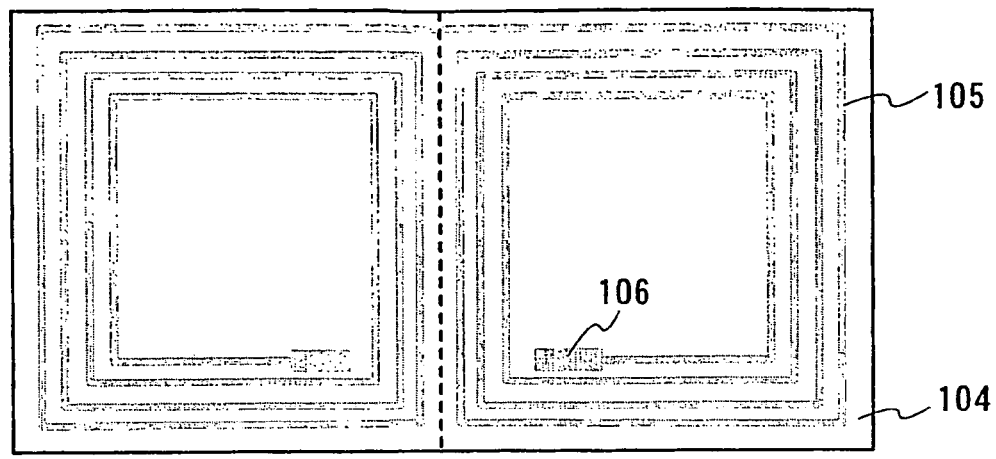
FIGS. 22A to 22C are diagrams showing the case of folding an antenna substrate.
Figure 22B:
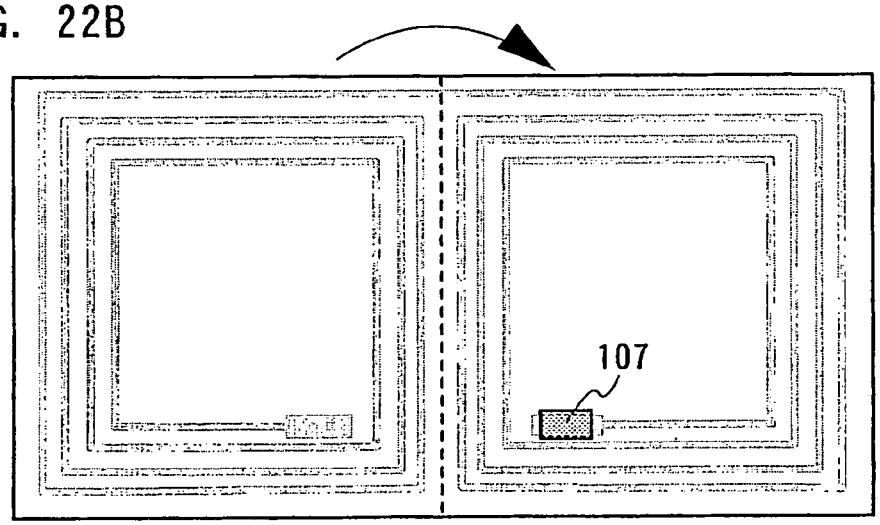
Figure 22C:
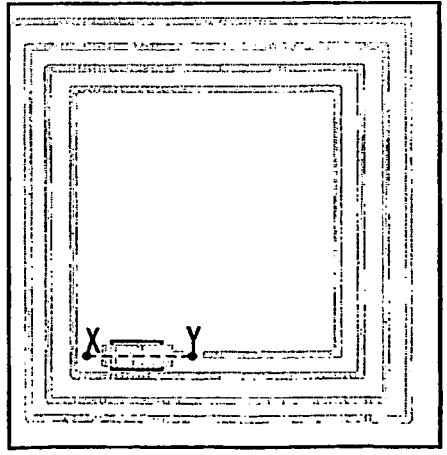

FIGS. 22A to 22C show a manufacturing method of an ID label, an ID card or the like by forming an antenna 105 over a flexible substrate 104 which can be folded, connecting an IDF chip 107 which is separately formed to the antenna 105, and folding the flexible substrate 104 for sealing. Here, the antenna 105 may be formed by patterning after forming by sputtering and the like, or may be formed by selectively discharging a composition containing a conductive material using a droplet discharging method, and drying and baking the discharged composition. Note that the antenna may be planarized by a CMP method, a pressing method and the like after the formation.

A connecting pad 106 which connects the antenna and an integrated circuit may be formed on the antenna. The connecting pad 106 may be formed on a side of the thin film integrated circuit device. Note that the integrated circuit and the antenna can be connected by an anisotropic conductive film, a known bonding method and the like. Further, the shape of the antenna is not limited to the shape shown in FIGS. 22A to 22C as long as it is symmetrical when folded in the case of an electromagnetic type. It is needless to say that other communication methods such as an electromagnetic coupling type, a microwave type, and an optical communication type may be appropriately used.

Figure 23A:
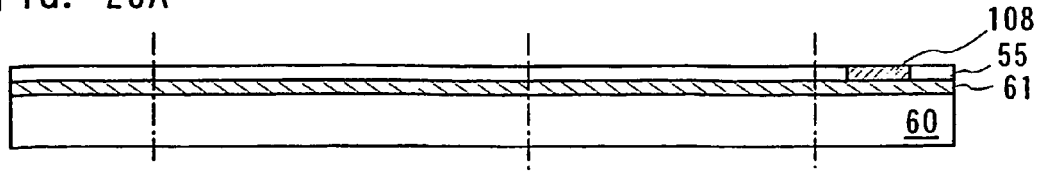
FIGS. 23A to 23D are diagrams showing manufacturing steps of the thin film integrated device in the case of folding the antenna substrate.
Figure 23B:
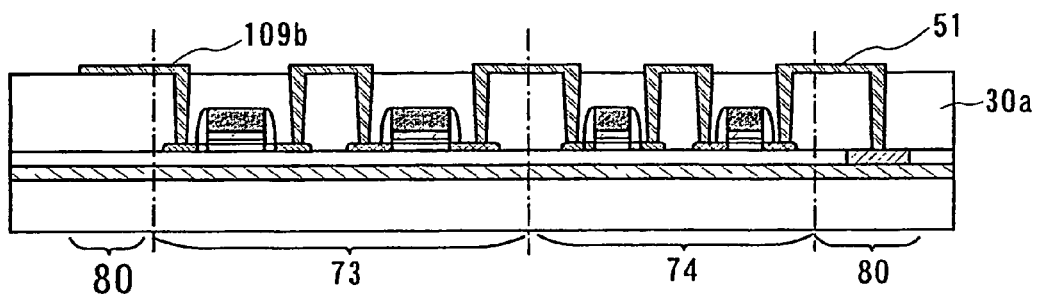
Figure 23C:
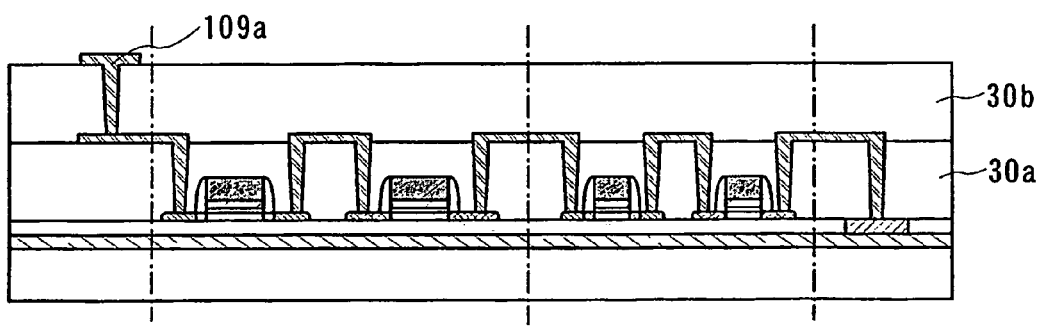
Figure 23D:
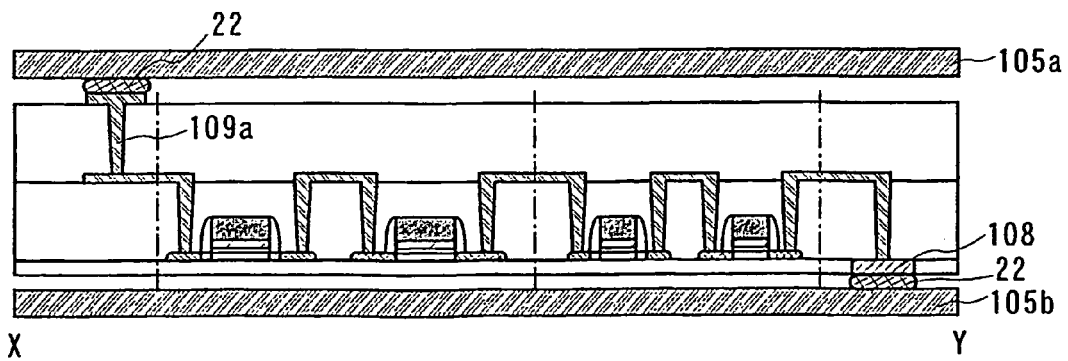

FIG. 23D is a sectional view showing the folded antenna substrate along X-Y in FIG. 22C. Here, a connecting method of the folded antenna substrate and the thin film integrated circuit device is described with reference to FIGS. 23A to 23D.

First, the peeling layer 61 is formed over the substrate 60, then the protective film 55 is formed. At this time, a connecting terminal 108 connected to a bottom antenna 105b after the antenna substrate is folded is formed (see FIG. 23A). Here, after the connecting terminal 108 is formed by patterning a conductive film, the protective film may be formed and planarizing treatment may be performed. Alternatively, by selectively forming the protective film leaving a portion corresponding to the connecting terminal, a conductive material may be discharged by a droplet discharging method and the like to fill the left portion to form the connecting terminal.

Next, after forming TFTs which form a CPU 73, a memory 74 and the like according to the aforementioned embodiment, a first interlayer film 30a is formed, a contact hole is opened, and a top connecting wiring 109a for connecting to a top antenna 105a, and the wiring 51 and a bottom connecting wiring 109b which are connected to the top antenna 105a (the connecting terminal 108) respectively are formed (see FIG. 23B).

Next, after forming the second interlayer film 30b, a contact hole is opened and a top connecting wiring 109a for connecting to the top antenna 105a is formed (see FIG. 23C).

Next, an IDF chip on which various wirings are formed is adhered on the connecting pad 106 of the flexible substrate 104 on which the antenna is formed (see FIGS. 22A to 22C). At this time, the methods shown in FIGS. 2 to 3B can be used. Here, the connecting terminal 108 and the connecting pad 106 of the bottom antenna 105b are connected through the anisotropic conductive film (ACF) 22 (FIG. 23D). A known bonding method, an ultrasonic adhesion, an UV adhesion and the like can be used as well as the ACF.

Next, the flexible substrate 104 is folded and a connecting pad of the top antenna and the top connecting wiring 109a are connected through the ACF 22 similarly (see FIG. 23D). Note that a space between the antenna and the thin film integrated circuit device is preferably molded with epoxy resin and the like.

As described in this embodiment, by employing a structure that the top and the bottom of the thin film integrated circuit device are connected to the antenna when the antenna is folded, the antenna can be formed on the top and bottom of the thin film integrated circuit device. Accordingly, a reception area is increased and precision of the reception can be improved as well. This embodiment can be freely implemented in combination with other embodiment modes and embodiments.

Embodiment 7

Described in this embodiment (FIGS. 24A to 24C) is a method in which after the thin film integrated circuit devices are separated by halogenated fluoride gas, the thin film integrated circuit devices are adhered on a product such as an ID card directly without removing the jig 83 adhered on an IDF chip.

First, similarly to the aforementioned embodiment, a plurality of the IDF chips 110 are formed and the jig 83 is attached through the adhesive 84. The jig 83 has the projection 82 as shown in FIG. 17B. For the adhesive 84 here, a material of which adhesive force is decreased or lost when UV ray is irradiated is used. Moreover, the protective film 54 formed of an organic material or an inorganic material is provided for preventing a damage on the elements. Then, the elements are separated by etching using halogenated fluoride such as $ClF_3$.

Figure 24A:
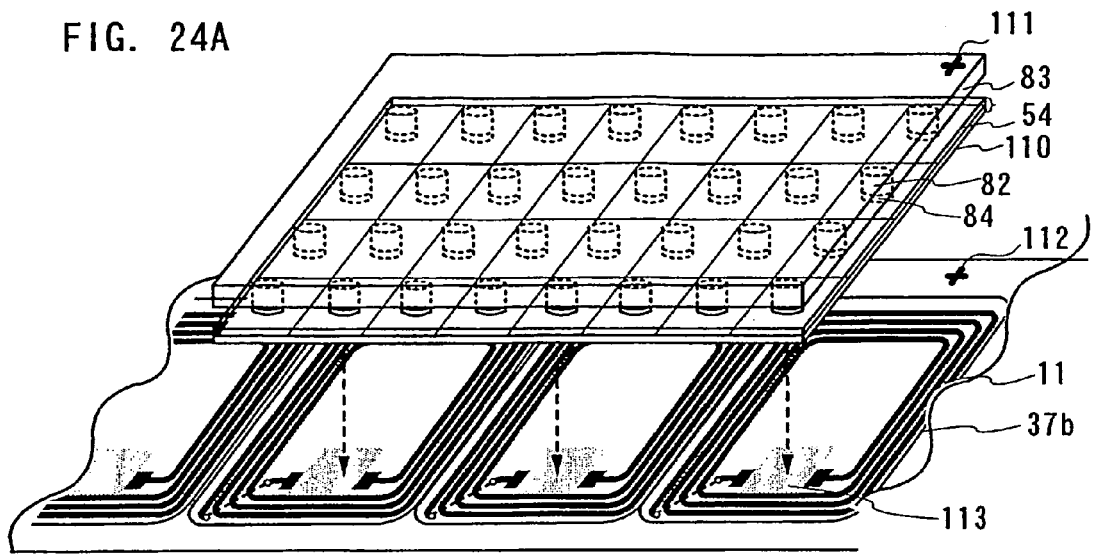
FIGS. 24A to 24C are diagrams showing a method for adhering an IDF chip on a substratum of a product (selective UV ray irradiation).

Next, the IDF chips 110 are transferred with the jig 83 attached on the elements so as to be brought in alignment with a stage on which a product such as an ID card is provided. At this time, as shown in FIG. 24A, the jig and alignment markers 111 and 112 provided on the stage can be used as well as a marker directly formed on the product which is not shown here. In a portion where the thin film integrated circuit device is formed in the product (here, the bottom card substratum 37b), an adhesive 113 is formed in advance, thereby a desired element is adhered on a desired position of the product by controlling the position of the jig (see FIG. 24A).

Figure 24B:
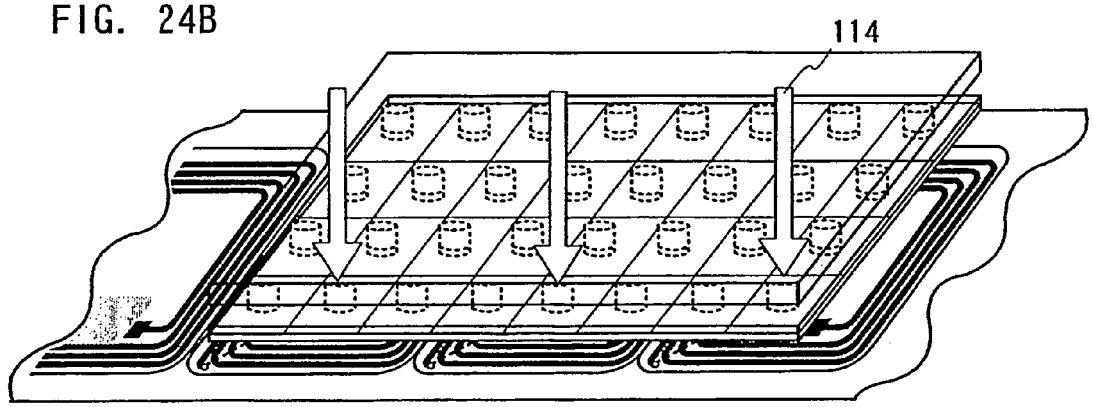
Figure 24C:
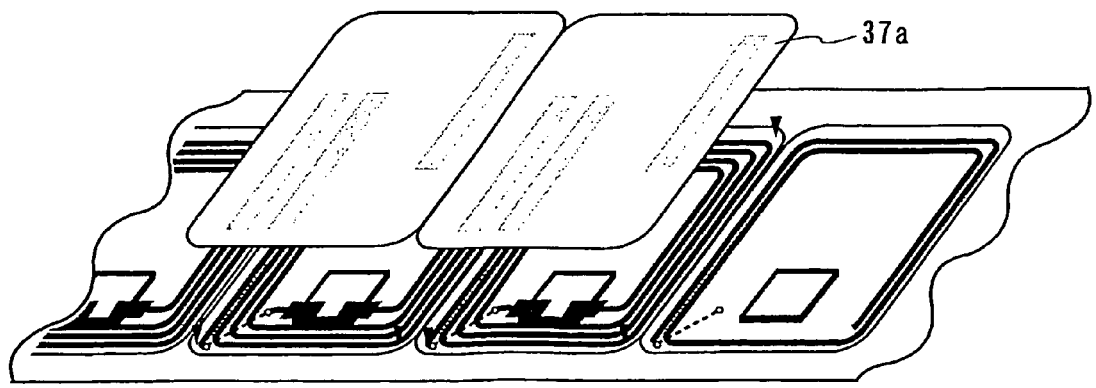

Next, an element to be adhered on the bottom card substratum 37b is selectively irradiated with UV ray 114, thereby the adhesive force of the adhesive 84 is decreased or lost to separate the jig and the element (see FIG. 24B). Accordingly, the desired IDF chip 110 can be formed on a desired position of the product. After forming the element, an element portion is covered with a top card substratum 37a (see FIG. 24C). Here, the antenna 11 is provided in the card substratum, however, it may be formed in the element portion as well.

According to the invention described in this embodiment mode, after separating the elements by etching using halogenated fluoride such as $ClF_3$, a desired element can be formed on a desired position without scattering the elements.

Note that this embodiment can be applied to various products including the ID card. Moreover, this embodiment can be freely implemented in combination with other embodiment modes and embodiments.

Embodiment 8

In this embodiment, a structure of a TFT is described in the case of providing an IDF chip to a product such as an ID label which can be folded in one direction.

Figure 26:
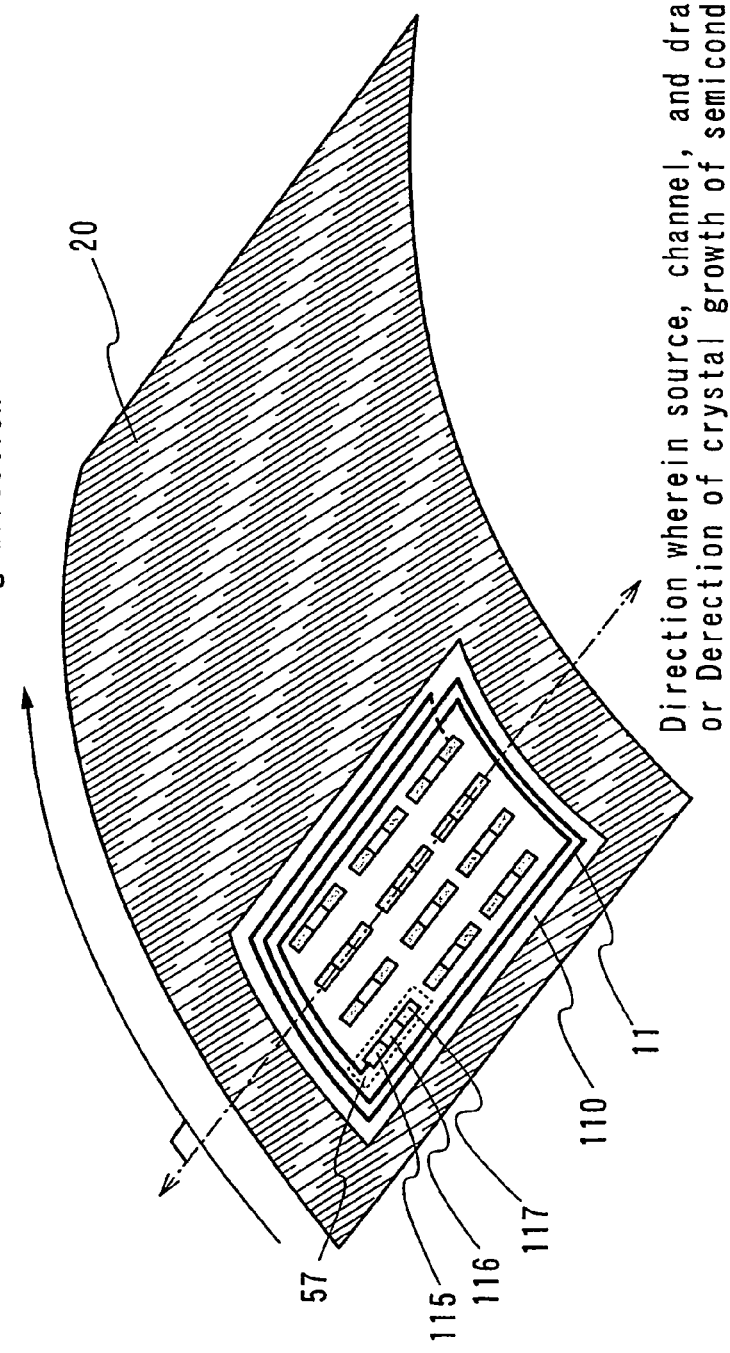
FIG. 26 is a diagram showing a relationship between the forming direction of source, channel, and drain regions and a direction that the substratum of the product is bent.

FIG. 26 is a top plan view of a layer including the island-shaped semiconductor layer 57 of a TFT in the IDF chip 110 formed on an IDF label 20. The island-shaped semiconductor layer 57 includes a source region 115 and a drain region 117 which are added with impurities which impart n-type of p-type conductivity, and a channel region 116 which is not added with the impurities. At least one semiconductor region of the TFTs of the IDF chip is connected to the antenna 11.

Here, by bending the ID label and the like in a direction perpendicular to the direction in which the source (S), the channel (C), and the drain (D) regions are formed or a direction of crystal growth of the semiconductor film, it can be prevented that a crack generates in the island-shaped semiconductor film 57 when the ID label is bent, and a stable operation of the TFTs can be supplied no matter how the ID label is handled.

Embodiment 9

In this embodiment, the case of using high temperature polysilicon (HPS) in the process of Embodiment 1 is described. Typically, a semiconductor process including a crystallizing process which uses a higher temperature than a heat resistant temperature of a glass substrate (about 600° C.) is referred to as the high temperature process.

After forming a semiconductor film, a catalyst such as Ni is added and thermal treatment is applied in an LPCVD oven. Crystal nucleus generate in the semiconductor film at a temperature of about 700° C. or more, thus the crystallization proceeds.

After forming the island-shaped semiconductor film, a gate insulating film is formed by LPCVD. For example, an HTO (High Temperature Oxide) film is formed at a temperature of 900° C. or more by using a mixture gas of silane gas with $N_2$ or $O_2$.

Next, a gate electrode layer is formed by depositing polysilicon (p-Si) containing n-type impurities such as phosphorus in a thickness of 150 nm. Further, a WSi (tungsten silicide) film may be formed in a thickness of 150 nm as well. Sputtering, a CVD method and the like can be appropriately employed for the formation. A doping step after that can be performed similarly to Embodiment 1.

After the doping step, the impurity region is activated by thermal activation at a temperature of 950° C. for 30 minutes. Moreover, BPSG is used for reflow, and planarization is performed by an etch back method using a resist. Then, the plasma damage is recovered by hydrogenation annealing at a temperature of 350° C.

The other steps can be similarly performed to Embodiment 1. In this embodiment, a top gate structure is employed, however, a bottom gate structure (an inverted staggered structure) may be employed as well. Note that this embodiment can be freely implemented in combination with other embodiment modes and embodiments.

Embodiment 10

In this embodiment, the case of using an SAS (semi-amorphous silicon) as the island-shaped semiconductor film 57 in the process of Embodiment 1 is described. An SAS can be formed by glow discharge decomposition of silicon gas. The silicon gas is typically $SiH_4$, and also $Si_2H_6$, $SiH_2Cl_2$, $SiHCl_3$, $SiCl_4$, $SiF_4$ and the like can be used as well. The formation of the SAS can be facilitated by diluting the silicon gas with a single or a plurality of noble gas elements selected from hydrogen, hydrogen and helium, argon, krypton, and neon. The silicon gas is preferably diluted at a dilution rate of 10 to 1000. It is needless to say that the formation of the SAS by glow discharge decomposition is performed under low pressure, but may desirably be performed under a pressure of about 0.1 to 133 Pa. The power frequency for generating the glow discharge is in the range of 1 to 120 MHz, and more preferably, an RF power of 13 to 60 MHz is supplied. The substrate is preferably heated at a temperature of 300° C. or less, and more preferably 100 to 200° C.

The silicon gas may also be mixed with a carbon gas such as $CH_4$ and $C_2H_6$, or a germanium gas such as $GeH_4$ and $GeF_4$ to set the energy bandwidth at 1.5 to 2.4 eV, or 0.9 to 1.1 eV.

When an impurity element for controlling valence electrons is not added to an SAS intentionally, the SAS exhibits a small n-type conductivity. This is because oxygen is easily mixed into a semiconductor film since the glow discharge is performed at a higher power than in the case of forming an amorphous semiconductor. When an impurity element that imparts P-type conductivity is added to a first semiconductor film including a channel forming region of a TFT simultaneously with or after the deposition, a threshold voltage can be controlled. Typically, boron is used for an impurity element that imparts P-type conductivity. An impurity gas such as $B_2H_6$ and $BF_3$ may be mixed into the silicon gas at a rate of 1 to 1000 ppm. For example, in the case of boron being used as an impurity element that imparts p-type conductivity, the concentration of boron is preferably set at $1\times10^{14}$ to $6\times10^{16}$ atoms/cm$^3$. Note that when a channel forming region is formed of such an SAS, a field effect mobility of 1 to 10 cm$^2$/V·sec can be obtained.

When using an SAS, a crystallization step of the semiconductor film (the high temperature thermal treatment step) may be omitted as well, thus a chip can be directly formed on the flexible substrate. In the invention, a TFT is not formed on a silicon wafer as a general rule, however, it is possible to use a silicon wafer as a substrate being peeled which is used before being transferred to the flexible substrate and the like. Note that this embodiment can be freely implemented in combination with other embodiment modes and embodiments.

Embodiment 11

In this embodiment, examples of identification products such as the ID label and the ID card according to the invention, and products having them are described with reference to FIGS. 34A and 35D.

FIG. 34A illustrates an example of a completed ID label of the invention. A plurality of the ID labels 20 each incorporating the IDF chip 110 are formed on a label mounting sheet (a separating sheet) 118. The ID labels 20 are stored in a box 119. The ID label is printed with data about the product and the role thereof (name of product, a brand, a trademark, a trademark right holder, a seller, a manufacturer and the like) whereas the IDF which is incorporated is provided with an ID number for the product (or a kind of the product) so that a forgery, an infringement of intellectual property right such as the trademark right and the patent right, and an illegal act such as an unfair competition can be figured out easily. Moreover, the IDF chip can be inputted with a large amount of data which cannot be printed on a container or a label of the product, such as area of production, selling area, quality, source material, effect, application, amount, shape, price, production method, usage, production time, time for use, expiration date, instruction, intellectual property data regarding the product and the like, thereby a dealer and a consumer can access these data using a simple reader. The IDF chip is formed so that the data can be easily updated and deleted from the manufacturer side whereas it is impossible from the dealer and the consumer side.

Figure 34B:
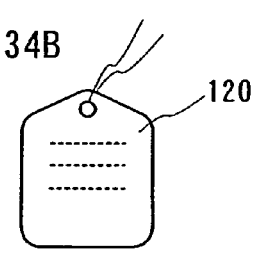

FIG. 34B illustrates an ID tag 120 incorporated with an IDF chip. By providing an ID tag to a product, product management can be facilitated. For example, when a product is stolen, a route thereof can be tracked and the criminal can be rapidly detected. In this manner, by providing an ID tag, a product which is superior in what is called a traceability can be circulated.

Figure 34C:
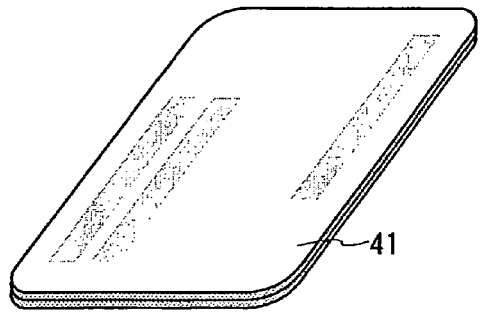

FIG. 34C illustrates an example of a completed ID card 41 according to the invention. The ID card includes various cards such as a cash card, a credit card, a prepaid card, an electronic railway ticket, electronic money, a telephone card, and a membership card.

Figure 34D:
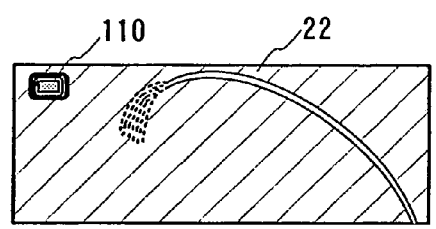

FIG. 34D illustrates an example of a completed coupon bond 122 according to the invention. The IDF chip 110 is adhered on the coupon bond 122. The coupon bond includes a postage stamp, a railway ticket, a ticket, an admission ticket, a gift token, a book coupon, a stationery coupon, a beer coupon, various gift certificates, various service coupons and the like, although the invention is not limited to these, needless to say.

Figure 34E:
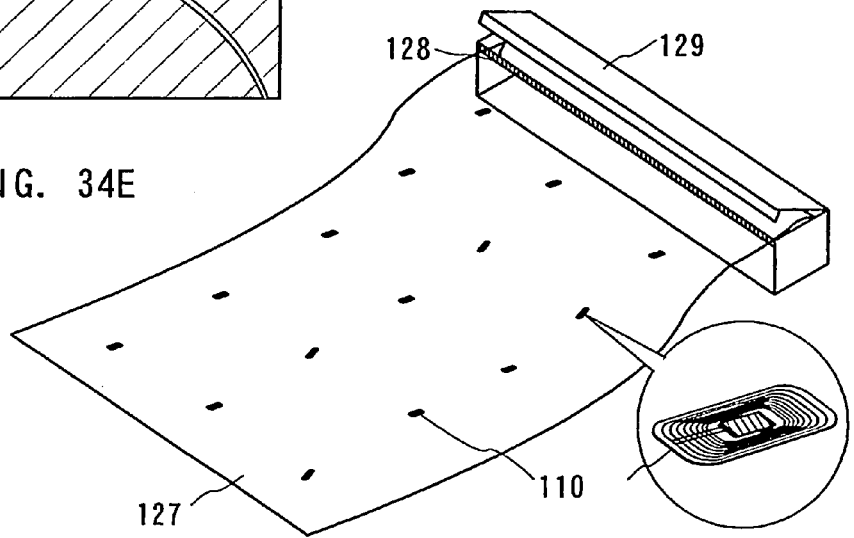

FIG. 34E illustrates a wrapping film 127 incorporated with the IDF chips 110 for wrapping product. The wrapping film 127 can be formed, for example, by scattering the IDF chips arbitrarily on a bottom layer film and covering it with a top layer film. The wrapping film 127 is stored in a box 129 and can be used by separating with a cutter 128 as required. Note that the material for the wrapping film 127 is not particularly limited. For example, thin film resin, aluminum foil, paper and the like can be used.

Figure 35A:
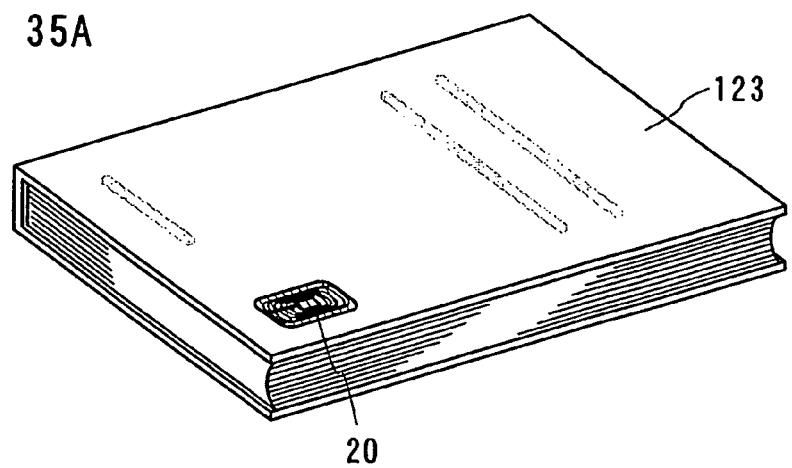
FIGS. 35A to 35D are views illustrating examples of products attached with the ID label or the like of the invention.
Figure 35B:
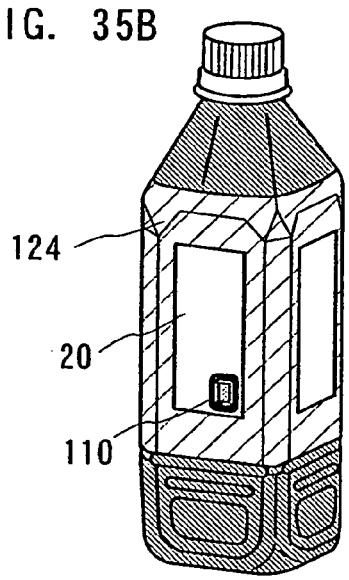

FIGS. 35A and 35B show a book 123 and a plastic bottle 124 on which the ID labels 20 according to the invention are adhered, respectively. The ID label 20 incorporates the IDF chip 110. Since the IDF chip used for the invention is quite thin, the function and design thereof are not spoiled when a thin film integrated circuit is mounted on an object such as the book. In the case of a non-contact thin film integrated circuit device, the antenna and the chip can be integrally formed and can be directly transferred on a curved surface of product.

Figure 35C:
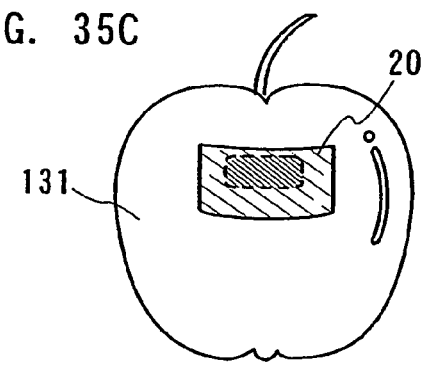
Figure 35D:
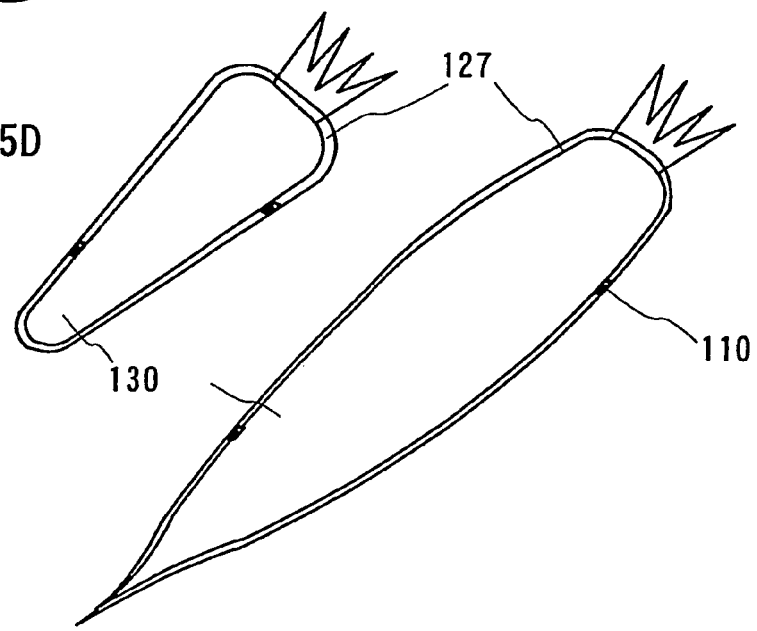

FIG. 35C illustrates a fresh food such as a fruit 131 on which the ID label 20 is directly adhered. FIG. 35D illustrates fresh foods such as vegetables 130 wrapped with the wrapping film 127 for wrapping product incorporated with the IDF chip 110. The ID label may be peeled off when the ID label is adhered on a product, whereas the wrapping film is not easily peeled when a product is wrapped with the wrapping film, therefore, it is advantageous in the respect of security.

The IDF chip of the invention can be applied to various products other than the aforementioned ones.

Embodiment 12

In this embodiment, a method for reading the data on the product on which the ID label, ID tag or the like of the invention is mounted is described with reference to FIGS. 30A to 30C.

Figure 30A:
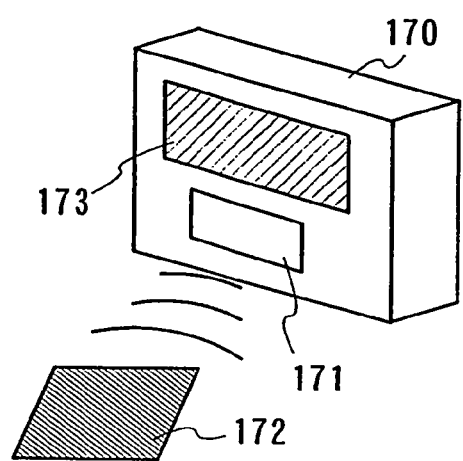
FIGS. 30A to 30C are views illustrating examples of a reader/writer.

A product 172 on which the ID label or the ID tag is mounted is exposed to a sensor portion 171 of a main body 170 of a reader/writer as shown in FIG. 30A. A display portion 173 displays the source material, the place of origin, the result of the test in each production (manufacturing) step, a history of the circulation and the like as well as data on the product such as the instruction thereof. It is needless to say that the display portion may be provided separately and is not necessarily provided for the reader/writer. Such a reader/writer may be set in shelves where products are displayed.

Figure 30B:
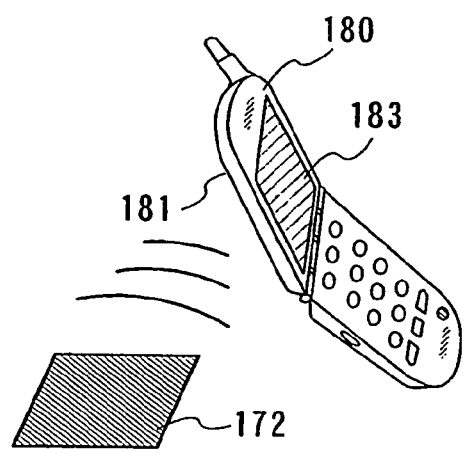

As shown in FIG. 30B, by incorporating a reading function in a personal portable information terminal, for example a main body 180 of a portable phone, the product 172 on which the ID label or the ID tag is mounted is exposed to a sensor portion 181 provided in a portion of the main body, thereby the data is displayed on a display portion 183. Then, the data on the product are displayed similarly. It is needless to say that the display portion may be provided separately and is not necessarily provided in the reader/writer.

Figure 30C:
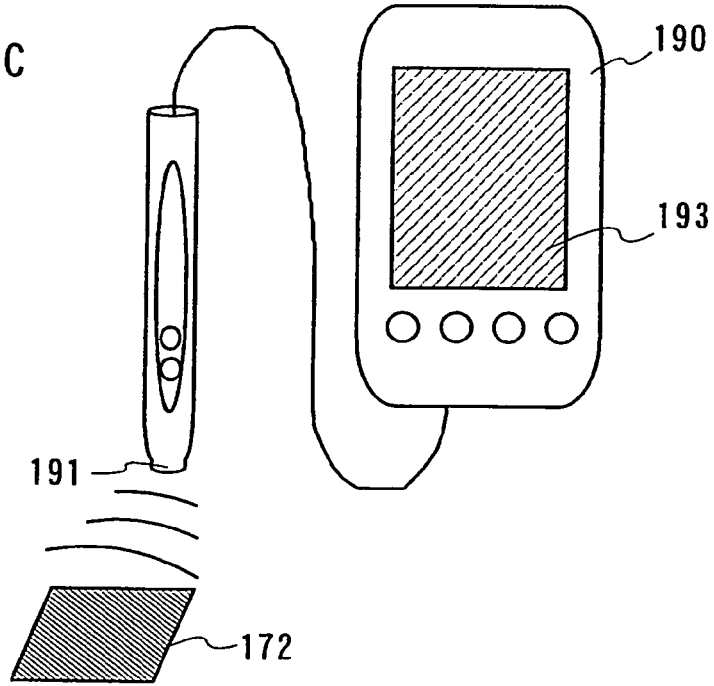

As shown in FIG. 30C, a sensor portion 191 of a main body 190 of a personal portable reader is exposed to the product 172 on which the ID label or the ID tag is mounted, thereby the data are displayed on a display portion 193. Then, the data on the product are displayed similarly. It is needless to say that the display portion may be provided separately and is not necessarily provided for the reader/writer.

In this manner, consumers can know enough about the product freely as compared to the data provided by a conventional wireless tag and the like. It is needless to say that the thin film integrated circuit device facilitates the rapid product management.

In the case where a non-contact integrated circuit device is incorporated in the product according to the invention, they are categorized into a contact type, an approaching type, a vicinity type, and a remote type according to a distance between a reader/writer and the product such as a card, and a frequency. For the contact type, an electromagnetic induction method which requires a distance of 0 to 2 mm for communication and a communication frequency of 4.92 GHz are used. For the approaching type, an electromagnetic induction method which requires a distance of about 10 cm for communication and a communication frequency of 13.56 MHz are used. For the vicinity type, an electromagnetic induction method which requires a distance of about 70 cm for communication and a communication frequency of 13.56 MHz are used. For the remote type, a microwave method which requires a distance of several meters for communication is used.

A non-contact integrated circuit has a feature that a power is supplied by an electromagnetic induction behavior (electromagnetic induction method), a mutual induction behavior (electromagnetic coupling method), or an induction behavior by electrostatic (electrostatic coupling method) of a coil antenna. By controlling the coiling of this antenna, the frequency to be received can be selected. For example, for receiving the high frequency having a short wavelength, the coiling of the antenna can be less.

Compared with a contact IC, the non-contact IC is not damaged, has high durability, and is unlikely to generate an error by electrostatic and the like since the power supply and data communication are performed without contact. Further, the non-contact IC can easily be handled since it is only required to be exposed to a reader/writer which can be formed by a simple structure.

Embodiment 13

Figure 31:
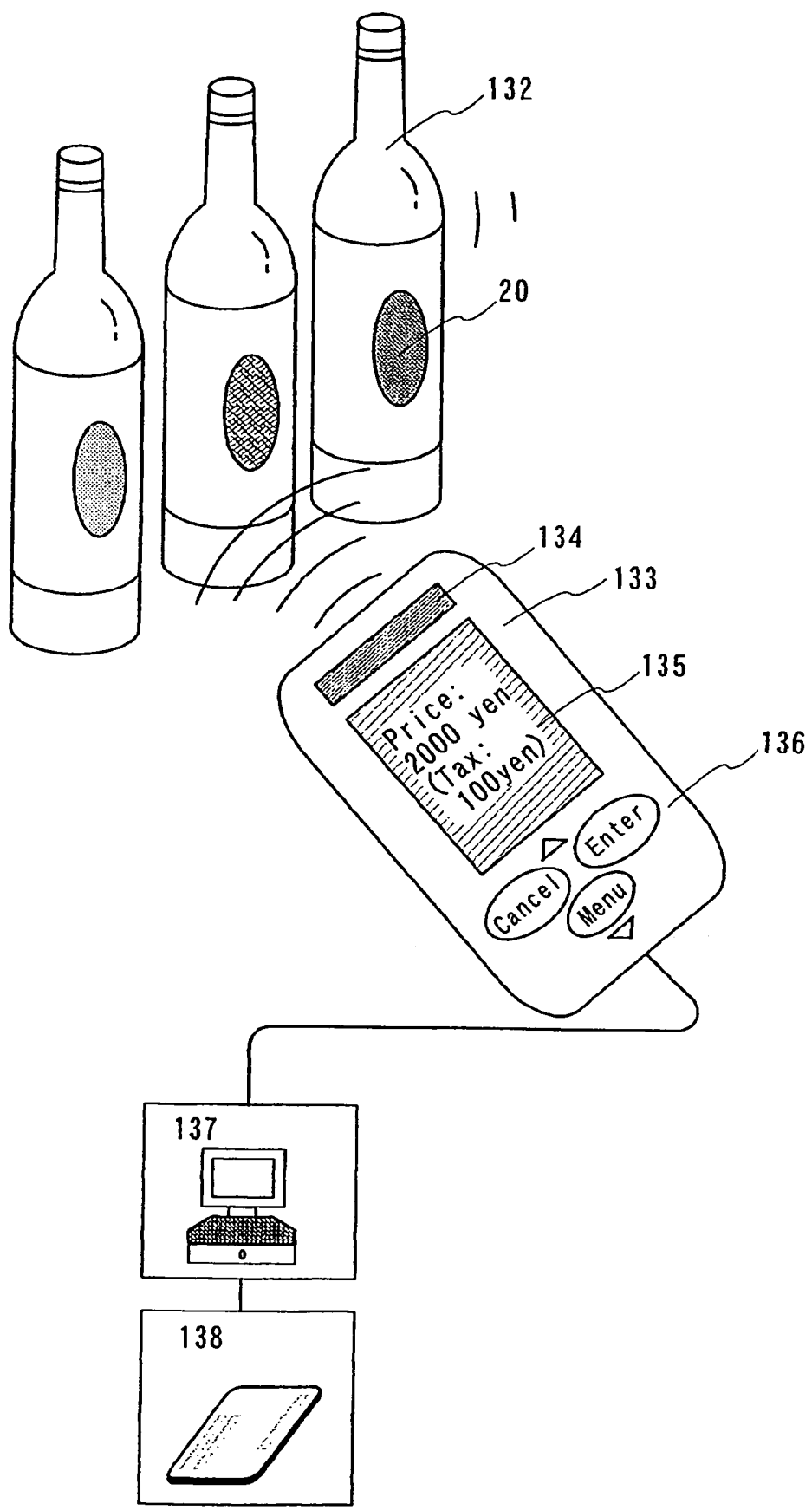
FIG. 31 is a view illustrating an example of a purchase of a product at a store.

In this embodiment, a management method of the product on which the ID label or the ID tag of the invention is mounted, and the circulation thereof are described with reference to FIGS. 31 to 33.

First, the case where a customer purchases a product at a store is described with reference to FIG. 31. A product 132 displayed in the store is attached with the ID label 20 or an ID tag incorporating data on the product, a history of manufacture and the like. The customer exposes a customer R/W 133 prepared in the store or of his own to the product 132 to conduct communication through the antenna portion 134 of the R/W 133, thereby the incorporated data in the ID label or the like can be read.

It is preferable that purchase/not purchase of the product be freely selected by the customer using an operating key 136. The read data is displayed on a display portion 135 provided in the R/W 133. The data includes the price, consumption tax, country of origin, manufacturer, imported country, time of manufacture, expiration date, application (recipe for food) and the like. It is also convenient to display the total price of the purchase.

By connecting the customer R/W 133 to a POS system 137 (Points of Sales System, which is a system that the product is read by an automatic reading device at the point it is sold and directly inputted to a computer for sales management, consumer management, inventory management, purchase management and the like), a conventional operation of reading a bar code at the cash desk is no longer required.

By connecting the R/W 133 or the POS system 137 to a private account 138 such as electronic money so that the cost for purchase or utilization is automatically withdrawn, more efficient shopping is realized without the need of cash and a cash register. Check out of the product can be conducted by using a personal electronic money card for communicating with the R/W on the scene. It is needless to say that the ID card of the invention can be employed for the electronic money card. Moreover, a gate for the product management is preferably provided at an entrance door of the store so that products which are not inputted in the POS system (that is, which are not purchased) can be checked for preventing shoplifting.

Here, the circulation of a product on which the ID label, ED tag or the like of the invention is mounted is briefly described.

Figure 32A:
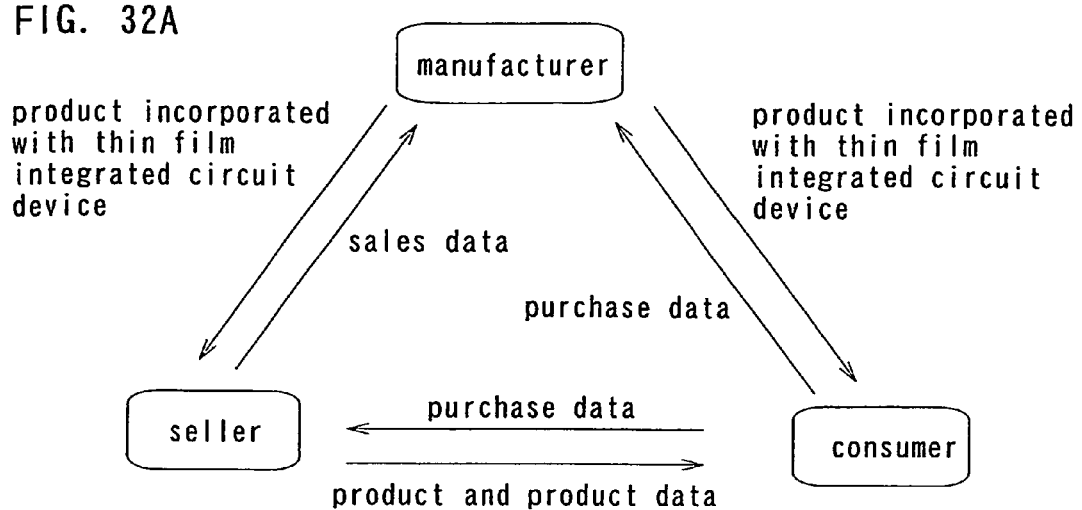
FIGS. 32A and 32B are diagrams each showing a relationship of a manufacturer, a seller, and a consumer.
Figure 33:
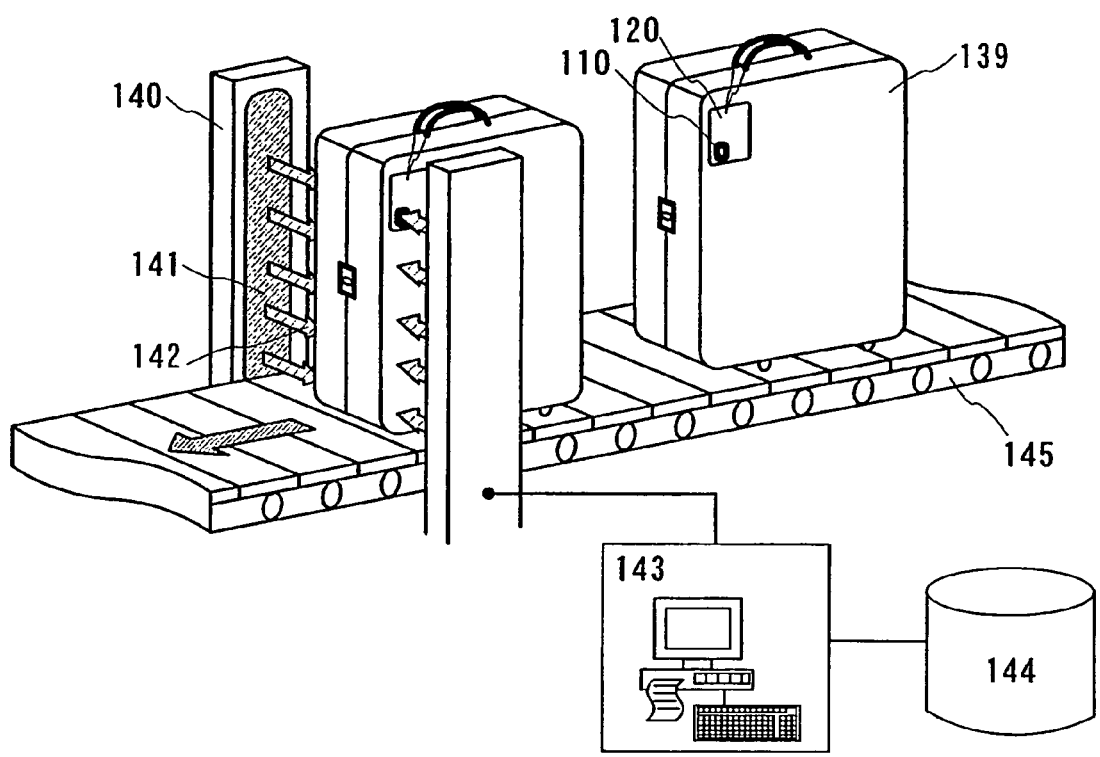
FIG. 33 is a diagram showing a inspecting method of an object attached with an ID tag at the security check.

In FIG. 32A, a manufacturer provides a product incorporated with a thin film integrated circuit device to a seller (a retailer and the like) or a consumer. The seller can provide price data, sales data such as the number of sold products and time of purchase when the consumer checks out the product, for example. On the other hand, the consumer can provide purchase data such as identification data. For example, the purchase data can be provided to the seller and the manufacturer through internet and the like by using a credit card incorporated with a thin film integrated circuit device, a personal reader or the like. The seller can provide the consumer with the product data by using the thin film integrated circuit device while the seller can obtain the purchase data from the consumer. Such sales data, purchase data and the like are very valuable which contribute to the sales strategy in future.

The data read from the thin film integrated circuit device by a reader of a seller and a consumer are disclosed to the manufacturer, the seller, or the consumer through a computer and a network. As described above, various data can be provided through the thin film integrated circuit device to the person who requires it. Accordingly, the ID label and the ID tag of the invention is efficient for trading or management of products.

Figure 32B:
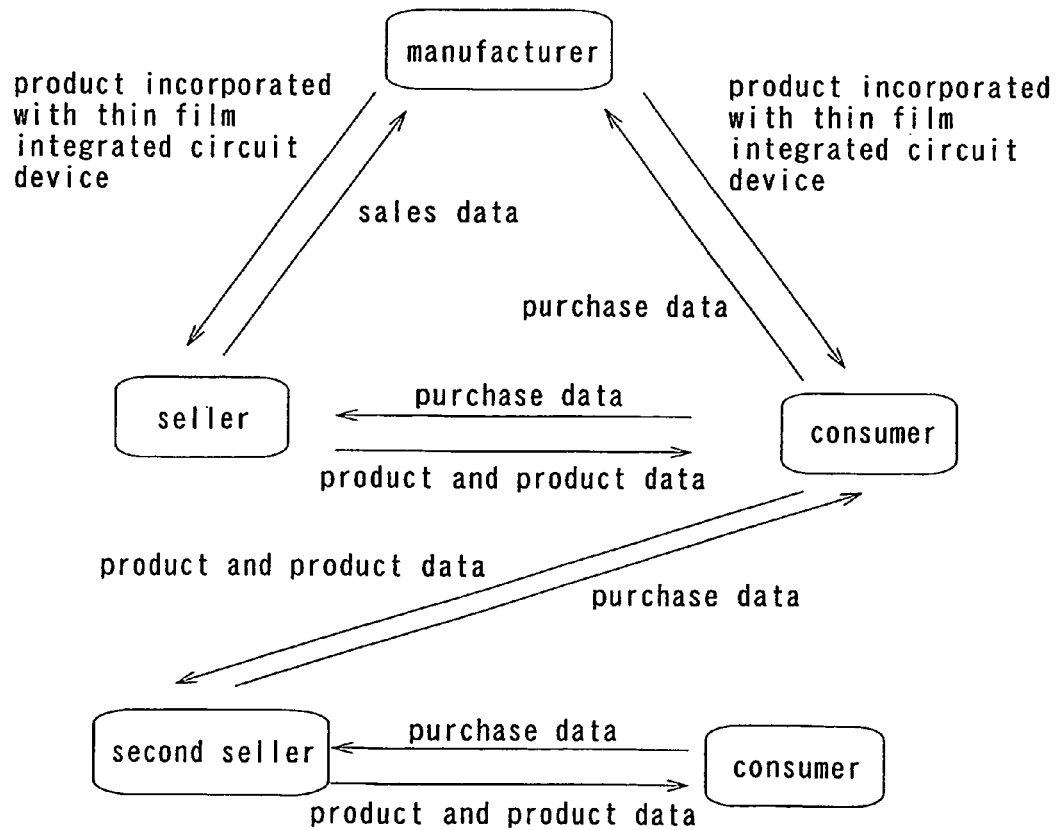

Meanwhile, FIG. 32B shows the case where the product circulates from the consumer to a secondhand seller. Here again, the consumers can provide purchase data such as identification data. For example, the purchase data can be provided to the secondhand seller through internet and the like by using a credit card incorporated with the integrated circuit device, a personal reader or the like. Further, the secondhand seller can provide the product data and obtain the purchase data from the consumers by using the thin film integrated circuit device. Such sales data and purchase data are very valuable which make it possible to know the history and the tenure of use of the secondhand product, which can contribute to the sales strategy such as price setting and customer choice.

Next, the case of security check at the airport is described with reference to FIG. 33. A baggage 139 is provided with the ID tag 120 incorporated with the IDF chip 110. The baggage 139 moves on a conveyer 145 and passes through a reader/writer 140. Radio wave 142 oscillated from an antenna 141 activates the IDF chip 110, thereby data stored in a memory is signalized and returned to the reader/writer 140. Thus, data can be identified by a computer 143.

The computer 143 is connected to a database 144 which stores data only on products which are incorporated with the ID labels, the ID tags, or the IDF chips and legally circulate in the market (hereinafter referred to as valid products). Accordingly, the data on the products in the baggage 139 and the database 144 can be checked. In the case where an object other than the valid products is included in the baggage 139, it is inspected and garnished, abandoned, or disposed as required. In the case where hazardous materials, firearms and swords which are the valid products but forbidden in the aircraft and the like are included, software of the computer is required to be programmed so that the baggage cannot pass through the gate.

It is needless to say that the baggage including an object which causes illegality such as a counterfeit, a copy, a contraband, and a smuggled article cannot pass through the gate. Accordingly, the counterfeits can be interdicted at the border from flowing into or out of the country. Furthermore, the detection of the hazardous materials, firearms and swords leads to prevent terrorism as well.

Embodiment 14

In this embodiment, an example of a communication basis of the ID label, the ID tag, the ID card and the like of the invention is described with reference to FIGS. 27 to 29.

Figure 27:
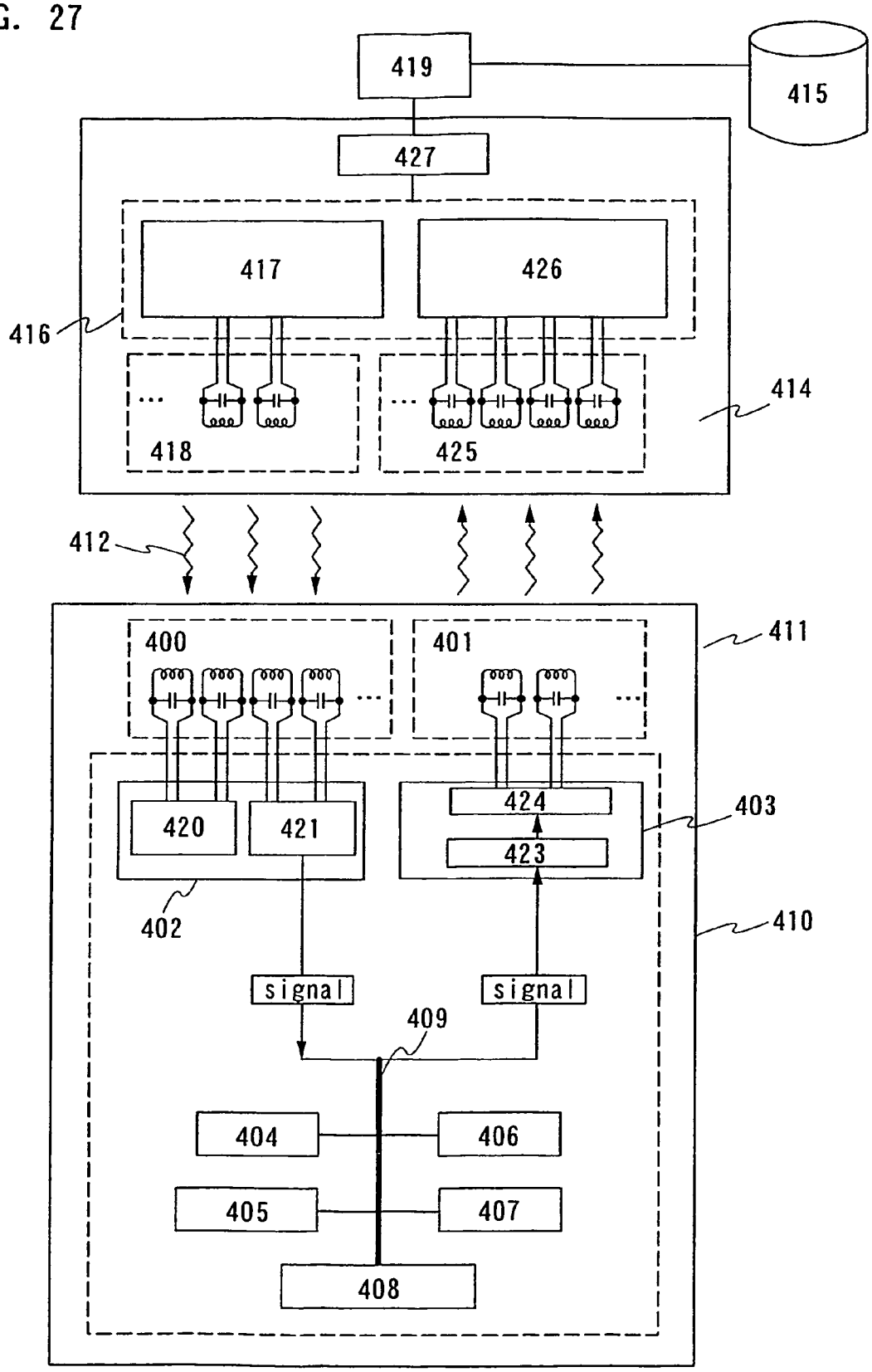
FIG. 27 is a block diagram showing a configuration of the ID label or the ID card of the invention.

FIG. 27 is a block diagram showing a reader/writer 414 and an identification product such as a non-contact IC 411 like an ID label. Reference numeral 400 denotes an input antenna and 401 denotes an output antenna. Reference numeral 402 denotes an input interface and 403 denotes an output interface. The number of each antenna is not limited to the number shown in FIG. 27. Further, the antenna is not necessarily coiled. A radio wave 412 received by the input antenna 400 from an output antenna 418 of the reader/writer 414 is demodulated or commutated by the input interface 402, and supplied to each circuit of a CPU 404, a coprocessor 405, a ROM 406, a RAM 407, a non-volatile memory 408 and the like through a bus 409.

Here, the coprocessor 405 has a role as a side processor which helps the operation of the CPU which mainly controls all processes of a thin film integrated circuit device 410. Typically, the coprocessor 405 functions as a dedicated operating device for decoding process, which can perform a decoding process required for performing an application such as a settlement. Further, for the non-volatile memory 408, an EPROM, an EEPROM, an UV-EPROM, a flash memory, an FRAM and the like are preferably used to which data can be updated a plurality of times.

Note that the aforementioned memories are categorized into a program memory (a region storing a program), a work memory (a region which temporarily stores data in the process of executing a program), and a data memory (a region for storing data on product and fixed data for the program). Typically, the ROM is used as the program memory while the RAM is used for the work memory. The RAM functions as a buffer for communicating with an R/W as well. For storing data inputted as signals to a determined address, the EEPROM is typically used.

Next, the data on product stored in the memory is converted into signals in the aforementioned each circuit and modulated in the output interface 403, thereby sent to the R/W 414 by the output antenna 401. Here, the input interface 402 is inputted with a rectifying circuit 420 and a demodulating circuit 421. An alternating power source voltage inputted from the input antenna 400 is rectified in the rectifying circuit 420 and supplied to the aforementioned each circuit as a direct current power source voltage. The alternating signal inputted from the input antenna 400 is demodulated in the demodulating circuit 421, thereby each of the signals which are shaped in waveforms is supplied to each circuit.

The output interface 403 is provided with a modulating circuit 423 and an amplifier 424. Each signal inputted from each circuit to the output interface 403 is modulated in the modulating circuit 423 and amplified or buffer amplified in the amplifier 424, thereby sent to a terminal device such as the R/W 414 from the output antenna 401. An input antenna 425 of the R/W 414 receives a signal transmitted from the non-contact IC device. The received signals are demodulated in the input interface 426, sent to a computer 419 through a controller 427, and processing of data is performed through or without a database 415, thereby the data on product can be identified.

Note that the computer 419 is provided with software which functions to process the data on product, however, hardware may process this data as well. Consequently, time, labor or mistakes consumed for processing of data are reduced as compared to the conventional operation of reading a barcode one by one, thereby the product management can be facilitated.

Note that each circuit shown in FIG. 27 is only one mode of the invention. Each of the circuit incorporated in the non-contact IC device 411 and the R/W 414 is not limited to these.

FIG. 27 shows an example of using an antenna as a non-contact type, however, the non-contact type is not limited to this and data may be transmitted and received through light by using a light emitting element, an optical sensor and the like.

In FIG. 27, the input interface 402 including an analog circuit such as the rectifying circuit 420, the demodulating circuit 421, and a modulating circuit 423, the output interface 403, the CPU 404, each of the memories and the like are formed of one thin film integrated circuit 410. Moreover, the output interface 417 and the input interface 426 in the R/W 414 are formed of the integrated circuit 416. However, this structure is only an example and the invention is not limited to this. For example, the input interface 402 including an analog circuit such as the rectifying circuit 420, the demodulating circuit 421, and the modulating circuit 423, and the output interface 403 are formed as an IC chip while the CPU 404, each of the memories and the like can be formed of a thin film integrated circuit comprising TFTs.

FIG. 27 shows an example of supplying a power source voltage from the reader/writer as a terminal device, however, the invention is not limited to this. For example, a solar battery may be provided for the non-contact integrated circuit device. Moreover, an ultrathin battery such as a lithium battery may be incorporated as well.

Figure 28:
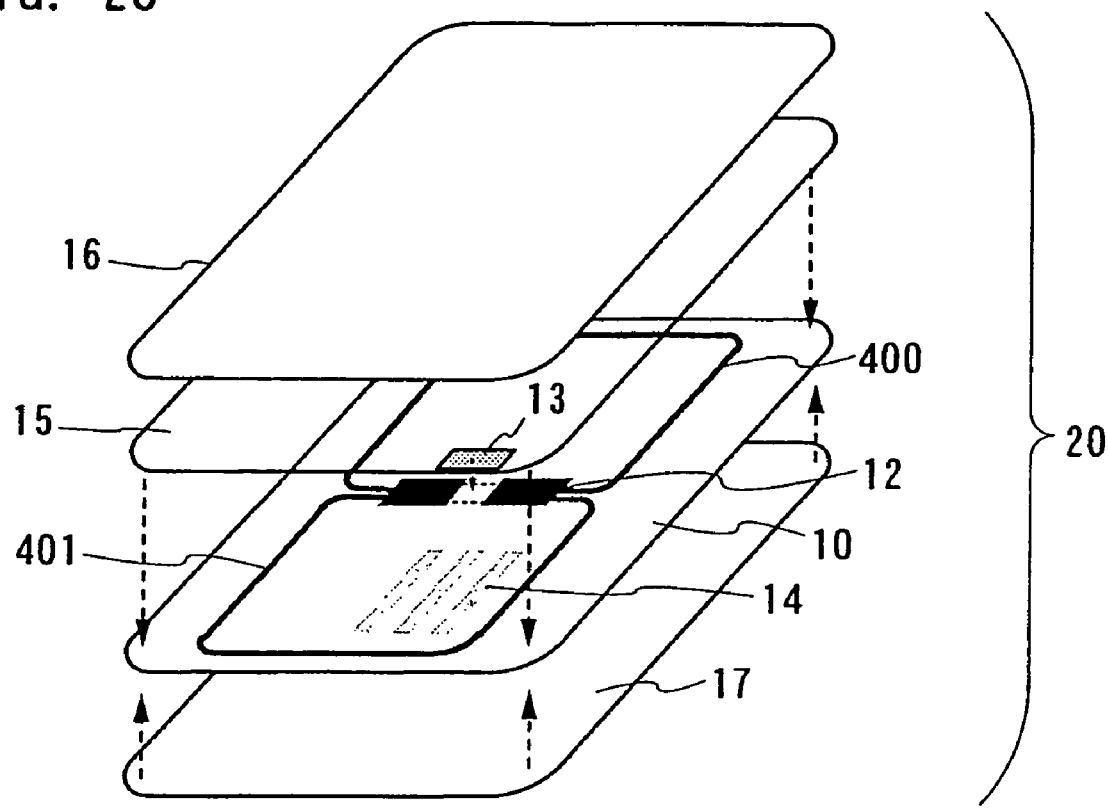
FIG. 28 is a perspective view showing a stacked-layer structure of the ID label of the invention (an input antenna and an output antenna).
Figure 29:
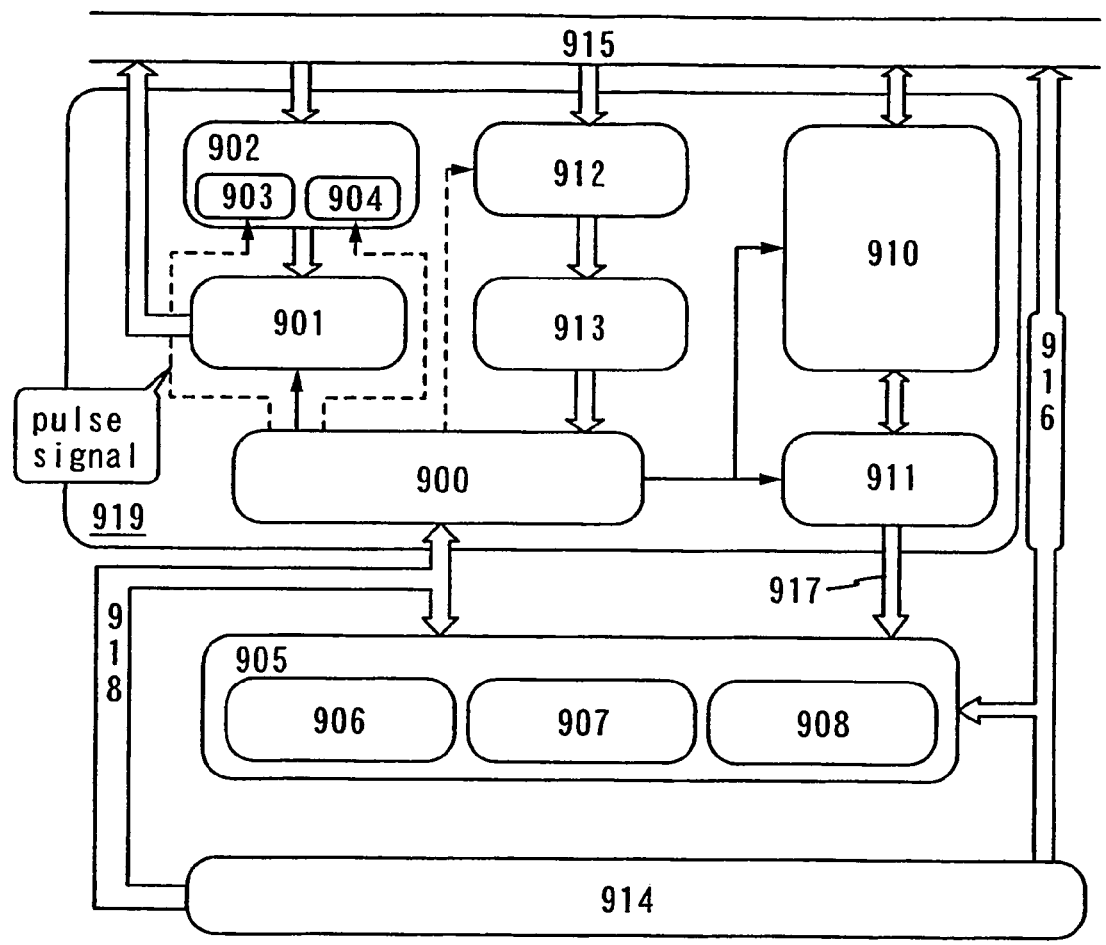
FIG. 29 is a block diagram showing a configuration of a CPU in a thin film integrated circuit device.

FIG. 28 is a perspective view showing the ID label 20 in the case where the input antenna 400 and the output antenna 401 are separately formed. A specific manufacturing method is similar to Embodiment 1, except that four terminal portions between the thin film integrated circuit device 13 and the antennas are provided. The structure in which the input antenna 400 and the output antenna 401 are separately formed is not limited to these.

Here, a structure of a CPU in an integrated circuit device is briefly described with reference to FIG. 29. FIG. 29 is a block diagram showing an integrated circuit including a CPU 919, a main memory 905, and an input/output interface 914. First, since an operation to read an instruction out of a program memory 906 in the main memory 905 is, essential, the CPU 919 is required to select an address of the instruction through an address bus 917. At this time, an address control portion 911 selects an address for the main memory 905. Data stored in the main memory are transferred through a control bus 918.

When an address is selected in the program memory 906, an instruction stored therein is outputted and inputted to an instruction register 912 temporarily through the data bus 916 and an internal bus 915. Here, each register or a register group 910 comprises work memory elements used for holding data or execution state in the CPU and for each process in the CPU.

The instruction temporarily inputted in the instruction register is sent to an instruction decoder 913. The instruction decoder 913 first translates the received instruction and converts it to control data for a control portion 900 to process. The instruction decoder 913 determines the place (a register or a memory) of the data which formed of a plurality of input signals (bits) into one specific signal.

The instruction from the instruction decoder 913 to the control portion 900 is transmitted as signals. The control portion is provided with signal lines (control signal lines) for controlling a circuit which performs each process corresponding to the kind of data. The control signal lines are each provided with a switching circuit. When this switch is ON, a control signal can be outputted to a circuit.

When the instruction is an arithmetic operation, the control portion 900 outputs a control signal (a pulse signal for reading data) of the arithmetic process to an arithmetic unit 901. An arithmetic register 902 as an object of the arithmetic operation is divided into two registers (A register 903 and B register 904): a register as an object of the arithmetic operation and a register which is not an object of the arithmetic operation. Note that a role of each memory is as described above, The input/output interface 914 plays a role to convert a signal of different standard into a signal which can be processed in a CPU when the CPU transmits and receives signals with an external device (such as a R/W).

The work memory 907 is a region for temporarily storing data in the process of executing a program. The data memory 908 is a region for storing fixed data for the program. For the work memory, a RAM is typically used to function as a work area for processing data. Moreover, the RAM also functions as a buffer for communication with the R/W. For storing data inputted as signals to a determined address, the EEPROM is typically used.

Embodiment 15

Figure 36A:
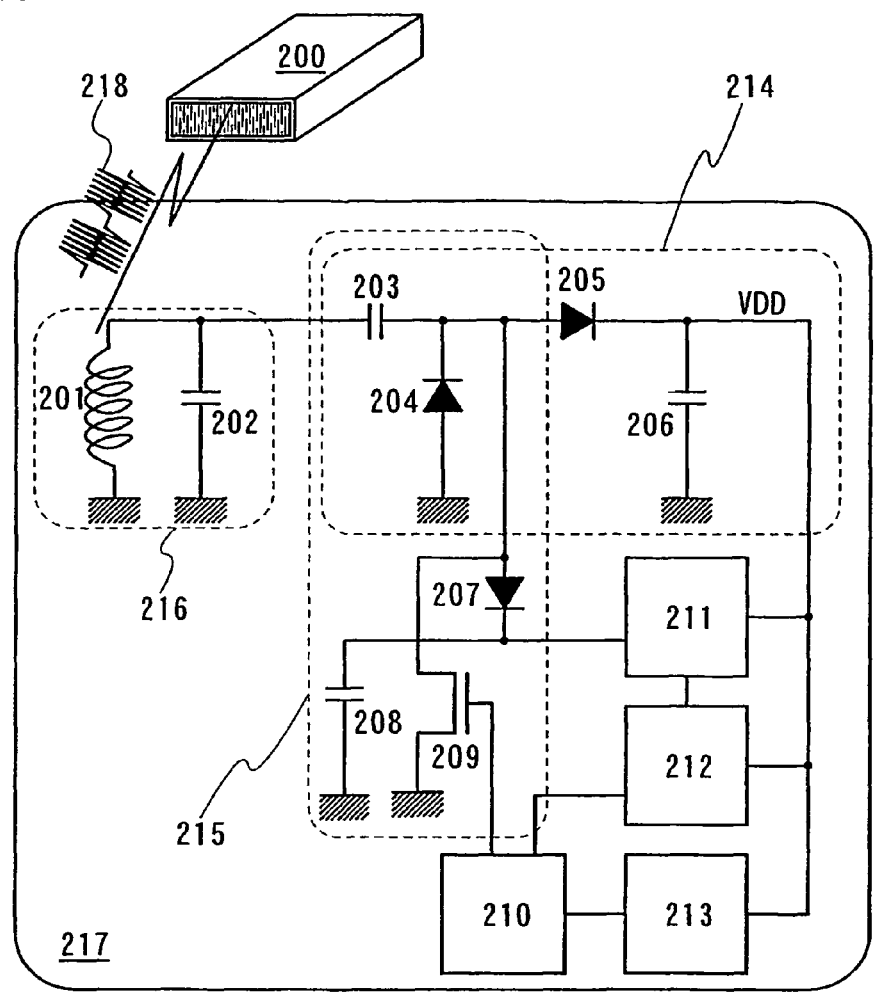
FIGS. 36A and 36B are circuit diagrams of a thin film integrated circuit used for the invention.
Figure 36B:
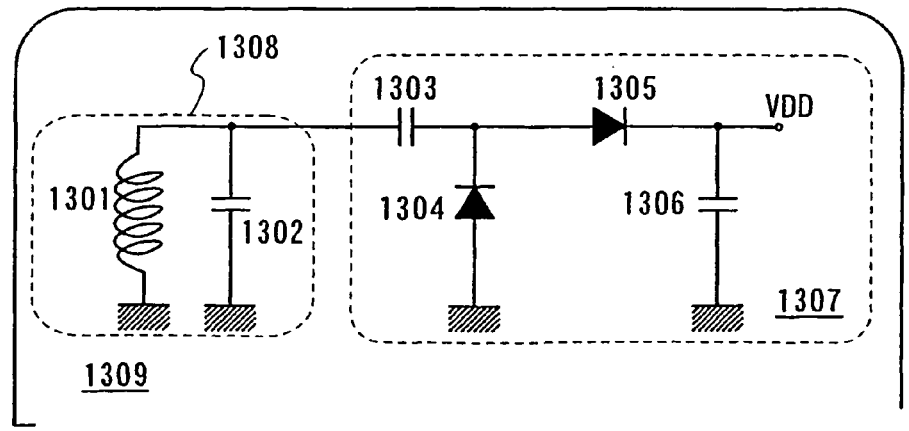

In this embodiment, an example of a structure of the IDF chip of the invention is described in more details with reference to FIGS. 36A and 36B.

FIG. 36A is a schematic diagram of an IDF chip 217 including a power source circuit 214, an input/output circuit 215, an antenna circuit 216, a logic circuit 210, an amplifier 211, a clock generating circuit and a decoder 212, a memory 213 and the like. The antenna circuit 216 includes an antenna wiring 201 and an antenna capacitor 202.

The IDF chip which includes no power source operates with a power supplied by receiving a radio wave 218 from a reader/writer 200. When the antenna circuit 216 receives the radio wave 218 transmitted from the reader/writer 200, the input/output circuit 215 comprising a first capacitor 203, a first diode 204, a third diode 207, a third capacitor 208 and the like detects it as a detection output signal. This signal is amplified into a sufficiently large amplitude by the amplifier 211, and divided into a clock and data of instruction by the clock generating circuit and decoder 212. The transmitted instruction is processed in the logic circuit 210, thereby data in the memory 213 is responded, and required data is written in the memory and the like.

The response is performed by turning ON/OFF the switching element 209 by an output of the logic circuit 210. Accordingly, impedance of the antenna 216 is changed, which consequently changes a reflection rate of the antenna circuit 216. The reader/writer 200 monitors the change of the reflection rate of the antenna circuit 216 to read the data from an ID chip.

The power to be consumed in each circuit of the ID chip is supplied by a direct current power source VDD generated by detecting and smoothing the radio wave 218 received by the power source circuit 214. The power source circuit 214 comprising the first capacitor 203, the first diode 204, the second diode 205, and the second capacitor 206 sets a sufficiently large value for supplying a power to each circuit.

FIG. 36B shows an antenna circuit 1308 and a power source circuit 1307 in the circuits used for the IDF chip 1309. The antenna circuit 1308 includes an antenna wiring 1301 and an antenna capacitor 1302. The power source circuit 1307 includes a first capacitor 1303, a first diode 1304, a second diode 1305, and a second capacitor 1306.

One of the features of the ID chip is that it operates without a battery as described above, since the radio waves transmitted from the reader/writer are received by the antenna circuit 1308 and rectified by the power source circuit 1307 to generate a direct current voltage, thereby the circuit incorporated in the ID chip operates.

INDUSTRIAL APPLICABILITY

In the aforementioned embodiment modes and embodiments, the non-contact thin film integrated circuit device is mainly described, however, the thin film integrated circuit device of the invention can be applied to a contact thin film integrated circuit device as well, needless to say. For example, a magnetic stripe type or an IC module contact type chip can be formed. In the case of the contact IC, an antenna is not required to be formed. Moreover, the thin film integrated circuit device of the magnetic stripe type or the IC module contact type and the non-contact thin film integrated circuit device may be combined as well.

The thin film integrated circuit device typified by the IDF chip of the invention can be incorporated in various products including the ID label, the ID card, and the ID tag as well as paper money, a coin, a coupon bond, a deed, a public corporation bond and the like. In particular, the invention is efficient for being applied to a product in a form of paper, plate, and wrapping sheet, which can be manufactured with reference to the aforementioned embodiment modes and embodiments. In this manner, an application range of the invention is quite wide.

EXPLANATION OF REFERENCE

10: label substratum, 11: antenna, 12: connecting pad, 13: thin film integrated circuit device, 14: image, 15: adhesive layer, 16: separating sheet, 17: coating layer, 18: cross wiring, 19: contact portion, 20: ID label, 21: connecting wiring, 21*a*: connecting wiring, 21*b*: connecting wiring, 21*c*: connecting wiring, 22: anisotropic conductive film, 23: TFT, 24: small vacuum pin set, 25: pin, 26: adhesive layer, 27: insulating layer, 28: contact portion, 29: TFT forming region, 30*a*: interlayer film, 30*b*: interlayer film, 31: protective film, 32: internal substratum, 33: surface, 35: protective layer, 36: adhesive layer, 34: protective layer, 37*a*: top card substratum, 37*b*: bottom card substratum, 38: adhesive layer, 39: adhesive layer, 40: coating layer, 41: ID card, 42*a*: top substratum, 42*b*: bottom substratum, 43*a*: top substratum, 43*b*: bottom substratum, 44: internal substratum, 45: film layer, 46: antenna integrated thin film integrated circuit device, 47: antenna, 48: thin film integrated circuit device, 51: wiring, 51*a*: wiring, 51*b*: wiring, 52: cross wiring, 53: interlayer film, 54: protective film, 54*a*: protective layer, 55: protective film, 56: gate electrode, 57: semiconductor layer, 58: gate insulating film, 60: substrate, 61: peeling layer, 63: resist, 64: impurity element, 65: low concentration impurity region, 66: resist, 67: impurity element, 68: high concentration impurity region, 69: n-type TFT, 70: p-type, 73: CPU, 74: memory, 75: insulating film, 76: sidewall, 77: resist, 78: impurity element, 79: impurity element, 80: terminal portion, 81: groove, 82: projection, 83: jig, 84: adhesive, 85: aperture, 86: gas, 87: resist, 88:substrate, 89: planarizing film, 90: silicon wafer, 91: oxide film, 92: thermal oxide silicon substrate, 93: single crystalline silicon substrate, 94: oxide film, 95: single crystalline silicon layer, 96: SIMOX substrate, 97: tray, 98: pin, 99: substrate as a tray, 100: bell jar, 101: substrate, 102: heater, 103: exhaust pipe, 104: flexible substrate, 105: antenna, 105*a*: top antenna, 105*b*: bottom antenna, 106: connecting pad, 107: IDF chip, 108: connecting terminal, 109*a*: top connecting wiring, 109*b*: bottom connecting terminal, 110: IDF chip, 111: alignment marker, 113: adhesive, 114: UV ray, 115: source region, 116: channel region, 117: drain region, 118: label mounting, 119: box, 120: ID tag, 122: coupon bond, 123: book, 124: plastic bottle, 127: wrapping film, 128: cutter, 129: box, 130: vegetables, 131: fruit, 132: product, 133: R/W, 134: antenna portion, 135: display portion, 136: operating key, 137: POS system, 138: private account, 139: baggage, 140: reader/writer, 141: antenna, 142: radio wave, 143: computer, 144: database, 145: conveyer, 170: main body of reader/writer, 171: sensor portion, 172: product, 180: main body of portable phone, 181: sensor portion, 183: display portion, 190: main body of reader, 191: sensor portion, 193: display portion, 200: reader/writer, 201: antenna wiring, 202: antenna capacitor, 203: capacitor, 204: diode, 205: diode, 206: capacitor, 207: diode, 208: capacitor: 209: switching element, 210: logic circuit, 211: amplifier, 212: clock generating circuit and decoder, 213: memory, 214: power source circuit, 215: input/output circuit, 216: antenna circuit, 217: IDF chip, 218: radio wave, 300: label paper supply means, 301: ACF supply means, 302: IDF chip adhering means, 303: adhesive layer supply means, 304: separating sheet supply means, 305: label roll up means, 306: label separating means, 307: collecting means, 308: substratum supply means, 309: substratum separating means, 310: laminating apparatus, 400: input antenna, 401: output antenna, 402: input interface, 403: output interface, 404: CPU, 405: coprocessor, 406: ROM, 407: RAM, 408: non-volatile memory, 409: bus, 410: thin film integrated circuit device, 411: non-contact integrated circuit device, 412: radio wave, 414: reader/writer (R/W), 415: database, 416: integrated circuit, 417: output interface, 418: output antenna, 419: computer, 420: rectifying circuit, 421: demodulating circuit, 423: modulating circuit, 424: amplifier, 425: input antenna, 426: input interface, 427: controller, 900: control portion, 901: arithmetic unit, 902: arithmetic register, 903: A register, 904: B register, 905: main memory, 906: program memory, 907: work memory, 908: data memory, 910: register group, 911: address control portion, 912: instruction register, 913: instruction decoder, 914: input/output interface, 915: internal bus, 916: data bus, 917: address bus, 918: control bus, 919: CPU, 1301: antenna wiring, 1302: antenna capacitor, 1303: capacitor, 1304: diode, 1305: diode, 1306: capacitor, 1307: power source circuit, 1308: antenna circuit, 1309: IDF chip

The invention claimed is:

1. An ID label comprising:
a label substratum
an antenna provided over the label substratum;
an integrated circuit device including a transistor, provided over and in contact with the label substratum;
an insulating layer provided over the antenna;
a wiring provided on the insulating layer; and
a separating sheet provided over the wiring;
wherein the wiring is electrically connected to the antenna through a contact hole formed in the insulating layer, and
wherein the antenna and the integrated circuit device are electrically connected through the wiring.

2. The ID label according to claim 1, wherein a protective layer comprising a single layer or stacked layers containing silicon oxide, silicon nitride or silicon oxynitride is formed on at least one of an upper surface and a lower surface of the integrated circuit device.

3. The ID label according to claim 1, wherein protective layers are formed on an upper surface and a lower surface of the integrated circuit device, and the integrated circuit device is placed at a position of (d/2)±30 μm or less when a total thickness of the integrated circuit device and the protective layers is d.

4. The ID label according to claim 1, wherein a semiconductor film of the transistor included in the integrated circuit device contains hydrogen or halogen of 0.0005 to 5 atomic %.

5. The ID label according to claim 1, wherein a size of the integrated circuit device is 0.09 to 25 mm$^2$.

6. The ID label according to claim 1, wherein a thickness of the integrated circuit device is 0.1 to 3 μm.

7. The ID label according to claim 1, further comprising: an adhesive layer between the wiring and the separating sheet.

8. The ID label according to claim 7, wherein the separating sheet is configured to be peeled from the adhesive layer.

9. An ID label comprising:
an internal substratum having a first surface and a second surface,
an antenna provided over the first surface of the internal substratum;
an integrated circuit device including a transistor, provided over and in contact with the first surface of the internal substratum;
a wiring provided over the second surface of the internal substratum;
a label substratum provided over the integrated circuit device; and
a separating sheet over the wiring,
wherein the wiring is electrically connected to the antenna through a contact hole formed in the internal substratum, and
wherein the antenna and the integrated circuit device are electrically connected through the wiring.

10. The ID label according to claim 9, wherein a protective layer comprising a single layer or stacked layers containing silicon oxide, silicon nitride or silicon oxynitride is formed on at least one of an upper portion and a lower portion of the integrated circuit device.

11. The ID label according to claim 9, wherein protective layers are formed on an upper surface and a lower surface of the integrated circuit device, and the integrated circuit device is placed at a position of (d/2)±30 μm or less when a total thickness of the integrated circuit device and the protective layers is d.

12. The ID label according to claim 9, wherein a semiconductor film of the thin film transistor included in the integrated circuit device contains hydrogen or halogen of 0.0005 to 5 atomic %.

13. The ID label according to claim 9, wherein a size of the integrated circuit device is 0.09 to 25 mm$^2$.

14. The ID label according to claim 9, wherein a thickness of the integrated circuit device is 0.1 to 3 μm.

15. The ID label according to claim 8, further comprising: an adhesive layer between the label substratum and the separating sheet.

16. The ID label according to claim 15, wherein the separating sheet is configured to be peeled from the adhesive layer.

17. An ID card comprising:
a card substratum over which an antenna is formed;
an insulating layer over the antenna;
a wiring formed on the insulating layer;
an integrated circuit device including a transistor, provided over and in contact with the card substratum; and
a cover for covering at least a side of the card substratum where the antenna and the integrated circuit device are formed,
wherein the wiring is electrically connected to the antenna through a contact hole formed in the insulating layer, and
wherein the antenna and the integrated circuit device are electrically connected through the wiring.

18. The ID card according to claim 17, wherein the cover comprises resin and is formed by a laminating method.

19. The ID card according to claim 17, wherein a protective layer comprising a single layer or stacked layers containing silicon oxide, silicon nitride or silicon oxynitride is formed on at least one of an upper surface and a lower surface of the integrated circuit device.

20. An ID card comprising:
  an internal substratum having a first surface and a second surface opposing to the first surface;
  an antenna formed over the first surface of the internal substratum;
  an integrated circuit device including a transistor, over the first surface of the internal substratum;
  a wiring formed on the second surface of the internal substratum; and
  a cover for covering around the internal substratum,
  wherein the wiring is electrically connected to the antenna through a contact hole formed in the internal substratum, and
  wherein the antenna and the integrated circuit device are electrically connected through the wiring.

21. The ID card according to claim 20, wherein the cover comprises resin and is formed by a laminating method.

22. The ID card according to claim 20, wherein a protective layer comprising a single layer or stacked layers containing silicon oxide, silicon nitride or silicon oxynitride is formed on at least one of an upper surface and a lower surface of the integrated circuit device.

23. An ID tag comprising:
  a integrated circuit device including a transistor provided in contact with a substratum on which an antenna is formed;
  an insulating layer over the antenna;
  a wiring formed over the insulating layer; and
  a cover for covering at least a side of the substratum the antenna and the integrated circuit device are formed,
  wherein the wiring is electrically connected to the antenna through a contact hole formed in the insulating layer, and
  wherein the antenna and the integrated circuit device are electrically connected through the wiring.

24. The ID tag according to claim 23, wherein the cover comprises resin and is formed by a laminating method.

25. The ID tag according to claim 23, wherein a protective layer comprising a single layer of stacked layers containing silicon oxide, silicon nitride of silicon oxynitride is formed on at least one of an upper surface and a lower surface of the integrated circuit device.

26. An ID tag comprising:
  an internal substratum having a first surface and a second surface opposing to the first surface;
  an antenna formed over the first surface of the internal substratum;
  an integrated circuit device including a transistor over the first surface of the internal substratum;
  a wiring formed on the second surface of the internal substratum; and
  a cover for covering around the internal substratum,
  wherein the wiring is electrically connected to the antenna through a contact hole formed in the internal substratum, and
  wherein the antenna and the integrated circuit device are electrically connected through the wiring.

27. The ID tag according to claim 26, wherein the cover comprises resin and is formed by a laminating method.

28. The ID tag according to claim 26, wherein a protective layer comprising a single layer of stacked layers containing silicon oxide, silicon nitride of silicon oxynitride is formed on at least one of an upper surface and a lower surface of the thin film integrated circuit device.

29. An object comprising:
  an integrated circuit device including a transistor provided in contact with a substratum on which an antenna is formed;
  an insulating layer over the antenna;
  a wiring formed over the insulating layer; and
  a cover for covering at least a side of the substratum where the antenna and the integrated circuit device are formed,
  wherein the wiring is electrically connected to the antenna through a contact hole formed in the insulating layer, and
  wherein the antenna and the integrated circuit device are electrically connected through the wiring.

30. The object according to claim 29, wherein a protective layer comprising a single layer or stacked layers containing silicon oxide, silicon nitride or silicon oxynitride is formed on at least one of an upper surface and a lower surface of the integrated circuit device.

31. An object comprising:
  an internal substratum having a first surface and a second surface opposing to the first surface;
  an antenna formed over the first surface of the internal substratum;
  an integrated circuit device including a transistor over the first surface of the internal substratum;
  a wiring formed on the second surface of the internal substratum; and
  a cover for covering around the internal substratum,
  wherein the wiring is electrically connected to the antenna through a contact hole formed in the internal substratum, and
  wherein the antenna and the integrated circuit device are electrically connected through the wiring.

32. The object according to claim 31, wherein a protective layer comprising a single layer or stacked layers containing silicon oxide, silicon nitride or silicon oxynitride is formed on at least one of an upper surface and a lower surface of the integrated circuit device.

33. -An ID label comprising:
  a label substratum having a first surface and a second surface opposing to the first surface;
  an antenna formed over the first surface of the label substratum;
  an integrated circuit device including a transistor, over the first surface of the label substratum;
  a wiring formed on the second surface of the label substratum;
  a separating sheet provided over the first surface of the label substratum with an adhesive layer, antenna, and the integrated circuit device interposed therebetween,
  wherein the wiring is electrically connected to the antenna through a contact hole formed in the label substratum, and
  wherein the antenna and the integrated circuit device are electrically connected through the wiring.

34. An ID label comprising:
  a label substratum;
  an antenna formed over the label substratum;
  an insulating layer over the antenna;
  a wiring formed on the insulating layer;
  an integrated circuit device including a transistor, over the label substratum;
  a separating sheet provided over the label substratum with an adhesive layer, the antenna, and the insulating layer, and the integrated circuit device interposed therebetween,
  wherein the wiring is electrically connected to the antenna through a contact hole formed in the insulating layer, and
  wherein the antenna and the integrated circuit device are electrically connected through the wiring.

* * * * *

UNITED STATES PATENT AND TRADEMARK OFFICE
CERTIFICATE OF CORRECTION

PATENT NO. : 8,136,735 B2  
APPLICATION NO. : 10/586156  
DATED : March 20, 2012  
INVENTOR(S) : Yasuyuki Arai et al.

Page 1 of 1

It is certified that error appears in the above-identified patent and that said Letters Patent is hereby corrected as shown below:

At column 33, line 63, "ED" should be --ID--;

At column 36, line 54, "which formed" should be --which is to be processed by the instruction. Note that translation here means converting data formed--;

At column 40, line 39, please delete "thin film";

At column 40, line 46, "claim 8" should be --claim 9--;

At column 41, line 28, "a integrated" should be --an integrated--;

At column 41, line 33, "substratum" should be --substratum where--;

At column 41, lines 66 and 67, please delete "thin film".

Signed and Sealed this
Twelfth Day of June, 2012

David J. Kappos
*Director of the United States Patent and Trademark Office*